United States Patent [19]
Fujii

[11] Patent Number: 6,014,507
[45] Date of Patent: Jan. 11, 2000

[54] INTEGRATED CIRCUIT ROUTES DESIGNING METHOD AND APPARATUS

[75] Inventor: Takashi Fujii, Tokyo, Japan

[73] Assignee: NEC Corporation, Tokyo, Japan

[21] Appl. No.: 08/911,042

[22] Filed: Aug. 14, 1997

[30] Foreign Application Priority Data

Aug. 14, 1996 [JP] Japan .................................. 8-214506

[51] Int. Cl.[7] .................................................. G06F 17/50
[52] U.S. Cl. .............................. 395/500.13; 395/500.14
[58] Field of Search ..................... 395/500.13, 500.14, 395/500.15

[56] References Cited

U.S. PATENT DOCUMENTS 5,295,082  3/1994  Chang et al. ........................ 395/500.17

FOREIGN PATENT DOCUMENTS 4-167073  6/1992  Japan .
8-274179  10/1996  Japan .

OTHER PUBLICATIONS

Deutsch et al. "An Over–the–Cell Router", 17th ACM/IEEE Automation Conference, (1980), pp. 32–39.
Krohn et al. "An Over–Cell Gate Array Channel Router", 20th ACM/IEEE Design Automation Conf. (1983), pp. 665–670.
Shiraishi et al. "A Permeation Router", IEEE Transactions on Computer–Aided Design, vol. CAD–6, No. 3. (May 1987), pp. 462–471.
Cong. et al. "Over–the–Cell Channel Routing", ICCAD IEEE (1988), pp. 80–83.
Cong. et al. "General Models and Algorithms For Over–the–Cell Routing in Standard Cell Design" 27th ACM/IEEE Design Automation Conference (1990), pp. 709–715.
Lin et al. "Channel Density Reduction by Routing Over the Cells", 28th ACM/IEEE Design Automation Conference (1991), pp. 120–125.
Holmes "New Algorithm for Over–the–Cell Channel Routing Using Vacant Terminals", 28th ACM/IEEE Design Automation Conference (1991), pp. 126–131.

(List continued on next page.)

*Primary Examiner*—Kevin J. Teska
*Assistant Examiner*—Hugh Jones
*Attorney, Agent, or Firm*—Sughrue, Mion, Zinn, Macpeak & Seas, PLLC

[57] ABSTRACT

It is intended to obtain, for a channel routing region incorporating routing prohibition figures, detailed interconnection routes that satisfy given connection requirements and minimize the area of a channel region. There are provided steps of setting a channel routing region, setting a net list N as a set of subnets obtained by dividing nets, calculating a set of assignable tracks of each subnet and other necessary sets and a route density, executing a process for avoiding a vertical passage prohibition figure that obstructs routing for a subnet whose set of assignable tracks is an empty set, generating a prohibition constraint graph G representing constraints relating to vertical passage prohibition figures and terminals, forming a prohibition constraint subgraph G* from the graph G, determining a subnet set N* as a subject of a trunks assigning process from a node set of the graph G*, assigning trunks of the subnets that belong to the set N*, updating the net list N to (N–N*) and setting a graph obtained by deleting G* from G as a new prohibition constraint graph G, and judging whether all subnets of the set N* have been assigned to tracks.

58 Claims, 64 Drawing Sheets

OTHER PUBLICATIONS

Pai et al. "An Over–the Cell Channel Router", VLSI 91, pp. 8a.2.1–8a.2.10.

Holmes et al. "Algorithms for Three–Layer Over–the–Cell Channel Routing", ICCAD IEEE (1991), pp. 428–431.

Terai et al. "A New Model for Over–the–Cell Channel Routing with Three Layers", ICCAD IEEE (1991), pp. 432–435.

Fujii "A Multi–Layer Channel Router with New Style of Over–the–Cell Routing", 29th ACM/IEEE Design Automation Conference (1992), pp. 585–588.

Natarajan et al. "Over–the–Cell Channel Routing for High Performance Circuits", 29th ACM/IEEE Design Automation Conference (1992), pp. 600–603.

Sherwani, "Over–the–Cell Routers for New Cell Model", 29th ACM/IEEE Design Automation Conference (1992) pp. 604–607.

Sode et al. "A Multi–Layer Channel Router Based on Optimal Multi–Layer Net Assignment" Design VLSI 93 (1993), pp. 8.1.1.–8.1.10.

■ : M1-LAYER INTERCONNECTION
◐ : M2-LAYER INTERCONNECTION
☐ : THROUGH-HOLE

━ : M1-LAYER INTERCONNECTION
▯ : M2-LAYER INTERCONNECTION
▫ : THROUGH-HOLE

INTEGRATED CIRCUIT ROUTES DESIGNING METHOD AND APPARATUS

BACKGROUND OF THE INVENTION

The present invention is used for routes designing of an integrated circuit. In particular, the invention relates to a routes designing scheme which is used for a channel routing region having routing prohibition figures that are existing interconnections and circuit parts already disposed in channel routing in a detailed routing process of layout design.

In layout design of an integrated circuit, for such purposes as minimization of the area occupied by interconnections by tapering power lines and clock skew reduction of clock lines, these kinds of special lines are usually routed prior to routing of ordinary signal lines. In this case, prerouted special lines exist in a channel routing region as existing interconnections and need to be handled as routing prohibition figures (obstacles) in routing ordinary signal lines. In assigning trunks (horizontal interconnections) of ordinary signal line nets to a channel routing region, it is necessary to assign the trunks so as to avoid routing prohibition figures.

Most of conventional routing methods are applicable only with an assumption of a routing model that no obstacles exist within a subject routing region, and hence cannot be applied to a channel routing region having routing prohibition figures.

An automatic routing scheme disclosed in Japanese Unexamined Patent Publication No. Hei. 4-167073 is adapted to be applicable to even a routing region having routing prohibition figures. In this routing scheme, net trunks are assigned to a channel routing region according to a routing flow shown in FIG. 1. This routing scheme cannot assign trunks to a net having terminals on both of a top cell row and a bottom cell row within the range of a routing prohibition figure (i.e., between the left end and the right end of the figure). This will be explained below by using examples.

In a channel routing region shown in FIG. 2, a consideration will be given to net n for connecting terminal t1 on a top cell row and terminal t2 on a bottom cell row of the channel routing region. Both terminals t1 and t2 exist within the range of a routing prohibition figure (intrachannel obstacle) R. Four routing tracks T1–T4 are disposed between a top boundary 11 and a bottom boundary 12.

First, at steps S101 and S102, a position constraint graph representing a vertical constraint relationship among trunks is generated. Nodes correspond to trunks or obstacles. Directed branch (a, b) represents a constraint that trunk a (or obstacle a) must be assigned to a routing track above trunk b (or obstacle b). As shown in FIG. 3, a position constraint graph of the channel routing region of FIG. 2 has a cycle including node R which corresponds to the intrachannel obstacle R and node n which corresponds to a trunk of net n.

Then, at step S103, weights are given to the respective nodes. Each node n representing a trunk of the net is given a weight 1. Node R representing the obstacle is given a weight equal to the number of tracks that are prevented by the obstacle from being assigned a trunk. In this case, node R is given a weight 2.

At step S104, among the nodes u in the position constraint graph a node that no directed branch enters is considered a start node, and an accumulation value of weights of all nodes existing on an arrowed route from the start point to node u is made a rank of node u. Since the position constraint graph of FIG. 3 is in cycle form, the rank of node n cannot be determined. Thus, if a position constraint graph representing a vertical constraint of a channel routing region has a cycle including an obstacle and a trunk, the channel routing method under consideration cannot be applied thereto.

Assume a case in which an intrachannel routing prohibition figure (obstacle) V shown in FIG. 4 is an obstacle to a wiring layer M1 (FIG. 6) for routing trunks (horizontal interconnections) but not an obstacle to a wiring layer M2 (FIG. 6) for routing branches (vertical interconnections) that connect trunks and terminals. An obstacle R obstructs both types of wiring layers for trunks and branches. The number of tracks that are prevented by the obstacle V from being assigned a trunk is 2. In two nets n1={t1, t3} and n2={t2, t4}, terminal t1 of net n1 is located over the obstacle V and terminal t4 of net n2 is located under the obstacle R. No vertical constraint exists between trunks of nets n1 and n2. In this case, a position constraint graph generated by steps S101 and S102 is a directed graph shown in FIG. 5, where nodes corresponding to the obstacles V and R and nets n1 and n2 are denoted by V and R and n1 and n2, respectively. At step S103, node V is given a weight 2 and the other three nodes are given a weight 1. At step S104, the rank of node n2 is calculated as 2 because there is a directed branch from node R to node n2. On the other hand, the rank of node n1 is calculated as 1. Therefore, at step S106, a trunk of net n2 corresponding to node n2 is assigned to the lowest track T3. The process is finished in a state that a trunk of net n1 corresponding to node n1 is not assigned to any track. Thus, net n1 cannot be routed as shown in FIG. 6.

Japanese Unexamined Patent Publication No. Hei. 8-274179 discloses a routing scheme which can determine routes on even the channel routing regions of FIGS. 2 and 4. Net trunks are assigned to a channel routing region according to a routing flow shown in FIG. 7. In this routing scheme, a subchannel region that is not obstructed by any routing prohibition figures is set in the channel routing region. Trunks are assigned to tracks in the region such that as the routing process proceeds the subchannel regions are updated for a region excluding already assigned trunks and routing prohibition figures. In this routing scheme, the shape of subchannel regions that is formed during the routing process is determined by the positions of routing prohibition figures in the channel routing region and assigned net trunks. Therefore, there may occur a case that net trunks cannot be assigned for a routable channel routing region. This will be described below by using an example.

In a channel routing region shown in FIG. 8A, terminals t1 and t2 exist on a top cell row and terminals t3 and t4 exist on a bottom cell row of the channel routing region. It is assumed that two wiring layers M1 and M2 are used for the routing and the M1 layer and the M2 layer are used for the horizontal direction and the vertical direction, respectively. Terminal t1 is located over a routing prohibition figure V1, terminal t2 is located over a routing prohibition figure V3, and terminal t4 is located under a routing prohibition figure V5. Terminal t3 exists on a column where no routing prohibition figure exists. All of routing prohibition figures V1–V5 in the routing region serve as routing prohibition figures for the wiring layer M1 (used for the horizontal routing). A consideration will be given to net n1 for connecting terminals t1 and t4 and net n2 for connecting terminals t2 and t3.

First, referring to FIG. 7, at steps S201 and S202, a subchannel for the wiring layer M1 (used for the horizontal routing) is set as shown in FIG. 8A.

Then, at step S203, temporary terminals are provided on the boundary lines of the subchannel for the respective terminals belonging to nets n1 and n2 (see FIG. 8B).

At step S204, a set S of candidate nets to be routed in the subchannel is {n1, n2}.

Then, at step S205, since terminal t2 of net n2 is located over terminal t4 of net n1, according to a vertical constraint a trunk of net n2 should be assigned to a track above a track to which a trunk of net n1 is assigned. Therefore, a trunk of net n2 is assigned to track T2.

At steps S206 and S207, the routing prohibition figures are updated based on the routing of the net whose trunk has been assigned at step S205, and the assigning-completed net is deleted from the net list.

At step S208, since the net list includes only net n1 but is not an empty set, steps S202–S208 are repeated.

In the second loop of steps S202–S208, a subchannel and temporary terminals of net n1 are set as shown in FIG. 8C. It appears that a trunk of net n1 can be assigned to track T4. However, track T4 does not include an interval having terminals t1 and t4 as the left and right ends, respectively. Thus, actually a trunk of net n1 cannot be assigned to track T4, and net n1 remains unrouted.

Integrated circuit routes designing is theoretically discussed in the following papers.

(1) 17th ACM/IEEE Design Automation Conference (1980), pages 32–39, under the title of "AN OVER-THE-CELL-ROUTER" by David N. Deutsch and another.

(2) 20th ACM/IEEE Design Automation Conference (1983), pages 665–670, under the title of "AN OVER-CELL GATE ARRAY CHANNEL ROUTER" by Howard E. Krohn.

(3) IEEE Transactions on Computer-Aided Design, Vol. CAD-6, No.3 (May 1987), pages 462–471, under the title of "A Permeation Router" by Y. Shiraishi and another.

(4) ICCAD IEEE (1988), pages 80–83, under the title of "Over-the-Cell Channel Routing" by J. Cong and another.

(5) 27th ACM/IEEE Design Automation Conference (1990), pages 709–715, under the title of "GENERAL MODELS AND ALGORITHMS FOR OVER-THE-CELL-ROUTING IN STANDARD CELL DESIGN" by J. Cong and two others.

(6) 28th ACM/IEEE Design Automation Conference (1991), pages 120–125, under the title of "Channel Density Reduction By Routing Over The Cells" by Min-Siang Lin and three others.

(7) 28th ACM/IEEE Design Automation Conference (1991), pages 126–131, under the title of "New Algorithm for Over-the-Cell Channel Routing Using Vacant Terminals" by Nancy D. Holmes and two others.

(8) VLSI 91, pages 8a.2.1–8a.2.10, under the title of "An Over-the-cell Channel Router" by Ravi R. Pal and another.

(9) ICCAD IEEE (1991), pages 428–431, under the title of "Algorithms for Three-Layer Over-the-Cell Channel Routing" by Nancy D. Holmes and two others.

(10) ICCAD IEEE (1991), pages 432–435, under the title of "A New Model for Over-the-Cell Channel Routing with Three Layers" by M. Terai and three others.

(11) 29th ACM/IEEE Design Automation Conference (1992), pages 585–588, under the title of "A Multi-Layer Channel Router with New Style of Over-the-Cell Routing" by T. Fujii (the inventor) and three others.

(12) 29th ACM/IEEE Design Automation Conference (1992), pages 600–603, under the title of "Over-the-Cell Channel Routing For High Performance Circuits" by S. Natarajan and three others.

(13) 29th ACM/IEEE Design Automation Conference (1992), pages 604–607, under the title of "Over-the-Cell Routers for New Cell Model" by Bo Wu, Naveed A. Sherwani and two others.

(14) VLSI 93, pages 8.1.1–8.1.10, under the title of "A Multi-Layer Channel Router Based on Optimal Multi-layer Net Assignment" by M. Sode and two others.

SUMMARY OF THE INVENTION

An object of the present invention is to obtain, for a channel routing region incorporating routing prohibition figures, detailed interconnection routes that satisfy given connection requests and minimize the area of a channel region.

The invention provides a routes designing method for an integrated circuit in which detailed interconnection routes such as wiring layers, interconnection passage positions, and interconnection shapes or circuit parts layout positions are preset for a routing region, comprising:

a first step (step S301 of FIG. 10) of setting a channel routing region based on information about terminals that belong to cells adjacent to the routing region, prohibition information about interconnections belonging to cells, and information about connections between terminals;

a second step (step S302 of FIG. 10) of dividing a net into subnets based on positional information of terminals existing in the channel routing region and connection information of the terminals, and setting a net list N as a set of subnets;

a third step (step S303 of FIG. 10) of calculating a set RT(t) of reachable tracks of each terminal t, a set AT(n) of assignable tracks of each subnet n included in the net list N, a set PT(c) of passable tracks of each column c, a route density D(c), and a set TH(c) of through-hole settable tracks for information about routing prohibition figures in the channel routing region and the net list N;

a fourth step (step S304 of FIG. 10) of executing a process of avoiding, among the routing prohibition figures existing in the channel routing region, a vertical passage prohibition figure that obstructs routing of subnet n whose set AT(n) in the net list N is an empty set;

a fifth step (step S305 of FIG. 10) of generating a prohibition constraint graph G representing constraints that relate to vertical passage prohibition figures and terminals based on positions of the routing prohibition figures and the terminals existing in the channel routing region, the net list N, and a result of the process of avoiding a vertical passage prohibition figure;

a sixth step (step S306 of FIGS. 10 and 11) of forming a prohibition constraint subgraph $G^* = (V^*, E^*)$ that is a subgraph of the prohibition constraint graph G by executing a node/branch deleting process on the prohibition constraint graph G;

a seventh step (step S307 of FIG. 10) of setting, as a subnet set $N^*$ as a subject of a trunks assigning process, a set of subnets corresponding to nodes that are included in a node set $V^*$ of the prohibition constraint subgraph $G^*$;

an eighth step (step S308 of FIG. 10) of assigning trunks of the subnets belonging to the set $N^*$ based on information about the routing prohibition figures and the terminals existing in the channel routing region while regarding the prohibition constraint subgraph $G^*$ as a directed graph representing vertical constraint relationships relating to the set $N^*$;

a ninth step (step S309 of FIG. 10) of updating the net list N to $N-N^*$, and setting a graph that is obtained by deleting the prohibition constraint subgraph $G^*$ from the prohibition constraint graph G as a new prohibition constraint graph G; and a tenth step (step S310 of FIG. 10) of judging whether the trunks of all the subnets of the set N* have been assigned to tracks by the trunks assigning section, outputting an error signal if there remains an unassigned subnet, judging whether the net list N as updated by the net list N updating section is an empty set if all the subnets have been assigned, if it is an emnpty set, in a case where boundary lines of the channel routing region and shapes and positions of the routing prohibition figures are variable in a vertical direction and a free track remains that is a track not assigned any trunk, deleting the free track, changing the positions of the boundary lines of the channel routing region and the shapes of the routing prohibition figures and moving the routing prohibition figures, and reducing a height of the channel routing region, and terminating a routing process.

The invention further provides a routes designing apparatus for an integrated circuit in which detailed interconnection routes such as wiring layers, interconnection passage positions, and interconnection shapes or circuit parts layout positions are preset for a routing region, comprising:

a channel routing region setting section (block 1 of FIG. 9) for setting a channel routing region based on information about terminals that belong to cells adjacent to the routing region, prohibition information about interconnections belonging to cells, and information about connections between terminals;

a subnets dividing section (block 2 of FIG. 9) for dividing a net into subnets based on positional information of terminals existing in the channel routing region and connection information of the terminals, and for setting a net list N as a set of subnets;

a RT, AT, PT, D, and TH calculating section (block 3 of FIG. 9) for calculating a set RT(t) of reachable tracks of each terminal t, a set AT(n) of assignable tracks of each subnet n included in the net list N, a set PT(c) of passable tracks of each column c, a route density D(c), and a set TH(c) of through-hole settable tracks for information about routing prohibition figures in the channel routing region and the net list N;

a vertical passage prohibition figure avoiding section (block 4 of FIG. 9) for executing a process of avoiding, among the routing prohibition figures existing in the channel routing region, a vertical passage prohibition figure that obstructs routing of subnet n whose set AT(n) in the net list N is an empty set;

a prohibition constraint graph G generating section (block 5 of FIG. 9) for generating a prohibition constraint graph G representing constraints that relate to vertical passage prohibition figures and terminals based on positions of the routing prohibition figures and the terminals existing in the channel routing region, the net list N, and a result of the process of avoiding a vertical passage prohibition figure;

a prohibition constraint subgraph G* forming section (block 6 of FIG. 9) for forming a prohibition constraint subgraph G*=(V*, E*) that is a subgraph of the prohibition constraint subgraph G by executing a node/branch deleting process on the prohibition constraint graph G;

a subnet set N* selecting section (block 7 of FIG. 9) for setting, as a subnet set N* as a subject of a trunks assigning process, a set of subnets corresponding to nodes that are included in a node set V* of the prohibition constraint subgraph G*;

a trunks assigning section (block 8 of FIG. 9) for assigning trunks of the subnets belonging to the set N* based on information about the routing prohibition figures and the terminals existing in the channel routing region while regarding the prohibition constraint subgraph G* as a directed graph representing vertical constraint relationships relating to the set N*;

a net list N updating section (block 9 of FIG. 9) for updating the net list N to N–N*, and for setting a graph that is obtained by deleting the prohibition constraint subgraph G* from the prohibition constraint graph G as a new prohibition constraint graph G; and a routability and termination judging section (block 10 of FIG. 9) for judging whether the trunks of all the subnets of the set N* have been assigned to tracks by the trunks assigning section, outputting an error signal if there remains an unassigned subnet, judging whether the net list N as updated by the net list N updating section is an empty set if all the subnets have been assigned, if it is an empty set, in a case where boundary lines of the channel routing region and shapes and positions of the routing prohibition figures are variable in a vertical direction and a free track remains that is a track not assigned any trunk, deleting the free track, changing the positions of the boundary lines of the channel routing region and the shapes of the routing prohibition figures and moving the routing prohibition figures, and reducing a height of the channel routing region, and terminating a routing process.

Operation:

In a first routes designing method for an integrated circuit according to the invention, a net is divided into subnets each of which is a set of two terminals in the process of division into subnets (second step), and constraints on those subnets are considered. Therefore, for one subnet, the number of constraints relating to other subnets can be reduced to two or less. As a result, in a prohibition constraint graph generated by the fifth step, the number of branches connected to a node corresponding to another subnet among branches connected to the node of the subnet concerned is two or less. Since the number of branches connected to the node concerned is restricted, such processes as a search and a deletion to be executed on the prohibition constraint graph in the sixth can be made efficient. By the process of avoiding a vertical passage prohibition figure that is executed in the fourth step, routing can be performed so as to bypass the vertical passage prohibition figure. Further, the channel routing region can be minimized by deleting a free track that is unnecessary for the routing and thereby reducing the height of the channel routing region in the tenth step.

In a second routes designing method according to the invention, to avoid a vertical passage prohibition figure, a lead-out interconnection is drawn in advance from a terminal that is located within the range of the prohibition figure in the terminal lead-out step. Therefore, this method can easily accommodate, without complicating an ensuing routing process, even a case where it is difficult to determine a route due to a circumstance relating to layout positions of routing prohibition figures.

In a third routes designing method according to the invention, to avoid a vertical passage prohibition figure, a subnet to be connected to a terminal that is located within the range of the prohibition figure is routed in advance by the subnet prerouting step. Therefore, such a subnet can be eliminated from the subject of an ensuing routing process. Thus, this method can easily accommodate, without complicating the routing process, even a case where there exists a subnet whose route is difficult to determine due to a circumstance relating to layout positions of routing prohibition figures. Further, since a subnet to be connected to a terminal that is located within the range of a prohibition figure is routed before other nets in the subnet prerouting step, it is possible to set a route between terminals of the subnet which route satisfies a timing-related constraint with preference over routes of other nets.

In a fourth routes designing method according to the invention, to avoid a vertical passage prohibition figure, the entire original net of a subnet to be connected to a terminal that is located within the range of the prohibition figure is routed in advance by the net prerouting step. Therefore, subnets of such a net can be eliminated from the subject of an ensuing routing process. Thus, this method can easily accommodate, without complicating the routing process, even a case where there exists a net whose route is difficult to determine due to a circumstance relating to layout positions of routing prohibition figures. Further, since a net to be connected to a terminal that is located within the range of a prohibition figure is routed before other nets in the net prerouting step, it is possible to set a route between terminals of the net which route satisfies a timing-related constraint with preference over routes of other nets.

In a fifth routes designing method according to the invention, a constraint cycle existing in a prohibition constraint graph is detected by the constraint cycles detecting step and canceled by dividing a net. Therefore, it becomes possible for the eighth step to assign a trunk of one net to different tracks on a subnet-by-subnet basis rather than assign the entire trunk of the net to a single track. Further, since in the net dividing step a jog is inserted into only a column where a terminal included in a net exists, the number of through-holes that are added by setting jogs to cancel constraint cycles can be reduced.

In a sixth routes designing method according to the invention, constraint cycles existing in a prohibition constraint graph are detected by the constraint cycles detecting step and canceled first by dividing nets by the net dividing step. Then, only the constraint cycles that could not be canceled by the net division are canceled by inserting a jog into a subnet by the subnet jog inserting step. A jog is inserted, with reference, to a column on which a terminal that is included in a net, and then a jog is inserted into a column on which no terminal is located for constraint cycles that still remain uncanceled. Therefore, it becomes possible to reduce the number of through-holes that are added by setting jogs to cancel constraint cycles. Further, even if constraint cycles remain that could not be uncanceled by a method of assigning trunks of a net to different tracks on a subnet-by-subnet basis, the routing process can be performed by canceling such constraint cycles by dividing a trunk of a subnet and then assigning resulting trunk portions to different tracks by the eighth step.

In assigning trunks of subnets corresponding to nodes included in a path that exists in a prohibition constraint graph, tracks are needed in a number equal to the number of the nodes corresponding to the subnets. Even when a sufficient number of tracks to assign all trunks of subnets do not exist because of the existence of routing prohibition figures in assigning to tracks trunks of subnets corresponding to nodes on a path that exists in a prohibition constraint graph, a seventh routes assigning method according to the invention enables the routing with the use of only the existing tracks by dividing a trunk of a subnet by the path cutting step and assigning resulting trunk portions to different tracks by the eighth section. In addition, a subnet that requires jog insertion can be determined efficiently in the path cutting step by calculating a set of assignable effective tracks.

Even where no path exists in a prohibition constraint graph, there may occur, in a channel routing region where a track is divided by a routing prohibition figure, a case that a trunk of a subnet cannot be assigned to any track. In an eighth routes designing method according to the invention, a subnet into which a jog should be inserted can be determined efficiently in the subnet jog additionally inserting step by determining, for each column, a set of assignable tracks and a set of nets whose trunks should be assigned and comparing the numbers of elements of those sets. Further, it becomes possible in the subnet jog additionally inserting step to find a track assignment constraint that relates to a routing constraint figure that cannot be expressed by a prohibition constraint graph, and to deal with such a constraint by inserting a jog into a subnet.

In a ninth routes designing method according to the invention, an unrouted portion process is executed, in the routability judging, unrouted portion processing, and termination judging step, on a net for which track assignment could not be performed successfully. Therefore, a large routing factor can be assured for a fixed channel routing region.

A tenth routes designing method according to the invention enables track assignment of nets for which track assignment could not be performed successfully by inserting a necessary number of tracks into a channel routing region in the number-of-insufficient-tracks calculating and termination judging step. Therefore, a large routing factor can be assured in a case where the positions of routing prohibition figure in a channel routing region are fixed and the position of the top or bottom line of the channel routing region is variable. Further, after alteration of a channel routing region, information of routes of track-assignment-completed nets is used as it is and only the nets for which track assignment could not be performed successfully are further processed in the number-of-insufficient-tracks calculating and termination judging step. Thus, the processing can be performed at high speed.

In an eleventh routes designing method according to the invention, in the insufficient tracks inserting, rerouting, and termination judging step, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, in the insufficient tracks inserting, rerouting, and termination judging step, since a necessary number of tracks are secured in a channel routing region in which new tracks have been set, rerouting from the beginning enables reduction in the number of inserted jogs. Further, in the insufficient tracks inserting, rerouting, and termination judging step, the number of necessary tracks is determined for nets for which track assignment could not be performed successfully while the positions of routing prohibition figures in a channel routing region are fixed and information of a routing result so far obtained is used as it is. Thus, the number of insufficient tracks can be calculated at high speed.

In a twelfth routes designing method according to the invention, in the insufficient track segments inserting and termination judging step, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, in the insufficient track segments inserting and termination judging step, at the occurrence of a net for which track assignment cannot be performed successfully, a necessary number of tracks is determined while the positions of routing prohibition figures in a channel routing region are moved after insertion of new tracks. This enables correct calculation of the number of insufficient tracks. Further, in the insufficient track segments inserting and termination judging step, after alteration of a channel routing region, only nets for which track assignment could not be performed successfully are made a subject of processing while information of a routing result of track-assignment-completed nets is used as it is. Thus, this enables high-speed processing.

In a thirteenth routes designing method according to the invention, in the insufficient track segments inserting, rerouting, and termination judging step, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, in the insufficient track segments inserting, rerouting, and termination judging step, since a necessary number of tracks are secured in a channel routing region in which new tracks have been set, rerouting from the beginning enables reduction in the number of inserted jogs. Further, in the insufficient track segments inserting, rerouting, and termination judging step, at the occurrence of a net for which track assignment cannot be performed successfully, a necessary number of tracks is determined while the positions of routing prohibition figures in a channel routing region are moved after insertion of new tracks. This enables correct calculation of the number of insufficient tracks.

In a first routes designing apparatus for an integrated circuit according to the invention, a net is divided into subnets each of which is a set of two terminals in the process of division into subnets that is executed by the subnets dividing section, and constraints on those subnets are considered. Therefore, for one subnet, the number of constraints relating to other subnets can be reduced to two or less. As a result, in a prohibition constraint graph generated by the prohibition constraint graph generating section, the number of branches Connected to a node corresponding to another subnet among branches connected to the node of the subnet concerned is two or less. Since the number of branches connected to the node concerned is restricted, such processes as a search and a deletion to be performed on the prohibition constraint graph in the prohibition constraint subgraph G* forming section can be made efficient. By the process of avoiding a vertical passage prohibition figure that is executed in the vertical passage prohibition figure avoiding section, routing can be performed so as to bypass the vertical passage prohibition figure. Further, the channel routing region can be minimized by deleting a free track that is unnecessary for the routing and thereby reducing the height of the channel routing region in the routability and termination judging section.

In a second routes designing apparatus according to the invention, to avoid a vertical passage prohibition figure, a lead-out interconnection is drawn in advance from a terminal that is located within the range of the prohibition figure in the terminal lead-out routing section. Therefore, this apparatus can easily accommodate, without complicating an ensuing routing process, even a case where it is difficult to determine a route due to a circumstance relating to layout positions of routing prohibition figures.

In a third routes designing apparatus according to the invention, to avoid a vertical passage prohibition figure, a subnet to be connected to a terminal that is located within the range of the prohibition figure is routed in advance by the subnet prerouting section.

Therefore, such a subnet can be eliminated from the subject of an ensuing routing process. Thus, this apparatus can easily accommodate, without complicating the routing process, even a case where there exists a subnet whose route is difficult to determine due to a circumstance relating to layout positions of routing prohibition figures. Further, since a subnet to be connected to a terminal that is located within the range of a prohibition figure is routed before other nets in the subnet prerouting section, it is possible to set a route between terminals of the subnet which route satisfies a timing-related constraint with preference over routes of other nets.

In a fourth routes designing apparatus according to the invention, to avoid a vertical passage prohibition figure, the entire original net of a subnet to be connected to a terminal that is located within the range of the prohibition figure is routed in advance by the net prerouting section. Therefore, subnets of such a net can be eliminated from the subject of an ensuing routing process. Thus, this apparatus can easily accommodate, without complicating the routing process, even a case where there exists a net whose route is difficult to determine due to a circumstance relating to layout positions of routing prohibition figures. Further, since a net to be connected to a terminal that is located within the range of a prohibition figure is routed before other nets in the net prerouting section, it is possible to set a route between terminals of the net which route satisfies a timing-related constraint with preference over routes of other nets.

In a fifth routes designing apparatus according to the invention, a constraint cycle existing in a prohibition constraint graph is detected by the constraint cycles detecting section and canceled by dividing a net. Therefore, it becomes possible for the trunks assigning section to assign trunks of one net to different tracks on a subnet-by-subnet basis rather than assign all trunks of the net to a single track. Further, since in the net dividing section a jog is inserted into only a column where a terminal included in a net exists, the number of through-holes that are added by setting jogs to cancel constraint cycles can be reduced.

In a sixth routes designing apparatus according to the invention, constraint cycles existing in a prohibition constraint graph are detected by the constraint cycles detecting section and canceled first by dividing nets by the net dividing section. Then, only the constraint cycles that could not be canceled by the net dividing section are canceled by inserting a jog into a subnet by the subnet jog inserting section. A jog is inserted, with reference, to a column on which a terminal that is included in a net, and then a jog is inserted into a column on which no terminal is located for constraint cycles that still remain uncanceled. Therefore, it becomes possible to reduce the number of through-holes that are added by setting jogs to cancel constraint cycles. Further, even if constraint cycles remain that could not be uncanceled by a method of assigning trunks of a net to different tracks on a subnet-by-subnet basis, the routing process can be performed by canceling such constraint cycles by dividing a trunk of a subnet by the subnet jog inserting section and then assigning resulting trunk portions to different tracks by the trunks assigning section.

In assigning trunks of subnets corresponding to nodes included in a path that exists in a prohibition constraint graph, tracks are needed in a number equal to the number of the nodes corresponding to the subnets. Even when a sufficient number of tracks to assign all trunks of subnets do not exist because of the existence of routing prohibition figures in assigning to tracks trunks of subnets corresponding to nodes on a path that exists in a prohibition constraint graph, a seventh routes assigning apparatus according to the invention enables the routing with the use of only the existing tracks by dividing a trunk of a subnet by the path cutting section and assigning resulting trunk portions to different tracks by the trunks assigning section. In addition, a subnet that requires jog insertion can be determined efficiently in the path cutting section by calculating a set of assignable effective tracks.

Even where no path exists in a prohibition constraint graph, there may occur, in a channel routing region where a track is divided by a routing prohibition figure, a case that a trunk of a subnet cannot be assigned to any track. In an eighth routes designing apparatus according to the invention, a subnet into which a jog should be inserted can be determined efficiently in the subnet jog additionally inserting section by determining, for each column, a set of assignable tracks and a set of nets whose trunks should be assigned and comparing the numbers of elements of those sets. Further, it becomes possible in the subnet jog additionally inserting section to find a track assignment constraint that relates to a routing constraint figure that cannot be expressed by a prohibition constraint graph, and to deal with such a constraint by inserting a jog into a subnet.

In a ninth routes designing apparatus according to the invention, an unrouted portion process is executed, in the routability judging, unrouted portion processing, and termination judging section, on a net for which track assignment could not be performed successfully. Therefore, a large routing factor can be assured for a fixed channel routing region.

A tenth routes designing apparatus according to the invention enables track assignment of nets for which track assignment could not be performed successfully by inserting a necessary number of tracks into a channel routing region in the number-of-insufficient-tracks calculating and termination judging section. Therefore, a large routing factor can be assured in a case where the positions of routing prohibition figure in a channel routing region are fixed and the position of the top or bottom line of the channel routing region is variable. Further, after alteration of a channel routing region, information of routes of track-assignment-completed nets is used as it is and only the nets for which track assignment could not be performed successfully are further processed in the number-of-insufficient-tracks calculating and termination judging section. Thus, the processing can be performed at high speed.

In an eleventh routes designing apparatus according to the invention, in the insufficient tracks inserting, rerouting, and termination judging section, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, in the insufficient tracks inserting, rerouting, and termination judging section, since a necessary number of tracks are secured in a channel routing region in which new tracks have been set, rerouting from the beginning enables reduction in the number of inserted jogs. Further, in the insufficient tracks inserting, rerouting, and termination judging section, the number of necessary tracks is determined for nets for which track assignment could not be performed successfully while the positions of routing prohibition figures in a channel routing region are fixed and information of a routing result so far obtained is used as it is. Thus, the number of insufficient tracks can be calculated at high speed.

In a twelfth routes designing apparatus according to the invention, in the insufficient track segments inserting and termination judging section, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, in the insufficient track segments inserting and termination judging section, at the occurrence of a net for which track assignment cannot be performed successfully, a necessary number of tracks is determined while the positions of routing prohibition figures in a channel routing region are moved after insertion of new tracks. This enables correct calculation of the number of insufficient tracks. Further, in the insufficient track segments inserting and termination judging section, after alteration of a channel routing region, only nets for which track assignment could not be performed successfully are made a subject of processing while information of a routing result of track-assignment-completed nets is used as it is. Thus, this enables high-speed processing.

In a thirteenth routes designing apparatus according to the invention, in the insufficient track segments inserting, rerouting, and termination judging section, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, in the insufficient track segments inserting, rerouting, and termination judging section, since a necessary number of tracks are secured in a channel routing region in which new tracks have been set, rerouting from the beginning enables reduction in the number of inserted jogs. Further, in the insufficient track segments inserting, rerouting, and termination judging section, at the occurrence of a net for which track assignment cannot be performed successfully, a necessary number of tracks is determined while the positions of routing prohibition figures in a channel routing region are moved after insertion of new tracks. This enables correct calculation of the number of insufficient tracks.

BRIEF DESCRIPTION OF THE DRAWINGS

FIGS. 36A and 36B illustrate terms used in embodiments of the invention in which FIG. 36A illustrates a reachable track, a passable track, and a through-hole settable track and FIG. 36B illustrates an assignable track;

FIGS. 37A and 37B are for a description of a prohibition constraint graph in which FIG. 37A shows a channel routing region and FIG. 37B shows a prohibition constraint graph of the channel routing region of FIG. 37A;

FIGS. 43A–40D illustrate a first example of the first embodiment of the invention in which FIG. 40D shows a routing result;

FIGS. 41A–41C illustrate a second example of the first embodiment of the invention in which FIG. 41A shows a prohibition constraint graph, FIG. 41B shows a result of routing of track assignment, and FIG. 41C shows a routing result;

FIGS. 42A and 42B illustrate a third example of the first embodiment of the invention in which FIG. 42A shows a prohibition constraint graph and FIG. 42B shows a result of routing of track assignment;

FIGS. 43A and 43B illustrate a fourth example of the first embodiment of the invention in which FIG. 43A shows a channel routing region and FIG. 43B shows a prohibition constraint graph;

FIGS. 44A and 44B illustrate the fourth example of the first embodiment of the invention in which FIG. 44A shows a result of routing of track assignment and FIG. 44B shows a prohibition constraint graph generated by a second processing loop;

FIGS. 45A and 45B illustrate the fourth example of the first embodiment of the invention in which FIG. 45A shows a result of track assignment in a second processing loop and FIG. 45B shows a prohibition constraint graph generated by a third processing loop;

FIGS. 46A and 46B illustrate the fourth example of the first embodiment of the invention in which FIG. 46A shows a result of track assignment in a third processing loop and FIG. 46B shows a prohibition constraint graph generated by a fourth processing loop;

FIGS. 48A and 48B illustrate a fifth example of the first embodiment of the invention in which FIG. 48A shows a channel routing region and FIG. 48B shows a prohibition constraint graph;

FIGS. 49A–49C illustrate the fifth example of the first embodiment of the invention in which FIG. 49A shows a result of track assignment, FIG. 49B shows a prohibition constraint graph generated by a second processing loop, and FIG. 49C shows a result of track assignment in the second processing loop;

FIGS. 50A and 50B illustrate a first example of the second embodiment of the invention in which FIG. 50A shows a lead-out interconnection and FIG. 50B shows a prohibition constraint graph;

FIGS. 51A and 51B illustrate the second example of the second embodiment of the invention in which FIG. 51A shows a result of routing of track assignment and FIG. 51B shows a prohibition constraint graph generated in a second processing loop;

FIGS. 52A and 52B illustrate a first example of the third embodiment of the invention in which FIG. 52A shows routing on a subnet and FIG. 52B shows a prohibition constraint graph;

FIGS. 53A and 53B illustrate the first example of the third embodiment of the invention in which FIG. 53A shows a result of routing of track assignment and FIG. 53B shows a prohibition constraint graph generated in a second processing loop;

FIGS. 54A and 54B illustrate a second example of the third embodiment of the invention in which FIG. 54A shows a channel routing region and FIG. 54B shows routing on a subnet;

FIGS. 55A and 55B illustrate the second example of the third embodiment of the invention in which FIG. 55A shows a prohibition constraint graph and FIG. 55B shows a result of routing of track assignment;

FIGS. 56A and 56B illustrate a first example of the fourth embodiment of the invention in which FIG. 56A shows routing on a net and FIG. 56B shows a prohibition constraint graph;

FIGS. 57A and 57B illustrate a second example of the fourth embodiment of the invention in which FIG. 57A shows a channel routing region and FIG. 57B shows routing on a net;

FIGS. 58A and 58B illustrate the second example of the fourth embodiment of the invention in which FIG. 58A shows a prohibition constraint graph and FIG. 58B shows a result of routing of track assignment;

FIGS. 59A–59D illustrate a first example of the fifth embodiment of the invention in which FIG. 59A shows a channel routing region, FIG. 59B shows a prohibition constraint graph, FIG. 59C shows a prohibition constraint graph after cancellation of a constraint cycle, and FIG. 59D shows a result of routing of track assignment;

FIGS. 60A–60F illustrate a first example of the sixth embodiment of the invention in which FIG. 60A shows a channel routing region, FIG. 60B shows a prohibition constraint graph, FIG. 60C shows a prohibition constraint graph after cancellation of a constraint cycle by deletion of one double branch, FIG. 60D shows a prohibition constraint graph after cancellation of constraint cycles by deletion of double branches, FIG. 60E shows a prohibition constraint graph after cancellation of a constraint cycle by jog insertion, and FIG. 60F shows a result of routing of track assignment;

FIGS. 61A–61D illustrate a first example of the seventh embodiment of the invention in which FIG. 61A shows a channel routing region, FIG. 61B shows a prohibition constraint graph, FIG. 61C shows a prohibition constraint graph after path cutting, and FIG. 61D shows a result of routing of track assignment;

FIGS. 62A–62D illustrate a first example of the eighth embodiment of the invention in which FIG. 62A shows a channel routing region, FIG. 62B shows a prohibition constraint graph, FIG. 62C shows a prohibition constraint graph after additional jog insertion, and FIG. 62D shows a result of routing of track assignment;

FIGS. 63A–63D illustrate a first example of the ninth embodiment of the invention in which FIG. 63A shows a channel routing region, FIG. 63B shows a prohibition constraint graph, and FIG. 63C shows a prohibition constraint graph after additional jog insertion;

FIGS. 64A and 64B illustrate the first example of the ninth embodiment in which FIG. 64A shows a routing result after step S308, and FIG. 64B shows a routing result after unrouted portion processing;

FIGS. 65A and 65B illustrate a first example of the tenth embodiment of the invention in which FIG. 65A shows a channel routing region after step S310B and FIG. 65B shows a routing result;

FIGS. 66A and 66B illustrate a first example of the eleventh embodiment of the invention in which FIG. 66A shows a channel routing region after step S1 of a process "rerouting" and FIG. 66B shows a channel routing region after step S2 of the process "rerouting";

FIGS. 67A and 67B illustrate the first example of the eleventh embodiment in which FIG. 67A shows a channel routing region after execution of a process "movement of routing prohibition figures and alteration of their shapes" and FIG. 67B shows a routing result;

FIGS. 68A and 68B illustrate a first example of the twelfth embodiment in which FIG. 68A shows a channel routing region after execution of a process "movement of routing prohibition figures and alteration of their shapes" and FIG. 68B shows a routing result; and FIGS. 69A and 69B illustrate a first example of the thirteenth embodiment in which FIG. 69A shows a channel routing region after execution of a process "movement of routing prohibition figures and alteration of their shapes" and FIG. 69B shows a routing result.

DESCRIPTION OF THE PREFERRED EMBODIMENTS

Figure 1:
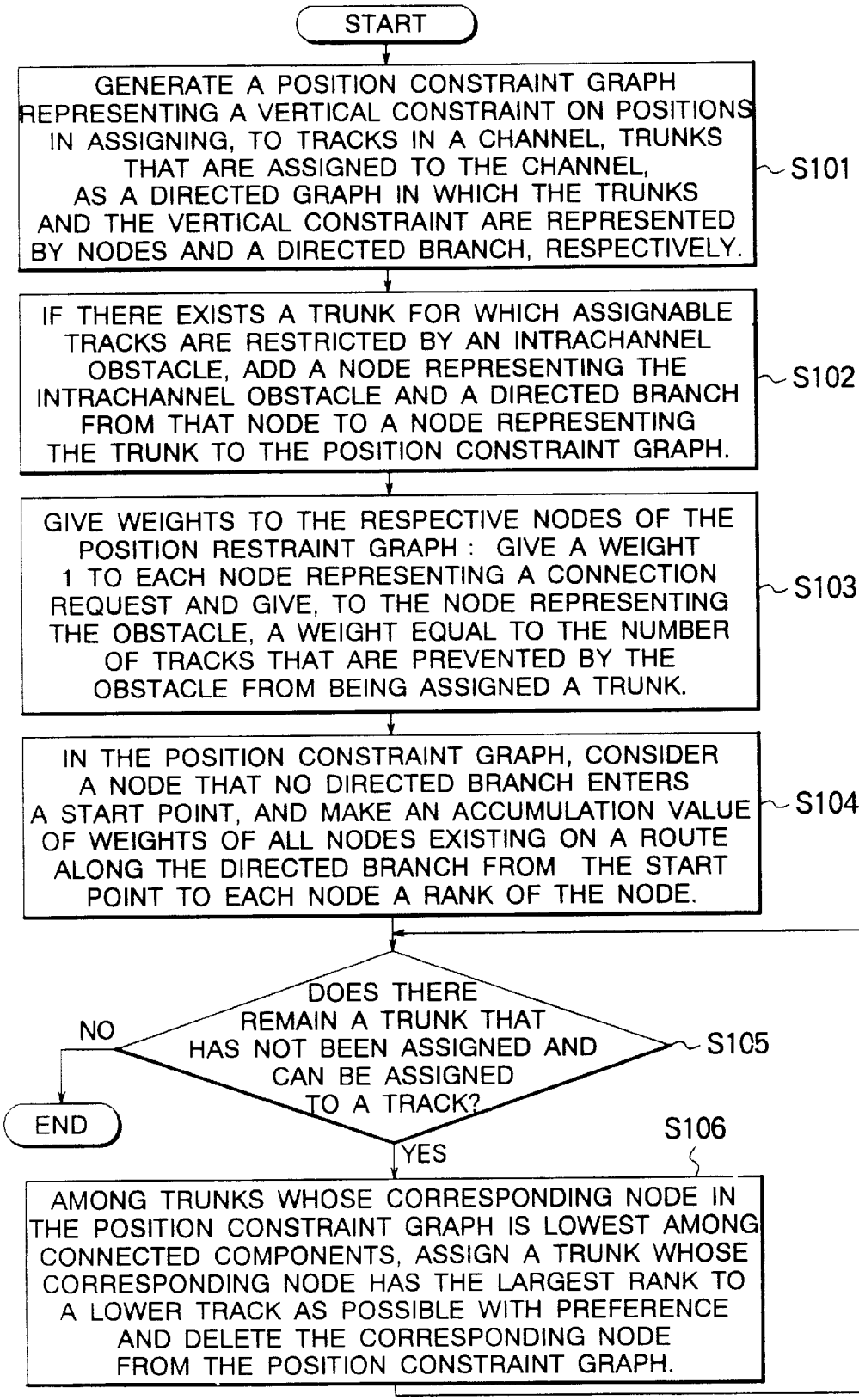
FIG. 1 is a flowchart showing a conventional routing process (1)

First, terms necessary for descriptions of embodiments of the present invention will be defined.

In the following, to simplify the description, two wiring layers M1 and M2 are assumed which are used for routing in the horizontal and vertical directions, respectively. An interconnection in the M1 layer and an interconnection in the M2 layer can be connected to each other by providing a through-hole at their intersection. A routing scheme of the invention can be applied to a channel routing process that uses three or more wiring layers by calculating a track set etc. (defined below) for each wiring layer and using calculation results in each step of the routing process.

A routing prohibition figure of a channel routing region exists in the wiring layer M1 or M2. Each routing prohibition region is assumed to be a rectangle. It is assumed that a general rectilinear polygon (a polygon having horizontal lines or vertical lines as boundaries) is divided into rectangles prior to being subjected to a channel routing process; the routing process deals with only divided rectangular routing prohibition figures. Routing prohibition figures in the wiring layers M1 and M2 are called a horizontal passage prohibition figure and a vertical passage prohibition figure, respectively.

In the inside of a channel routing region, a position of a horizontal line through which a horizontal interconnection is supposed to pass is called a track. Tracks are set for each wiring layer. The interval between adjacent tracks is determined in consideration of design rules based on a semiconductor process technology. Where arrangement positions of cell rows constituting top and bottom sidelines (top and bottom boundary lines) or a macro-cell of a channel routing region are fixed, the positions and the number of tracks do not vary during execution of a routing process. Where arrangement positions of cell rows or a macro-cell are variable, it is possible to move the positions of tracks and insert or delete a track in executing a routing process on a channel routing region. When a track is inserted, cells above and below the inserted track are moved away from each other. Conversely, when a track is deleted, cells that previously located above and below the deleted track are moved closer to each other. For convenience of description, the following description is directed to a case where net trunks are assigned to tracks downward from the top track of a channel routing region. A process that will be described below is applicable in a similar manner to a case where net trunks are assigned to tracks upward from the bottom track.

A position of a vertical line through which a vertical interconnection is supposed to pass is called a column. Tracks are set for each wiring layer. A terminal facing a channel routing region is located on a column. If there exists a terminal that is not located on any column, an interconnection is drawn to a column close to that terminal and that position is considered a new terminal.

When trunks are assigned to tracks, a constraint relating to a vertical positional relationship occurs between nets to which terminals located at upper and lower positions of a column belong. Now let nets to which terminals located at upper and lower positions of column c belong be denoted by n and n', respectively. On column c, to avoid short-circuiting between interconnections of nets n and n', a trunk of net n must be assigned to a track that is located above a track to which a trunk of net n' is assigned. This type of position-related constraint that is imposed in assigning net trunks to tracks is called "vertical constraint."

Figure 36A:
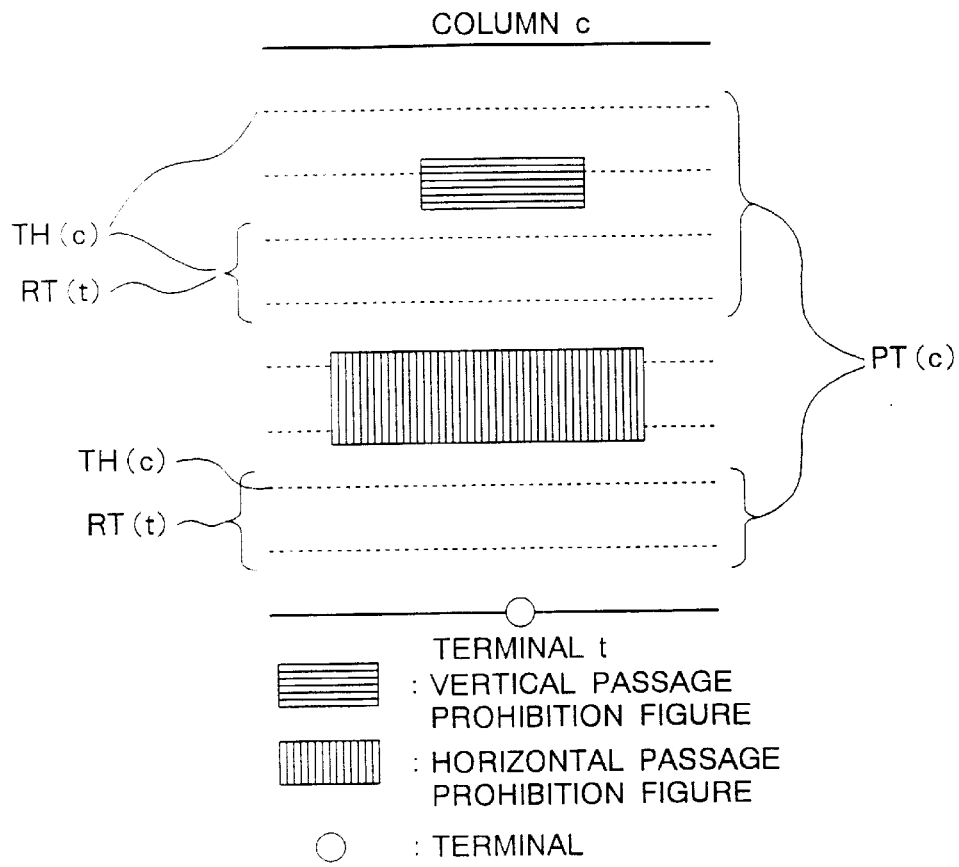

A track that can be reached from terminal t by a vertical line without being obstructed by any routing prohibition figure is called "reachable track" of terminal t. This is a track that intersects a vertical line that is drawn from terminal t toward the channel center until reaching a vertical passage prohibition figure. However, a track that intersects such a vertical line within a horizontal passage prohibition figure is excluded. A set of reachable tracks of terminal t is denoted by RT(t). FIG. 36A shows examples of reachable tracks.

Figure 36B:
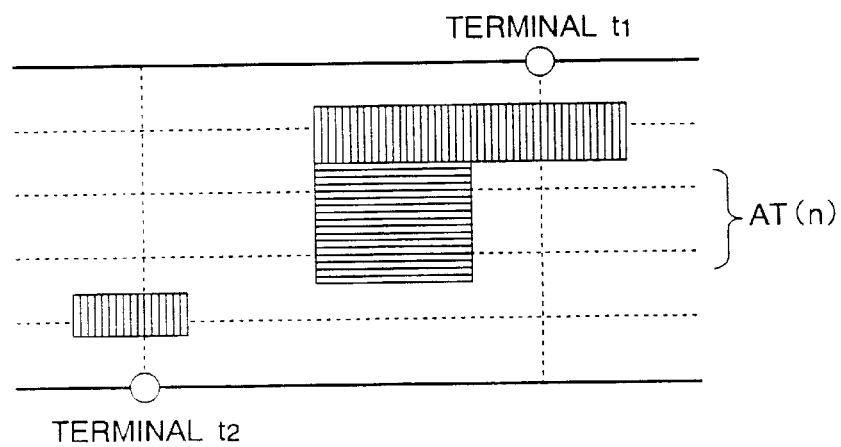

A track to which a trunk of net n can be assigned without the need for inserting a jog (a single horizontal trunk can be routed without being bent halfway) or without being obstructed by any routing prohibition figure is called "assignable track" of net n. A set of assignable tracks of net n is denoted by AT(n). If set AT(n) is an empty set, net n needs to be divided into subnets to bypass a routing prohibition figure. FIG. 36B shows examples of assignable tracks of net n={t1, t2}.

A track which intersects column c and whose intersection is not included in any horizontal passage prohibition figure is called "passable track" of column c. A set of passable tracks of column c is denoted by PT(c). FIG. 36A shows examples of passable tracks.

The number of nets having a terminal on column c and nets that must be routed so as to go over column c is called "route density" of column c, and corresponds to a lower limit of the number of tracks necessary for routing that relates to column c. The route density of column c is denoted by D(c).

A track which intersects column c and in which a through-hole can be set at the intersection is called "through-hole settable track" of column c. However, if terminal t exists on column c, a track that is closest to terminal t among tracks belonging to RT(t) is excluded to enable routing from terminal t. A set of through-hole settable tracks of column c corresponding to tracks whose intersection is not included in any horizontal or vertical passage prohibition figure is denoted by TH(c). FIG. 36A shows examples of through-hole settable tracks.

A consideration will be given to dividing a net into subsets, i.e., "subnets", based on the order of terminals. Terminals included in net n are denoted by $t(1), t(2), \ldots, t(i), t(i+1), \ldots, t(|n|)$. It is assumed that $x(t(1)) \leq x(t(2)) \leq \ldots \leq x(t(i)) \leq x(t(i+1)) \leq \ldots \leq x(t(|n|))$, where the x coordinate of terminal t is represented by x(t). Net n is divided into $(|n|-1)$ subnets $sn\_(i)=\{t(i), t(i+1)\}$ $(i=1, 2, \ldots, |n|-1)$. A range between an x coordinate of $x(t(i))$ of terminal $t(i)$ and an x coordinate $x(t(i+1))$ of terminal $t(i+1)$ is called "interval" of subnet $sn\_(i)$. When a trunk of subnet $sn\_(i)$ and that of subnet $sn\_(i+1)$ are assigned to different tracks, it is said that "net n is divided at position $x(t(i+1))$".

In a net having terminals over and under column c, if no vertical passage prohibition figure exists on column c, the terminals over and under column c can easily be connected to each other by a vertical line-like interconnection.

Therefore, this type of terminal pair is assumed to be deleted from a net in a preprocess, for instance, of a routing process with an assumption that the terminal pair has already been routed. As a result, column c can be disregarded in considering a channel routing problem. However, the terminals located over and under column c are considered in dividing this type of net into subnets. Where three or more wiring layers are used, two or more wiring layers can be used for vertical routing. In this case, in column c, only a wiring layer that has been used for routing a vertical line-like interconnection is disregarded.

In the following, unless otherwise noted, the unit of routing is a subnet and the above-defined terms are similarly defined for the subnet.

A subnet and a vertical passage prohibition figure are made to correspond to nodes, and a prohibition constraint graph G=(V, E ∪ F) is introduced in which vertical constraints derived from positional relationships between terminals of a subnet and between a terminal and a vertical passage prohibition figure are represented by directed branches. A node v ∈ V of a prohibition constraint graph G corresponds to a vertical passage prohibition figure or a subnet existing in a channel routing region. On a drawing, a node corresponding to a vertical passage prohibition figure is represented by a rectangle. A set F of directed branches represents a relationship among subnets. Where a subnet corresponding to node u and a subnet corresponding to node v are ones obtained by dividing the same net and are adjacent to each other, directed branch e=(u, v)∈ F is provided, which is called "double branch" and represented by a double line on a drawing. Directed branch e ∈ E represents a vertical constraining relationship. Directed branch e=(u, v) is provided when one of the following conditions a) to c) is satisfied:

at Terminals of subnets corresponding to nodes u and v are located over and under a column, respectively, and no vertical passage prohibition figure exists on the column.

b) A terminal of subnet v exists under a vertical passage prohibition figure u. The terminal is included in a range of the figure (an interval defined by a left-hand sideline and a right-hand sideline of the figure).

c) A terminal of subnet u exists over a vertical passage prohibition figure v. The terminal is included in a range of the figure.

Where double branch (u, v) exists within a prohibition constraint graph, trunks of subnets corresponding to nodes u and v are necessarily assigned to the same track in a process of assigning trunks to tracks. However, even where no double branch exists, they may be assigned to the same track depending on a state of tracks to which trunks of the other subnets are assigned. In the following, unless otherwise noted, a subnet and a routing prohibition figure and corresponding nodes in a prohibition constraint graph will be represented by the same symbols.

Figure 37A:
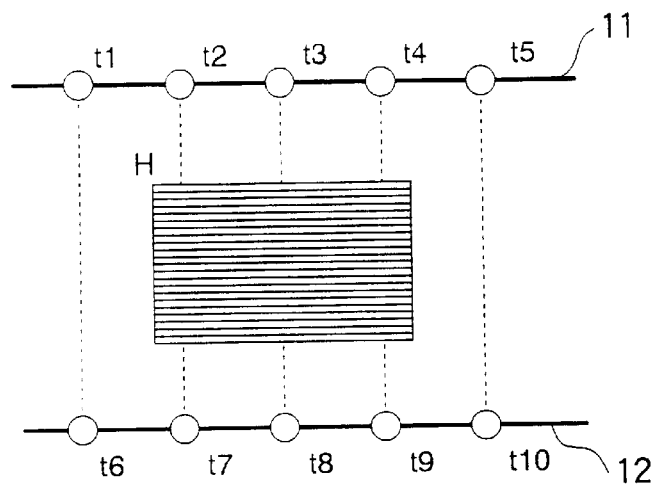
Figure 37B:
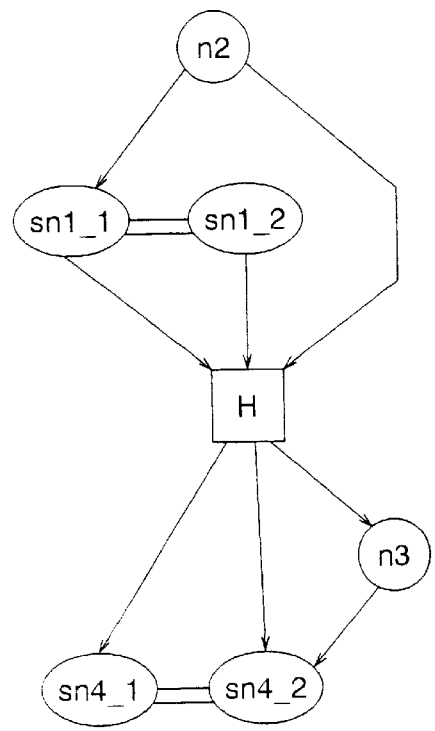

FIG. 37B shows a prohibition constraint graph of a channel routing region of FIG. 37A. Net list N={n1, n2, n3, n4} in which the respective nets are such that n1={t2, t3, t6}, n2={t1, t4}, n3={t5, t7}, and n4={t8, t9, t10}. Net n1 is divided into subnets sn1_1={t6, t2} and sn1_2={t2, t3}, and net n4 is divided into subnets sn4_1={t8, t9} and sn4_2={t9, t10}. A double branch exists between nodes corresponding to sn1_1 and sn1_2 and between nodes corresponding to sn4_1 and sn4_2. As for directed branches representing vertical constraints, according to condition a), directed branch are provided from a nodes corresponding to net n2 to a node corresponding to subnet sn1_1 and from a node corresponding to net n3 to a subnet sn4_2. According to condition b), directed branches are provided from a node corresponding to a vertical passage prohibition figure H to respective nodes corresponding to net n3 and subnets sn4_1 and sn4_2. Similarly, according to condition c, directed branch are provided from respective nodes corresponding to subnets sn1_1 and sn1_2 and net n2 to the vertical passage prohibition figure H.

In FIG. 37A, reference numerals 11 and 12 denote top and bottom boundaries, respectively, of the channel routing region.

(1) Embodiment 1 of the Invention (1-1) Configuration

The configuration of a first embodiment of the invention will be hereinafter described in detail with reference to the drawings.

Figure 9:
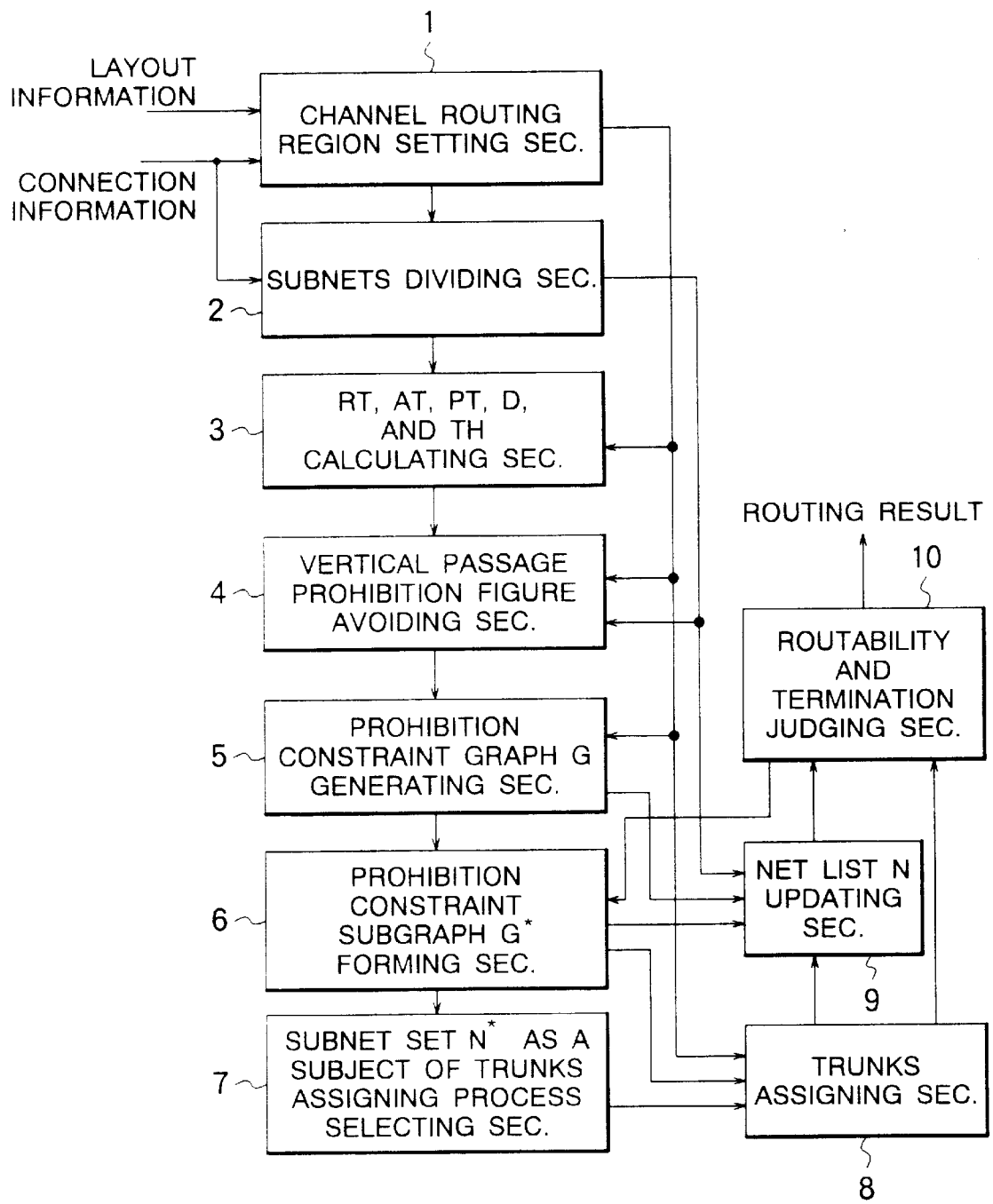
FIG. 9 is a block diagram showing the configuration of a first embodiment of the present invention.

Referring to FIG. 9, in a case where detailed interconnection routes such as wiring layers, interconnection passage positions, and interconnection shapes or circuit parts layout positions are preset for a routing region in routes designing of an integrated circuit, the first embodiment of the invention is provided with:

a channel routing region setting section 1 for setting a channel routing region based on information about terminals that belong to cells adjacent to the routing region, prohibition information about interconnections belonging to cells, and information about connections between terminals;

a subnets dividing section 2 for dividing a net into subnets based on positional information of terminals existing in the channel routing region that has been set by the channel routing region setting section 1 and connection information of the terminals, and for setting a net list N as a set of subnets;

a RT, AT, PT, D, and TH calculating section 3 for calculating a set RT(t) of reachable tracks of each terminal t, a set AT(n) of assignable tracks of each subnet n included in the net list N, a set PT(c) of passable tracks of each column c, a route density D(c), and a set TH(c) of throughhole settable tracks for information about routing prohibition figures in the channel routing region that has been set by the channel routing region setting section 1 and the net list N determined by the subnets dividing section 2;

a vertical passage prohibition figure avoiding section 4 for executing a process of avoiding, among the routing prohibition figures existing in the channel routing region that has been set by the channel routing region setting section 1, a vertical passage prohibition figure that obstructs routing of subnet n whose set AT(n) of assignable tracks calculated by the RT, AT, PT, D, and TH calculating section 3 in the net list N determined by the subnets dividing section 2 is an empty set;

a prohibition constraint graph G generating section 5 for generating a prohibition constraint graph G representing constraints that relate to vertical passage prohibition figures and terminals based on positions of the routing prohibition figures and the terminals existing in the channel routing region that has been set by the channel routing region setting section 1, the net list N determined by the subnets dividing section 2, and a result of the process of avoiding a vertical passage prohibition figure executed by the vertical passage prohibition figure avoiding section 4;

a prohibition constraint subgraph G* forming section 6 for forming a prohibition constraint subgraph G*=(v*, E*) that is a subgraph of the prohibition constraint graph G by executing a node/branch deleting process on the prohibition constraint graph G generated by the prohibition constraint graph G generating section 5;

a subnet set N* as a subject of a trunks assigning process selecting section 7 for setting, as a subnet set, N* as a subject of a trunks assigning process, a set of subnets corresponding to nodes that are included in a node set V* of the prohibition constraint subgraph G* formed by the prohibition constraint subgraph G* forming section 6;

a trunks assigning section 8 for assigning trunks of the subnets belonging to the set N* based on information about the routing prohibition figures and the terminals existing in the channel routing region that has been set by the channel routing region setting section 1 while regarding the prohibition constraint subgraph G* formed by the prohibition constraint subgraph G* forming section 6 as a directed graph representing vertical constraint relationships relating to the subnet set N* determined by the subnet set N* as a subject of a trunks assigning process selecting section 7;

a net list N updating section 9 for updating the net list N to (N−N*), and for setting a graph that is obtained by deleting the prohibition constraint subgraph G* from the prohibition constraint graph G as a new prohibition constraint graph G; and a routability and termination judging section 10 for judging whether the trunks of all the subnets of the set N* have been assigned to tracks by the trunks assigning section 8, outputting an error signal if there remains an unassigned subnet, judging whether the net list N as updated by the net list N updating section 9 is an empty set if the assigning was successful, if it is an empty set, in a case where boundary lines of the channel routing region and shapes and positions of the routing prohibition figures are variable in the vertical direction and a free track remains that is a track not assigned any trunk, deleting the free track, changing the positions of the boundary lines of the channel routing region and the shapes of the routing prohibition figures and moving the routing prohibition figures, and reducing the height of the channel routing region, and terminating the routing process.

(1-2) Operation

The operation of the first embodiment of the invention will be hereinafter described with reference to the drawings.

Figure 10:
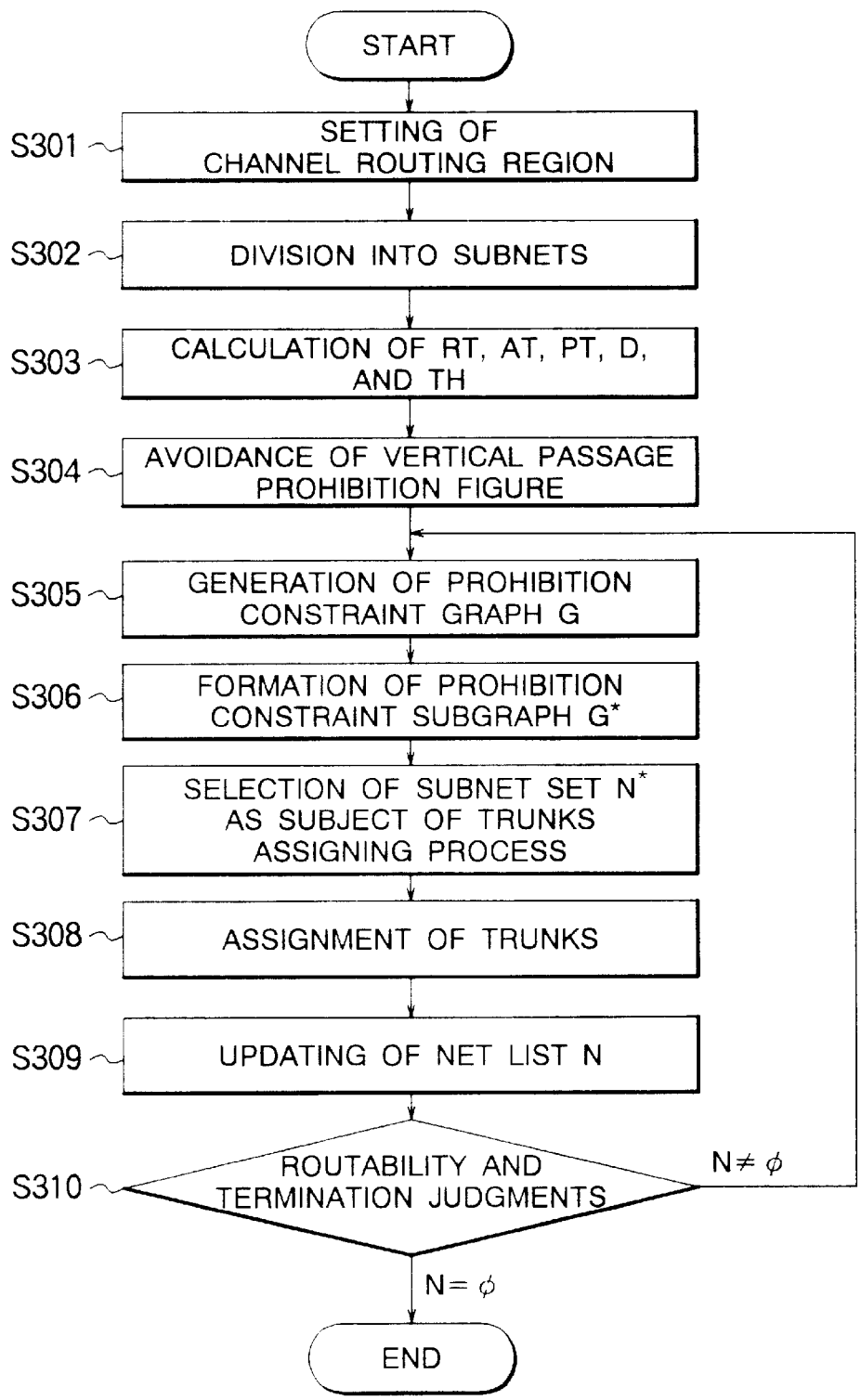
FIG. 10 is a flowchart showing the operation of the first embodiment.

FIG. 10 is a flowchart generally showing the process of the first embodiment of the invention. The routing process includes steps S301–S310 described below.

S301 (setting of channel routing region): Boundaries of a channel routing region are determined based on positions of terminals to be connected to nets that belong to a net list N and routing prohibition figures existing in cells that are located above and below a channel.

S302 (division into subnets): The nets are divided into subnets and sets of subnets are made a new net list N. An undivided net is also regarded as one subnet.

S303 (calculation of RT, AT, PT, D, and TH): A set RT(t) of reachable tracks of each terminal t, a set AT(n) of assignable tracks of each subnet n, a set PT(c) of passable tracks of each column c, a route density D(c), and a set TH(c) of through-hole settable tracks are calculated.

S304 (avoidance of vertical passage prohibition figure): A process of avoiding a vertical passage prohibition figure that obstructs routing of subnet n whose set AT(n) of assignable tracks is an empty set is performed.

S305 (generation of prohibition constrain graph G): A prohibition constraint graph G is generated.

S306 (formation of prohibition constraint subgraph G*): A subgraph G*=(V*, E*) is formed by performing a node/branch deleting process on the prohibition constraint graph G. This subgraph is made a prohibition constraint subgraph G*.

S307 (selection of subnet set N* as subject of trunks assigning process): A set of subnets corresponding to nodes that are included in a node set V* of the prohibition constraint subgraph G* is set as a subnet set N* as a subject of a trunks assigning process.

S308 (assignment of trunks): The prohibition constraint subgraph G* is set as a directed graph representing vertical constraint relationship relating to the subnet set N*. Set Rnot is set as an empty set. Trunks of subnets belonging to the set N* are assigned to tracks based on the prohibition constraint subgraph G*.

If trunks of not all the subnets of the set N* could not be assigned to tracks, a set of unassigned subnets is made a new set Rnot and the process goes to step S309.

S309 (updating of net list N): The net list N is updated to (N−N*). A graph obtained by deleting the prohibition constraint subgraph G* from the prohibition constraint graph G set as a new prohibition constraint graph G.

S310 (routability and termination judgments): If Rnot is not an empty set, a signal to the effect that the routing on the channel routing region is impossible and the process is terminated. If Rnot is an empty set, it is judged whether the net list N is an empty set. If it is not an empty set, the process returns to step S305. If it is an empty set, in a case where boundary lines of the channel routing region and shapes and positions of the routing prohibition figures are variable in the vertical direction and a free track remains that is a track not assigned any trunk, the free track is deleted, the positions of the boundary lines of the channel routing region and the shapes of the routing prohibition figures are changed and the routing prohibition figures are moved, the height of the channel routing region is reduced, and the routing process is terminated.

Steps S304 and S306 will be described below in detail.

Figure 38:
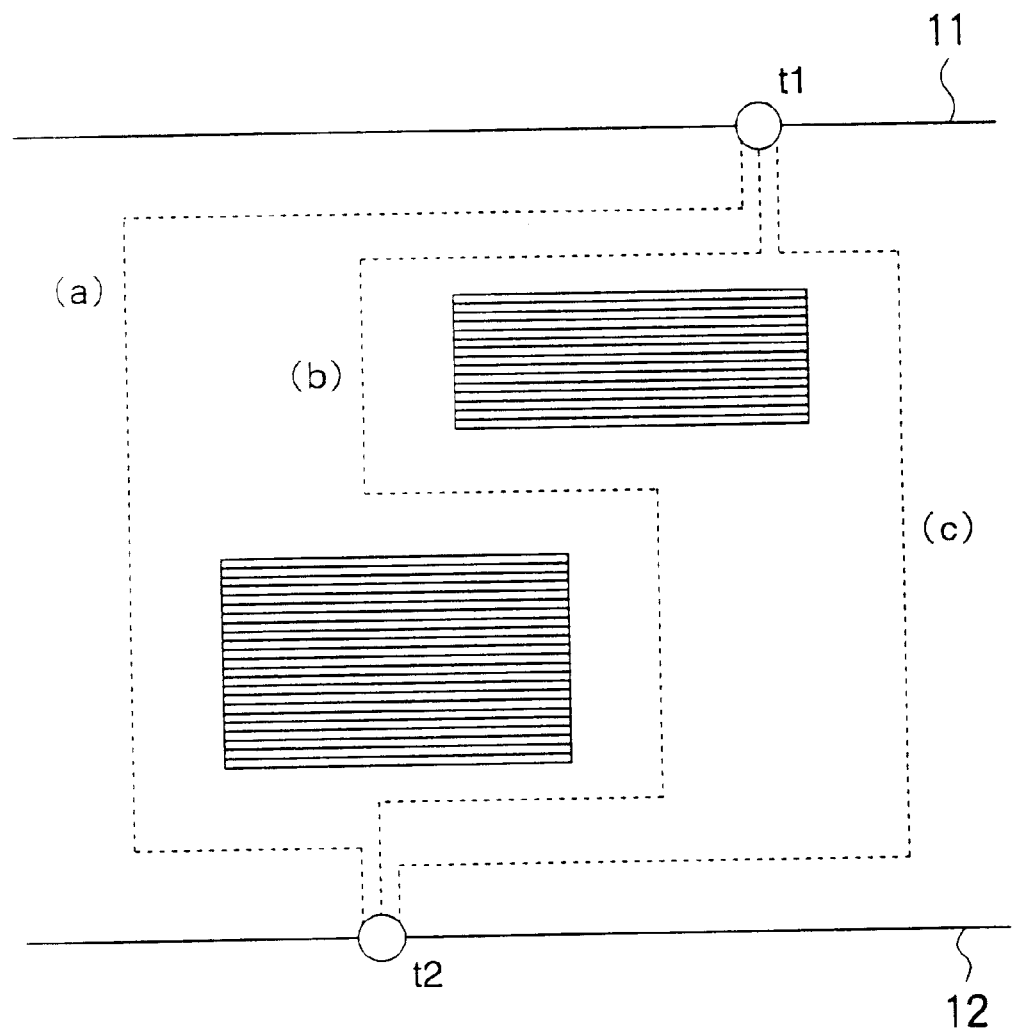
FIG. 38 illustrates forms of a bypass interconnection.

At step S304, to enable such routing as to bypass a prohibition figure that obstructs routing of subnet n whose assignable set AT(n) is an empty set, net n is again divided into subnets. For net n={t1, t2}, bypass routing candidates (a) to (c) shown in FIG. 38 are conceivable which depend on the positions and the number of routing-obstructing prohibition figures. For candidates (a) and (c), bypass routing is enabled by dividing net n into two subnets. For candidate (b), bypass routing is enabled by dividing net n into three subnets. Similarly, where many routing prohibition figure exist within an interval of net n, routing that bypasses the routing prohibition figure is enabled by dividing net n into a plurality of subnets based on a routing candidate considered. In the following, to simplify the description, routing prohibition figures are considered a single collective figure and a consideration will be given to only routing candidates that bypass the collective figure past its left-hand or right-hand sideline (like candidates (a) and (c)).

The direction in which an interconnection of net n is to bypass a routing prohibition figure R and column c on which a vertical segment for bypass routing is to be disposed are selected based on an evaluation function F0. The evaluation function F0 is defined so as to reflect the following items (1) to (4):

(1) the length LenD of the bypass interconnection;
(2) the number NumN of terminals of net n that are located on column c;
(3) the number NumO of terminals of other nets that are located on column c; and
(4) the number of tracks of TH(c).

The function F0 is defined as $$F0 = -\alpha \cdot \text{Len}D + \beta \cdot \text{Num}N - \gamma \cdot \text{Num}O + \delta \cdot TH(c)$$

where $\alpha$, $\beta$, $\gamma$, and $\delta$ are non-negative constants. Desired preference order can be set for items (1) to (4) by properly setting the values of α, β, γ, and δ. For example, if they are set such that α>β>γ>δ with sufficiently large differences therebetween, the evaluation function F0 is given such preference order that a highest preference is given to item (1) and the rank lowers in order of the item number.

Net n having terminals over and under a vertical passage prohibition figure (or a collective figure) R on columns within the range of the prohibition figure R is divided into subnets in the following manner. Net n is defined such that n={t(i)|i=1, 2, ..., |n|} and x(t(i))≦x(t(i+1)), 1 ≦i≦|n|−1. An array of terminals that exist within the range of the vertical passage prohibition figure R and located on the top line of the channel routing region are written as t(a(l)), t(a(2)), ..., t(a(p)). An array of terminals that exist within the range of the vertical passage prohibition figure R and located on the bottom line of the channel routing region are written as t(b(1)), t(b(2)),..., t(b(q)). Here the following relationships hold:

$$x(t(a(i)))\leq x(t(a(i+1))), 1\leq i\leq p-1$$

and $$x(t(b(i)))\leq x(t(b(i+1))), 1\leq i\leq q-1.$$

The rightmost terminal among terminals of net n that are located on the left of the vertical passage prohibition figure R is denoted by t(L), and the leftmost terminal among terminals of net n that are located on the right of the vertical passage prohibition figure R is denoted by t(R).

Figure 39:
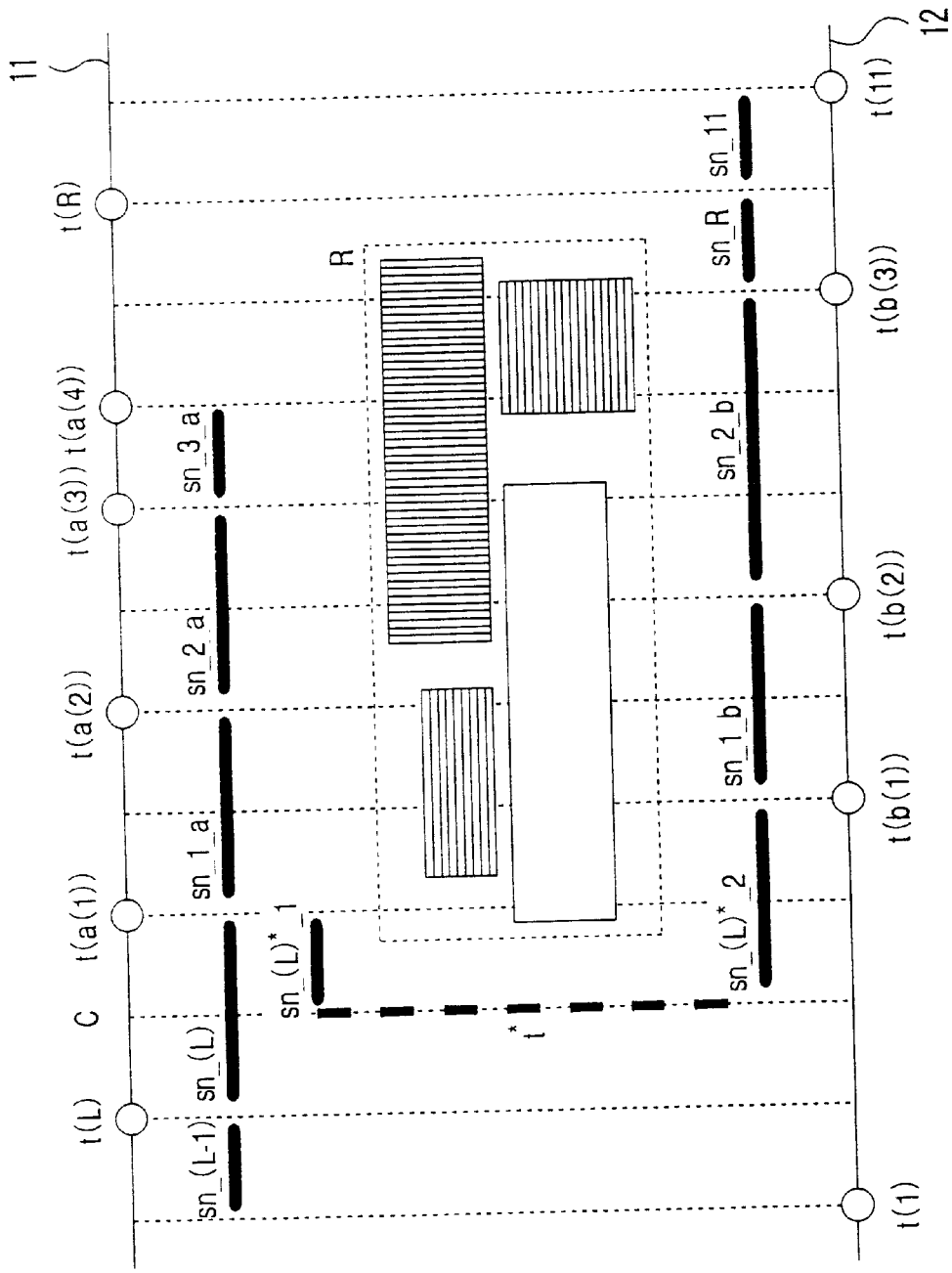
FIG. 39 illustrates subnets that are used to represent a bypass interconnection.

Now, a consideration will be given to a case of dividing net n into subnets when by using the evaluation function F0 column c is selected that satisfies x(t(L))<x(c)<min{x(t(a(l))), x(t(b(l)))}. A similar consideration applies to a case where another column is selected. Net n is divided into subnets according to the following items (1) to (7) (see FIG. 39):

(1) sn__(k)={t(k), t(k+1)}, 1≦k≦L−1
(2) If x(t(a(1)))≦x(t(b(1))), sn__(L)={t(L), t(a(1)). Otherwise, sn__(L)={t(L), t(b(1))}.
(3) sn__(L)*__1={t*, t(a(1))} sn__(L)*__2={t*, t(b(1))}
(4) sn__(i)__a={t(a(i)), t(a(i+1))}, 1≦k≦p−1
(5) sn__(i)__b={t(b(i)), t(b(i+1))}, 1≦k≦q−1
(6) If x(t(a(p)))≦x(t(b(q)), sn__(R)={t(b(q)), t(R)}. Otherwise, sn__(R)={t(a(p)), t(R)}.
(7) sn__(i+1)={t(i), t(i+1)}, R≦i≦|n|−1

In the above items, terminal t* is an imaginary terminal that is introduced to represent a vertical segment used for bypass routing.

For each subnet obtained by the redividing, a set AT of assignable tracks is recalculated.

After the division into subnets that was performed to represent a bypass interconnection, if trunks of subnets obtained from the same net are assignable to the same track, they are assigned to the same track by the trunks assigning step S308.

In the case of bypassing a routing prohibition figure for a subnet including part of existing interconnections, there may occur a redundant route depending on the position of an imaginary terminal t*. In such a case, a redundant route and a corresponding routing prohibition figure are deleted in setting an imaginary terminal t*.

Figure 11:
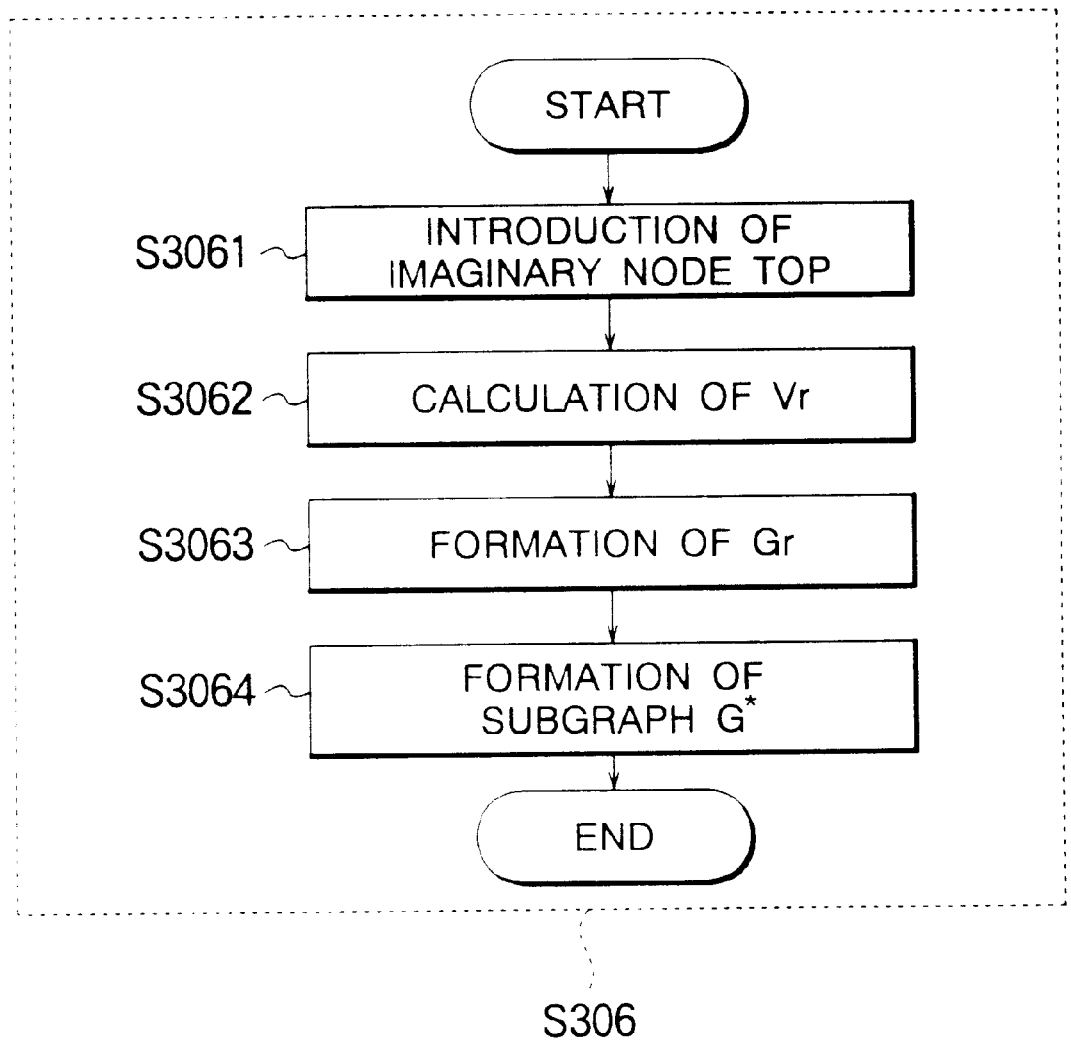
FIG. 11 is a flowchart showing the operation of step S306 (formation of prohibition constraint subgraph G*) in the first embodiment of the invention.

FIG. 11 is a flowchart showing details, i.e., steps of S3061–S3064, of step S306 for forming a prohibition constraint subgraph.

S3061 (introduction of imaginary node TOP): An imaginary node TOP is provided in a prohibition constraint graph G=(V, E). A set of nodes belonging to node set V and having no entering directed branch is denoted by Vo. If Vo does not have any node corresponding to a subnet, V is made V−Vo and directed branches going out of nodes of Vo are deleted from E. This operation is repeated until a node corresponding to a subnet is included in Vo. If Vo includes or comes to include a node corresponding to a subnet, a directed branch is provided from the imaginary node TOP to each node of Vo. A node set Vr is initialized to be an empty set.

S3062 (calculation of Vr): A breadth first search using the imaginary node TOP as a start point is performed. It is judged whether each node v as a subject of search corresponds to a routing prohibition figure. If so, all directed branches going out of node v are deleted. End points of the deleted directed branches are added to Vr.

S3063 (formation of Gr): A breadth first search using each node of Vr as a start point is performed, and nodes and branches found by the search are deleted from G. A resulting graph is denoted by Gr.

S3064 (formation of subgraph G*): A breadth first search is performed from the imaginary terminal TOP in Gr. A set of nodes as subjects of search is denoted by V'. A set obtained by deleting nodes corresponding to routing prohibition figures and the imaginary node TOP from V'is denoted by V*. A subgraph of G, G*=(V*, E*), is derived by V*. All nodes of V* correspond to nets or subnets and do not correspond to any routing prohibition figures.

(1-3) Advantages

Advantages of the first embodiment of the invention will be described below.

In the first embodiment of the invention, a net is divided into subnets each of which is a set of two terminals in the process of division into subnets and constraints on those subnets are considered. Therefore, for one subnet, the number of constraints relating to other subnets can be reduced to two or less. As a result, in a prohibition constraint graph, the number of branches connected to a node corresponding to another subnet among branches connected to the node of the subnet concerned is two or less. Since the number of branches connected to the node concerned is restricted, such processes as a search and a deletion to be executed on the prohibition constraint graph can be made efficient. By the process of avoiding a vertical passage prohibition figure, routing can be performed on even channel routing regions on which routing cannot be done by any conventional methods. Further, where the boundary lines of a channel routing region and the shapes and positions of routing prohibition figures are variable in the vertical direction and a trunk-unassigned track (free track) remains, the channel routing region can be minimized by deleting an unnecessary free track and thereby, reducing the height of the channel routing region.

(Example 1 of Embodiment 1)

The operation of a first example of the first embodiment of the invention will be described below in detail.

Figure 2:
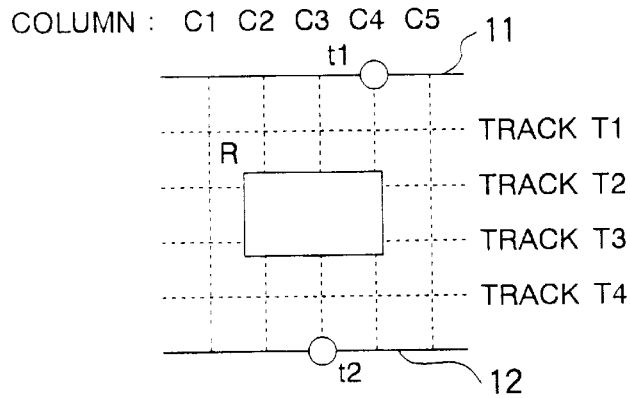
FIG. 2 shows a channel routing region of example (1) for a description of the conventional routing process (1)
Figure 3:
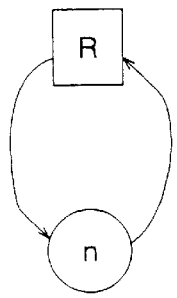
FIG. 3 shows a position constraint graph of example (1)

A consideration will be given to the channel routing region shown in FIG. 2, on which routing cannot be performed successfully by the routing method disclosed in Japanese Unexamined Patent Publication No. Hei. 4-167073. A net list N={n1}, where n1={t1, t2}. R denotes a vertical and horizontal passage prohibition figure. Tracks are denoted by T1–T4 downward in the channel routing region. Columns are denoted by C1–C5 rightward from the left end of the channel routing region.

First, at step S301, the above channel routing region is set. At step S302, net n1 is divided into subnets. Since net n1 consists of only two terminals, net n1 itself becomes a subnet sn1.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. RT(t1) {T1}, RT(t2)={T4}, AT(sn1)=φ, PT(C1)={T1, T2, T3, T4}, PT(C2)=PT(C3)=PT(C4)={Ti, T4}, PT(C5)={T1, T2, T3, T4}, D(C1)=D(C2)=0, D(C3)=D(C4)=1, D(C5)=0, TH(C1)={T1, T2, T3, T4}, TH(C2)={T1, T4}, TH(C3) ={T1}, TH(C4)={T4}, and TH(C5)={T1, T2, T3, T4}.

At step S304, since AT(sn1)=φ, to bypass the collective routing prohibition figure for the original net n1 of subnet sn1, net n1 is further divided into the following two subnets: $sn1^*\_a=\{t^*, t1\}$ and $sn1^*\_b=\{t^*, t2\}$. A consideration will be given to a case where the values of the coefficients $\alpha, \beta, \gamma,$ and $\delta$ of the evaluation function F0 are set such that $\alpha=10$ and $\beta=\gamma=\delta=1$ and column C5 is selected which maximizes the value of F0.

For subnets $sn1^*\_a$ and $sn1^*\_b$, $AT(sn1^*\_a)=\{T1\}$ and $AT(sn1^*\_b)=\{T4\}$.

Figure 40A:
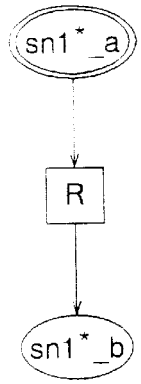
FIG. 40A shows a prohibition constraint graph.

At step S305, a prohibition constraint graph G is generated as shown in FIG. 40A. At step S306, a prohibition constraint subgraph G* is obtained as a solid-line portion in FIG. 40A.

At step S307, a set N* of subnets as a subject of the assignment process becomes such that $N^*=\{sn1^*\_a\}$.

Figure 40B:
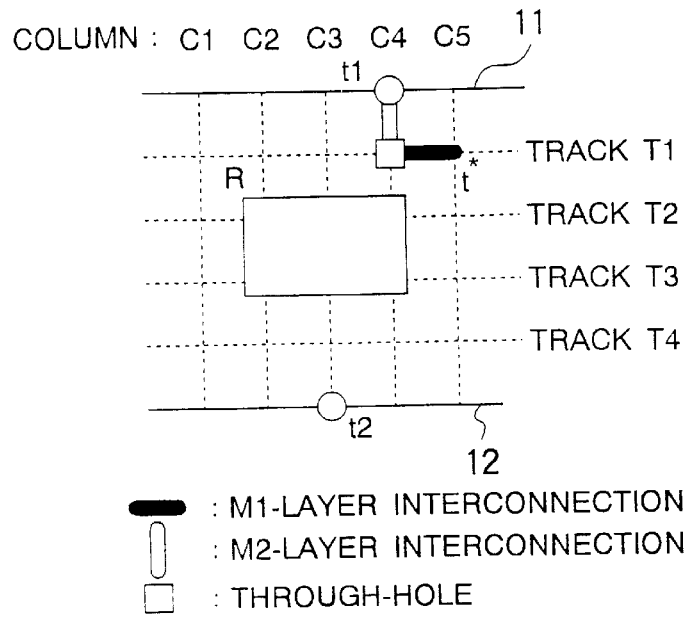
FIG. 40B shows a result of routing of track assignment.

At step S308, a trunk of the subnet of N* is assigned to track T1. FIG. 40B shows a result of the track assignment.

Figure 40C:
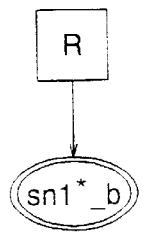
FIG. 40C shows a prohibition constraint graph generated by a second processing loop.
Figure 40D:
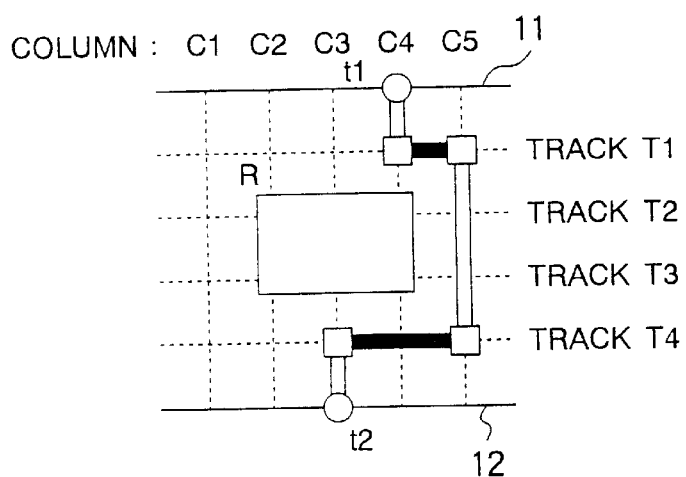

FIG. 40C shows a prohibition constraint graph G generated in steps S305–S310 of the second loop. A prohibition constraint subgraph G* is a solid-line portion in FIG. 40C. A trunk of subnet $sn1^*\_b$ is assigned to track T4. The net list N becomes an empty set at step S309 of this loop. Since no free track exists at step S310, the routing process is finished. FIG. 40D shows a routing result.

(Example 2 of Embodiment 1)

The operation of a second example of the first embodiment of the invention will be described below in detail.

Figure 4:
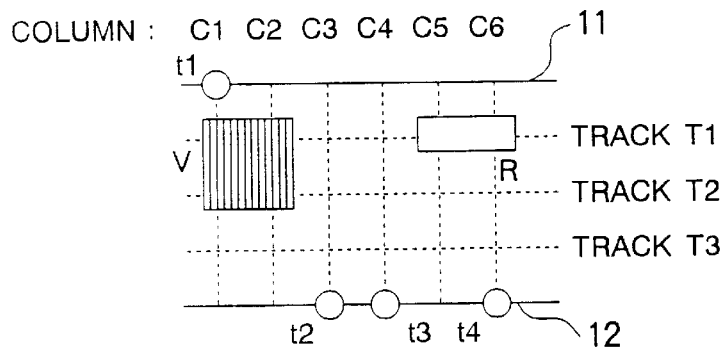
FIG. 4 shows a channel routing region of example (2) for a description of the conventional routing process (1)
Figure 5:
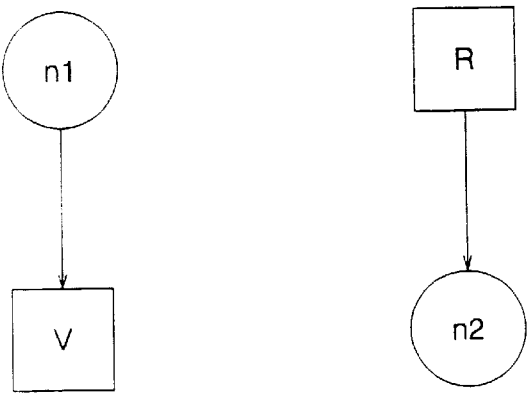
FIG. 5 shows a position constraint graph of example (2)
Figure 6:
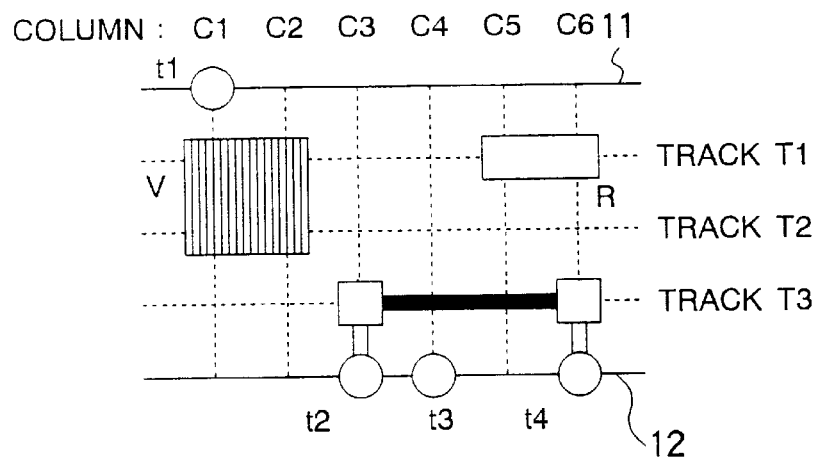
FIG. 6 shows a routing result of example (2)
Figure 7:
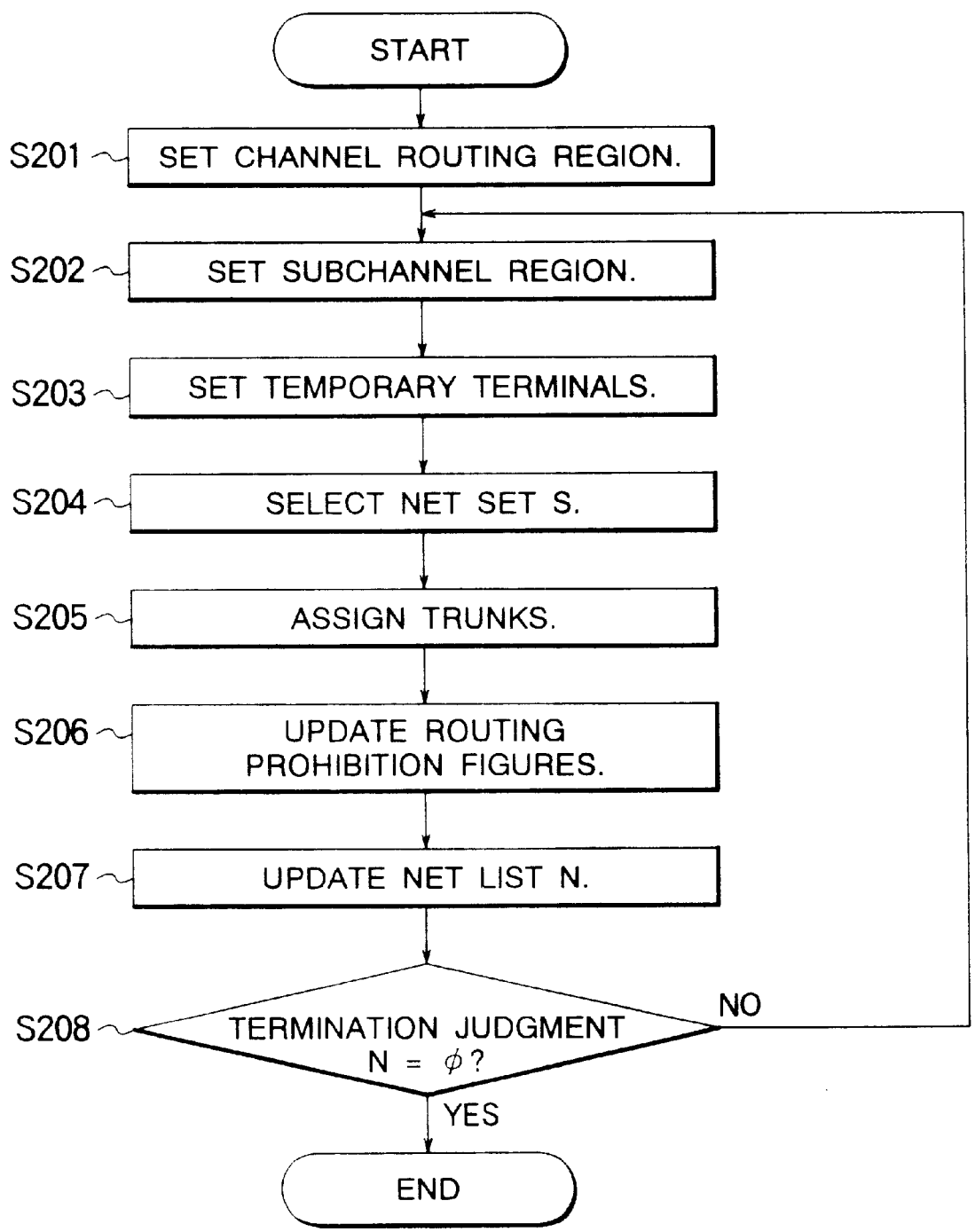
FIG. 7 is a flowchart showing a conventional routing process (2)

A consideration will be given to the channel routing region shown in FIG. 4, on which routing cannot be performed successfully by the routing method disclosed in Japanese Unexamined Patent Publication No. Hei. 4-167073. A net list N={n1, n2}, where n1={t1, t3} and n2={t2, t4}. V denotes a horizontal passage prohibition figure, and R denotes a vertical and horizontal passage prohibition figure. Tracks are denoted by T1–T3 downward in the channel routing region. Columns are denoted by C1–C6 rightward from the left end of the channel routing region.

First, at step S301, the above channel routing region is set. At step S302, the nets are divided into subnets. Since each of nets n1 and n2 consists of only two terminals, nets n1 and n2 themselves become subnets sn1 and sn2.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. RT(t1)={T3}, RT(t2)=RT(t3)={T1, T2, T3}, RT(t4)={T2, T3}, AT(sn1)={T3}, AT(sn2)={T2, T3}, PT(C1)=PT(C2)={T3}, PT(C3)=PT(C4)={T1, T2, T3}, PT(C5)=PT(C6)={T2, T3}, D(C1)=D(C2)=1, D(C3)=D(C4)=2, D(C5)=D(C6)=1, TH(C1)=φ, TH(C2)={T3}, TH(C3)=TH(C4)={T1, T2}, TH(C5)={T2, T3}, and TH(C6)={T2}.

Figure 41A:
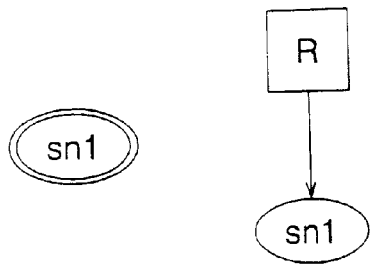

No processing is performed at step S304 because there is no subnet whose AT is an empty set. At step S305, a prohibition constraint graph G is generated as shown in FIG. 41A. At step S306, a prohibition constraint subgraph G* is obtained as a solid-line portion in FIG. 41A.

At step S307, a set N* of subnets as a subject of the assignment process becomes such that N*={sn1}.

Figure 41B:
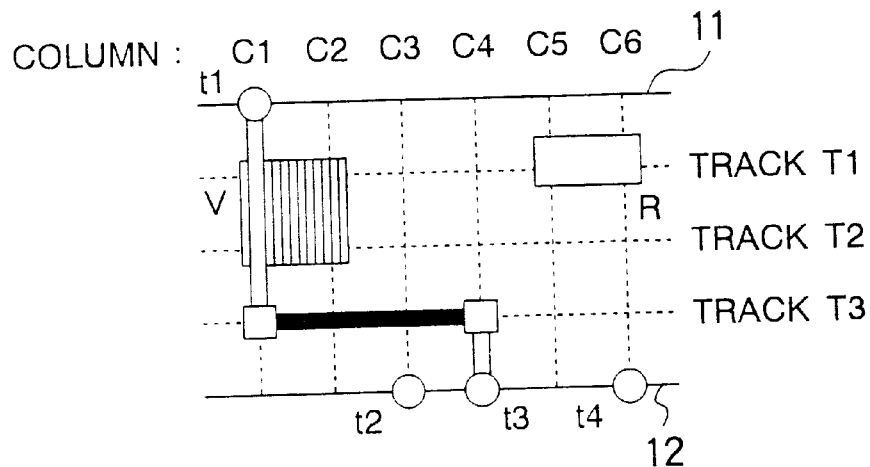
Figure 41C:
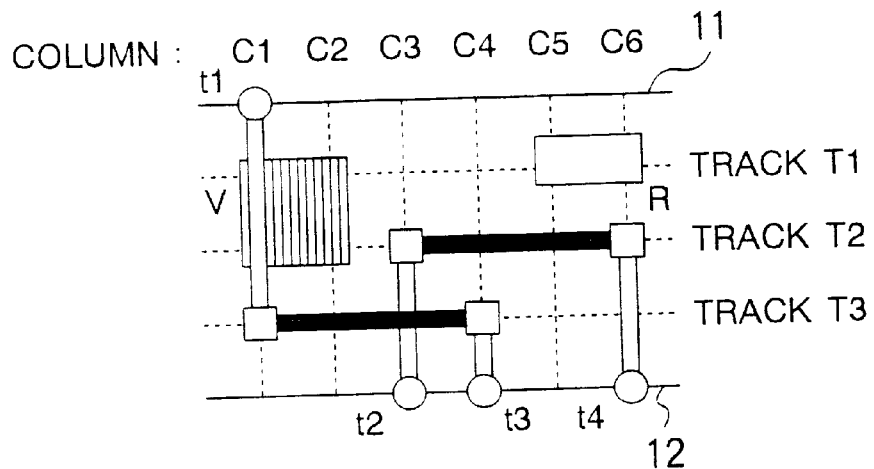

At step S308, a trunk of the subnet of N* is assigned to track T3. FIG. 41B shows a result of the track assignment.

A trunk of subnet sn2 is assigned to track T2 in steps S305–S310 of the second loop. The net list N becomes an empty set at step S309 of this loop. Since no free track exists at step S310, the routing process is finished. FIG. 41D shows a routing result.

(Example 3 of Embodiment 1)

The operation of a third example of the first embodiment of the invention will be described below in detail.

Figure 8A:
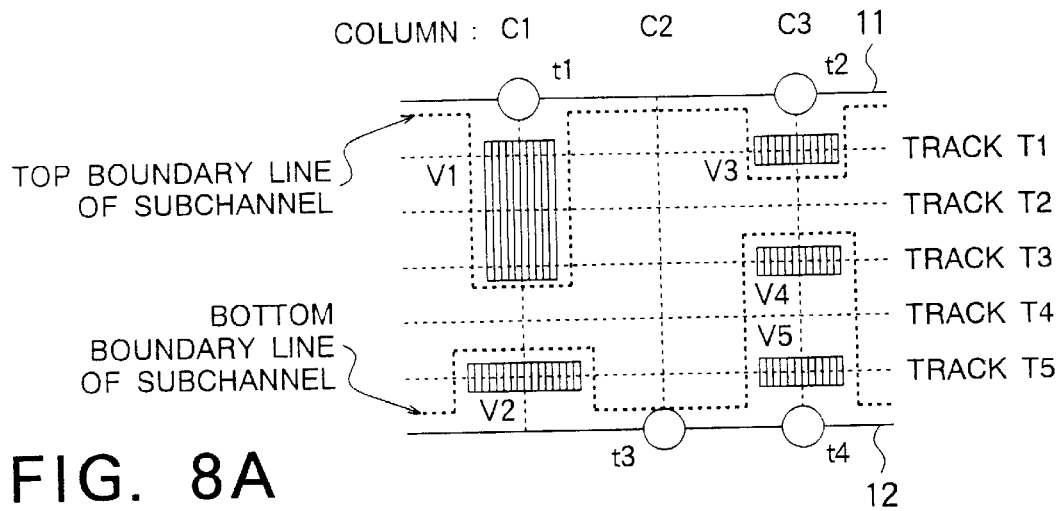
FIG. 8A shows a channel routing region of an example for a description of the conventional routing process (2)
Figure 8B:
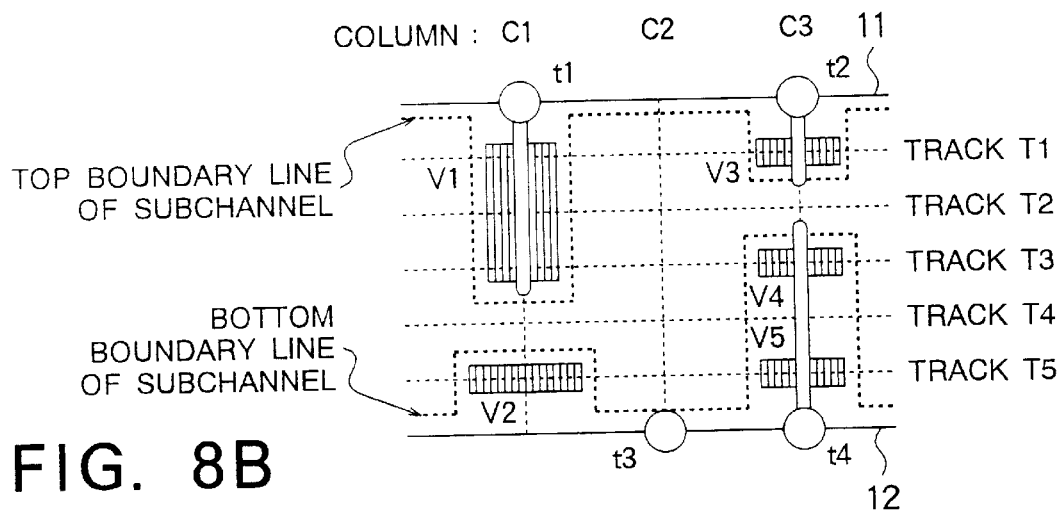
FIG. 8B shows temporary terminals in the example of FIG. 8A.
Figure 8C:
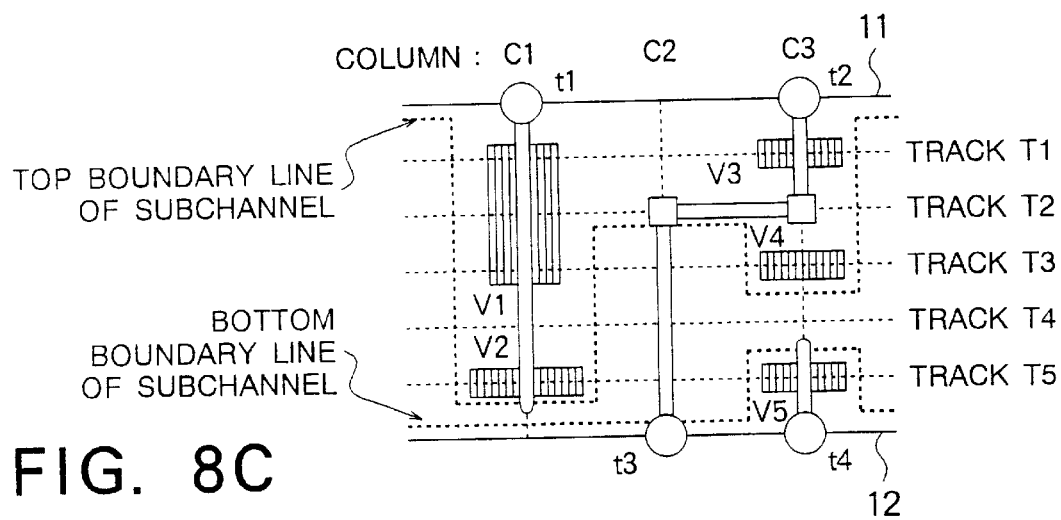
FIG. 8C is a subchannel routing result of the example of FIG. 8A.

A consideration will be given to the channel routing region shown in FIG. 8A, on which routing cannot be performed successfully by the routing method disclosed in Japanese Unexamined Patent Publication No. Hei. 8-274179. A net list N={n1, n2}, where n1={t1, t4} and n2={t2, t3}. V1–V5 denote horizontal passage prohibition figures. Tracks are denoted by T1–T5 downward in the channel routing region. Columns are denoted by C1–C3 rightward from the left end of the channel routing region.

First, at step S301, the above channel routing region is set. At step S302, the nets are divided into subnets. Since each of nets n1 and n2 consists of only two terminals, nets n1 and n2 themselves become subnets sn1 and sn2.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. RT(t1)={T4}, RT(t2)={T2, T4}, RT(t3)={T1, T2, T3, T4, T5}, RT(t4)={T2, T4}, AT(sn1)={T4}, AT(sn2)={T2, T4}, PT(C1)={T4}, PT(C2)={T1, T2, T3, T4, T5}, PT(C3)={T2, T4}, D(C1 )=1, D(C2)=D(C3)=2, TH(C1)=φ, TH(C2)={T1, T2, T3, T4}, TH(C3)=φ.

Figure 42A:
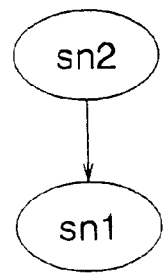

No processing is performed at step S304 because there is no subnet whose AT is an empty set. At step S305, a prohibition constraint graph G is generated as shown in FIG. 42A. At step S306, a prohibition constraint subgraph G* is the same as the prohibition constraint graph of FIG. 42A.

At step S307, a set N* of subnets as a subject of the assignment process becomes such that N*={sn1, sn2}.

Figure 42B:
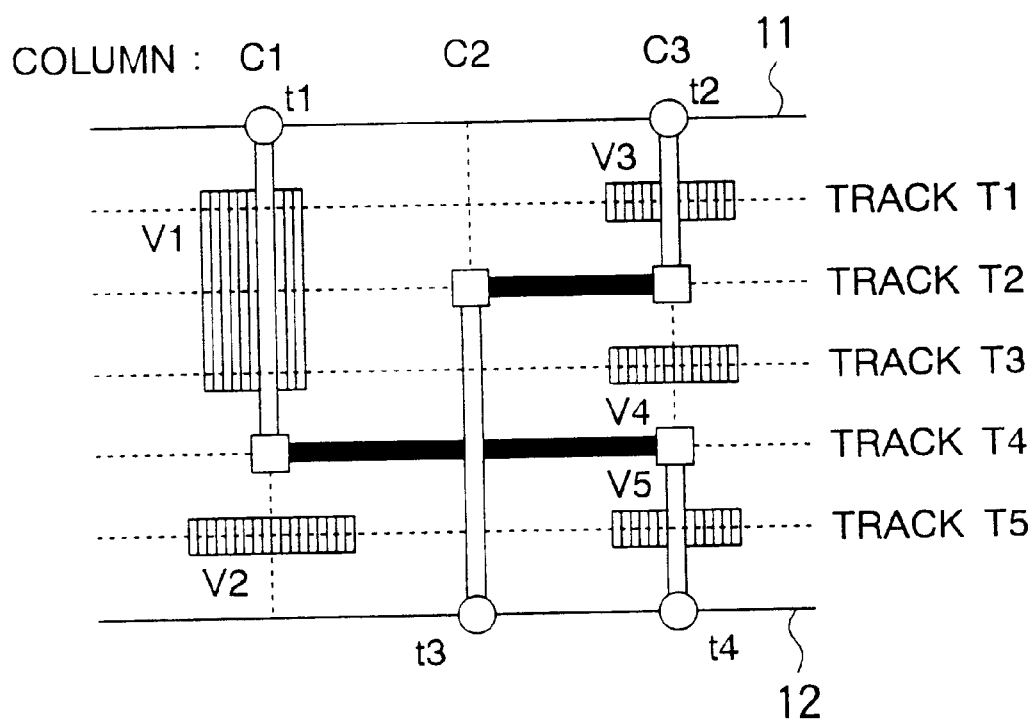

At step S308, trunks of subnets sn1 and sn2 are assigned to tracks T4 and T2, respectively. FIG. 42B shows a result of the track assignment. The net list N becomes an empty set at step S309. Since no free track exists at step S310, the routing process is finished.

(Example 4 of Embodiment 1)

The operation of a fourth example of the first embodiment of the invention will be described below in detail.

Figure 43A:
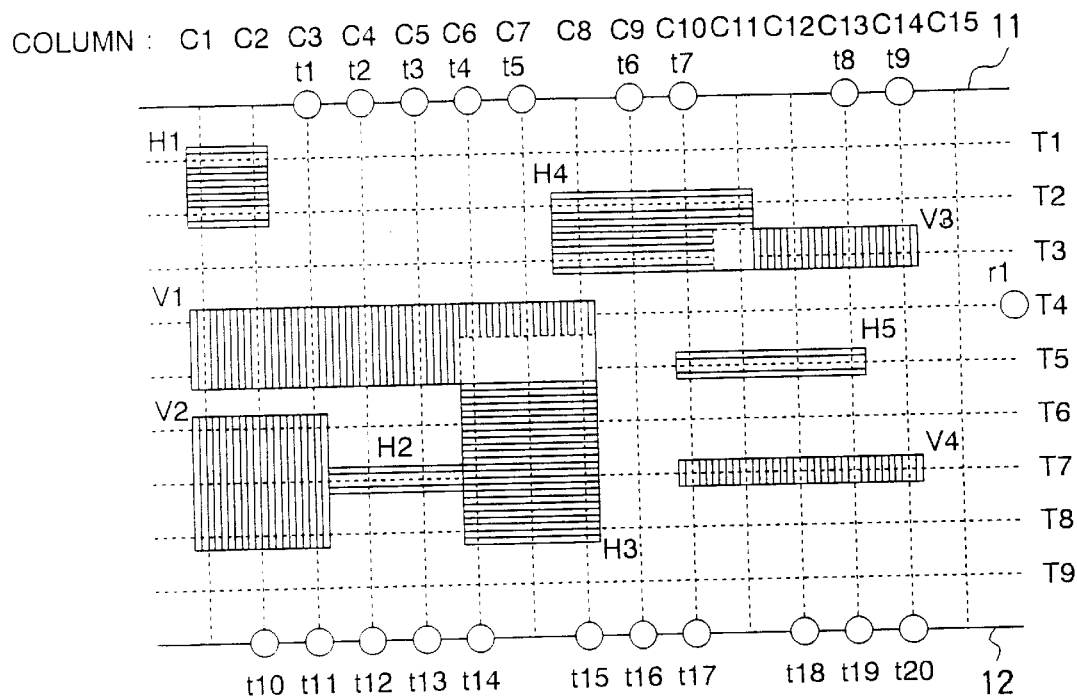

A consideration will be given to a channel routing region shown in FIG. 43A. A net list N={n1, n2, . . . , n9}, where n1={t7, t9}, n2={t3, t17, t18}, n3={t11, t13}, n4={t2, t4, t10}, n5={t14, t15}, n6={t5, t6}, n7={t8, t16}, n8={t12, t19}, and n9={t1, t20, r1}. Terminal r1 represents a connection that goes out of the channel routing region from its right end. H1–H5 denote vertical passage prohibition figures and V1–V4 denote horizontal passage prohibition figures. Tracks are denoted by T1–T9 downward in the channel routing region. Columns are denoted by C1–C15 rightward from the left end of the channel routing region.

First, at step S301, the above channel routing region is set. At step S302, the nets are divided into subnets in the following manner. Since each of nets n1, n3 and n5–n8 consists of only two terminals, those nets themselves become subnets sn1, sn3, and sn5–sn8. Net n2 is divided into sn2_1={t3, t17} and sn2_2={t17, t18}. Net n4 is divided into sn4_1={t10, t2} and sn4_2={t2, t4}. Net n9 is divided into sn9_1={t1, t20} and sn9_2 ={t20, r1}. Therefore, a new net list N is such that N={sn1, sn2_1, sn2_2, sn3, sn4_1, sn4_2, sn5, sn6, sn7, sn8, sn9_1, sn9_2}.

At step S303, a set RT(t) of reachable tracks of each terminal t (see Table 1 below), a set AT(sn) of assignable tracks of each subnet sn (see Table 2 below), and a set PT(c) of passable tracks of each column c, a route density D(c), and a set TH(c) of through-hole settable tracks (see Table 3 below) are calculated.

TABLE 1

| Terminal | Reachable tracks (set RT) |
|---|---|
| t1 | T1, T2, T3, T9 |
| t2 | T1, T2, T3, T6 |
| t3 | T1, T2, T3, T6 |
| t4 | T1, T2, T3 |
| t5 | T1, T2, T3 |
| t6 | T1 |
| t7 | T1 |
| t8 | T1, T2, T4 |
| t9 | T1, T2, T4, T5, T6, T8, T9 |
| t10 | T3, T9 |
| t11 | T1, T2, T3, T9 |
| t12 | T8, T9 |
| t13 | T8, T9 |
| t14 | T9 |
| t15 | T9 |
| t16 | T4, T5, T6, T7, T8, T9 |
| t17 | T6, T8, T9 |
| t18 | T6, T8, T9 |
| t19 | T6, T8, T9 |
| t20 | T1, T2, T4, T5, T6, T8, T9 |
| r1 | T1, T2, T3, T4, T5, T6, T7, T8, T9 |

TABLE 2

| Subnet | Assignable tracks (set AT) |
|---|---|
| sn1 | T1 |
| sn2_1 | T6 |
| sn2_2 | T6, T8, T9 |
| sn3 | T9 |
| sn4_1 | T3 |
| sn4_2 | T1, T2, T3 |
| sn5 | T9 |
| sn6 | T1 |
| sn7 | T4 |
| sn8 | T8, T9 |
| sn9_1 | T1, T2, T9 |
| sn9_2 | T1, T2, T4, T5, T6, T8, T9 |

TABLE 3

| Column | Passable tracks (set PT) | Route density D | Through-hole settable tracks (set TH) |
|---|---|---|---|
| C1 | T1, T2, T3, T9 | 0 | T3, T9 |
| C2 | T1, T2, T3, T9 | 1 | T3 |
| C3 | T1, T2, T3, T9 | 3 | T2, T3 |
| C4 | T1, T2, T3, T6, T7, T8, T9 | 4 | T2, T3, T6, T8 |
| C5 | T1, T2, T3, T6, T7, T8, T9 | 5 | T2, T3, T6, T8 |
| C6 | T1, T2, T3, T6, T7, T8, T9 | 5 | T2, T3 |
| C7 | T1, T2, T3, T6, T7, T8, T9 | 5 | T2, T3, T9 |
| C8 | T1, T2, T3, T6, T7, T8, T9 | 5 | T1 |
| C9 | T1, T2, T3, T4, T5, T6, T7, T8, T9 | 5 | T4, T5, T6, T7, T8 |
| C10 | T1, T2, T3, T4, T5, T6, T8, T9 | 5 | T4, T6, T8 |
| C11 | T1, T2, T4, T5, T6, T8, T9 | 5 | T1, T4, T6, T8, T9 |
| C12 | T1, T2, T4, T5, T6, T8, T9 | 5 | T1, T2, T4, T6, T8 |
| C13 | T1, T2, T4, T5, T6, T8, T9 | 4 | T2, T4, T6, T8 |
| C14 | T1, T2, T4, T5, T6, T8, T9 | 2 | T2, T4, T5, T6, T8 |
| C15 | T1, T2, T3, T4, T5, T6, T7, T8, T9 | 1 | T1, T2, T3, T4, T5, T6, T7, T8, T9 |

No processing is performed at step S304 because there is no subnet whose AT is an empty set. At step S305, a prohibition constraint graph G is generated as shown in FIG. 43B.

Figure 43B:
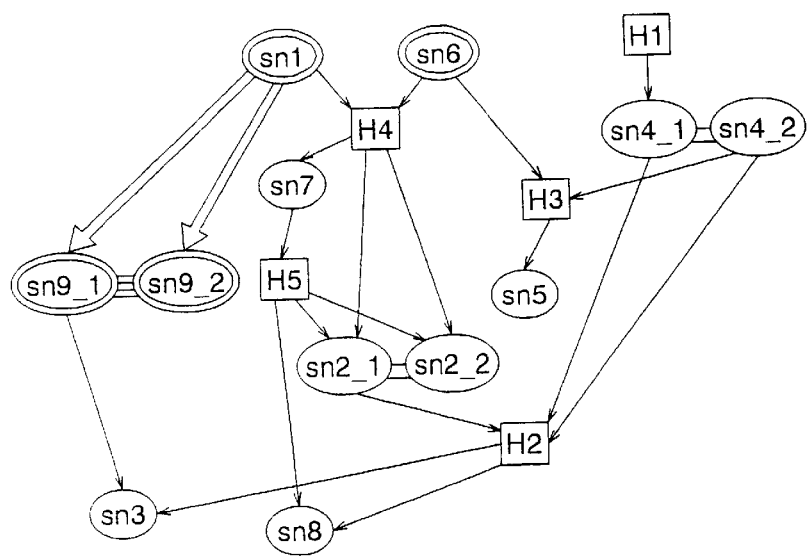

At step S306, a prohibition constraint subgraph G* is obtained as a solid-line portion in FIG. 43B.

At step S307, a set N* of subnets as a subject of the assignment process becomes such that N*={sn1, sn6, sn9_1, sn9_2}.

Figure 44A:
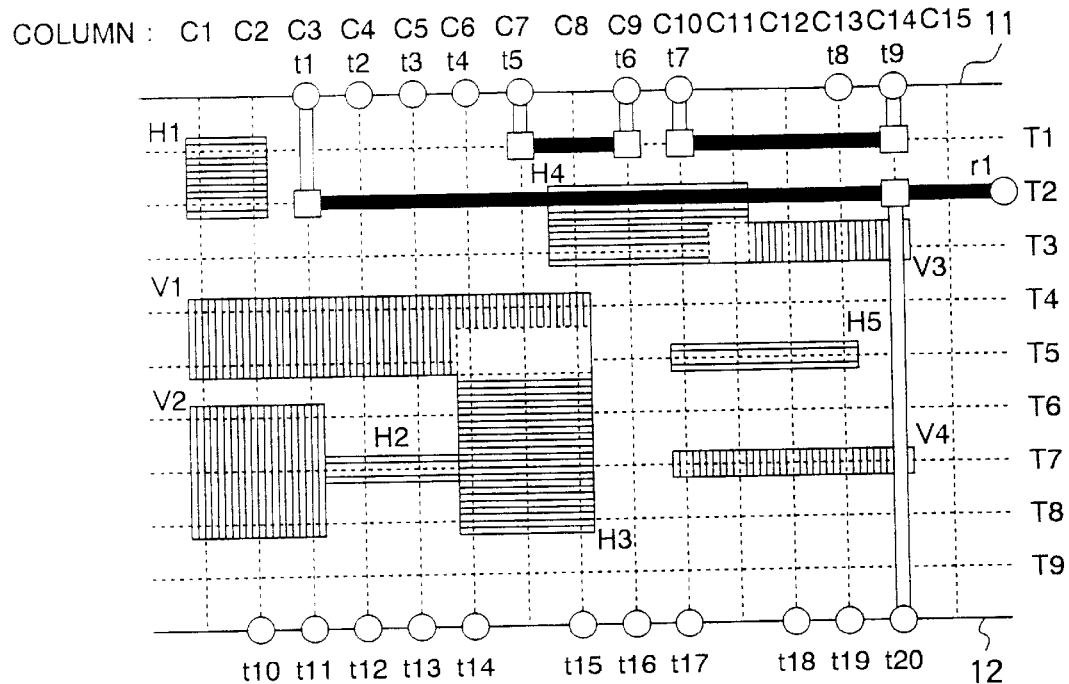

At step S308, trunks of the subnets of N* are assigned to tracks. FIG. 44A shows a result of the track assignment. Since trunks have been assigned to all subnets of N*, Rnot is an empty set.

At step S309, the net list N is updated to a new net list N={sn2_1, sn2_2, sn3, sn4_1, sn4_2, sn5, sn7, sn8}.

At step S310, since Rnot is an empty set and N is not an empty set, steps S305–S310 are repeated.

Figure 44B:
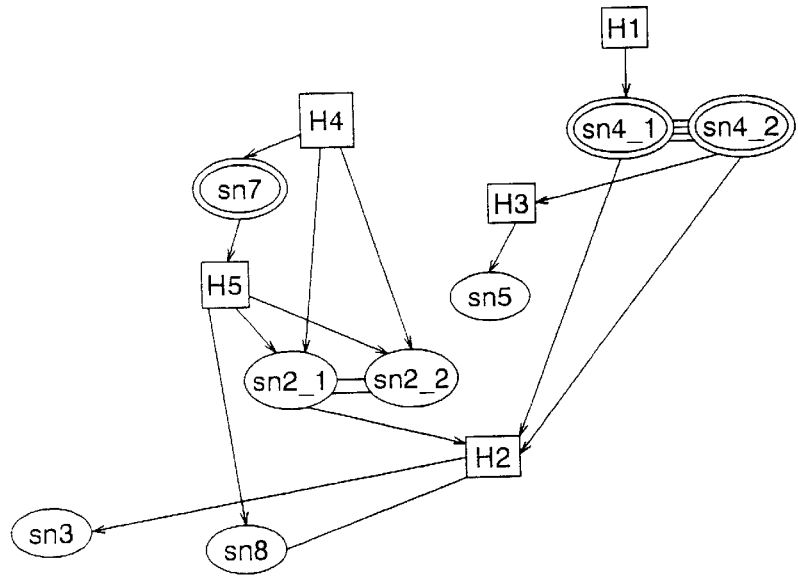
Figure 45A:
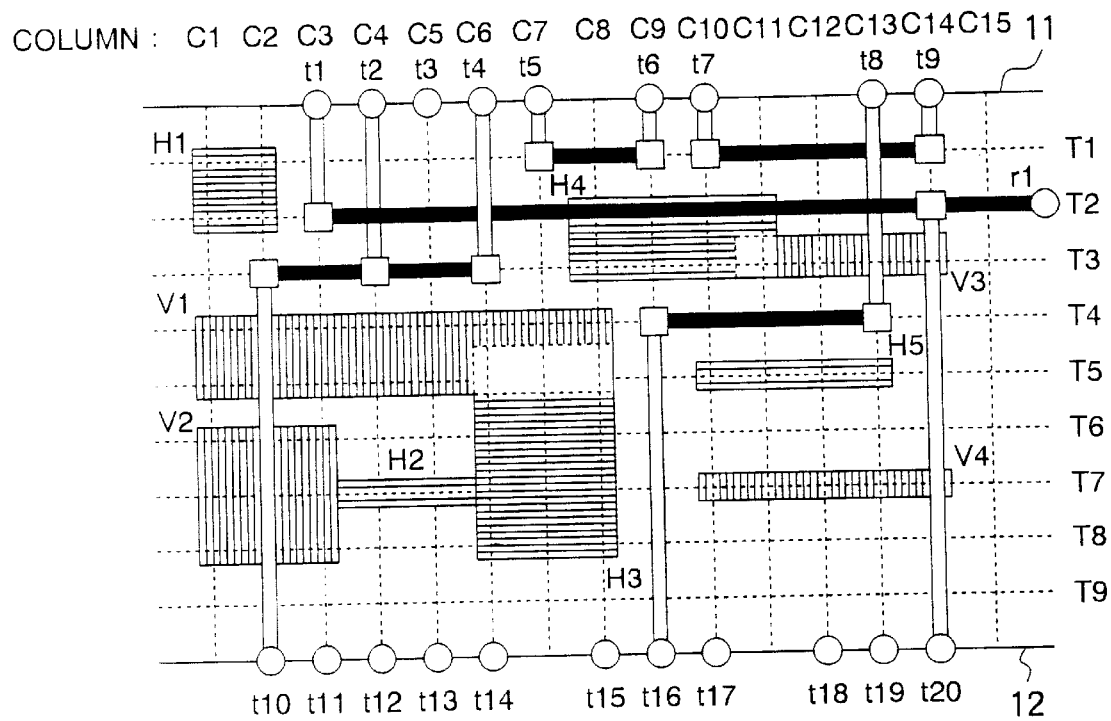
Figure 45B:
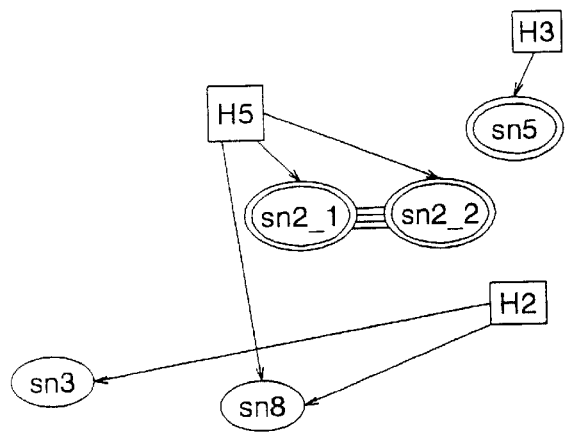
Figure 46A:
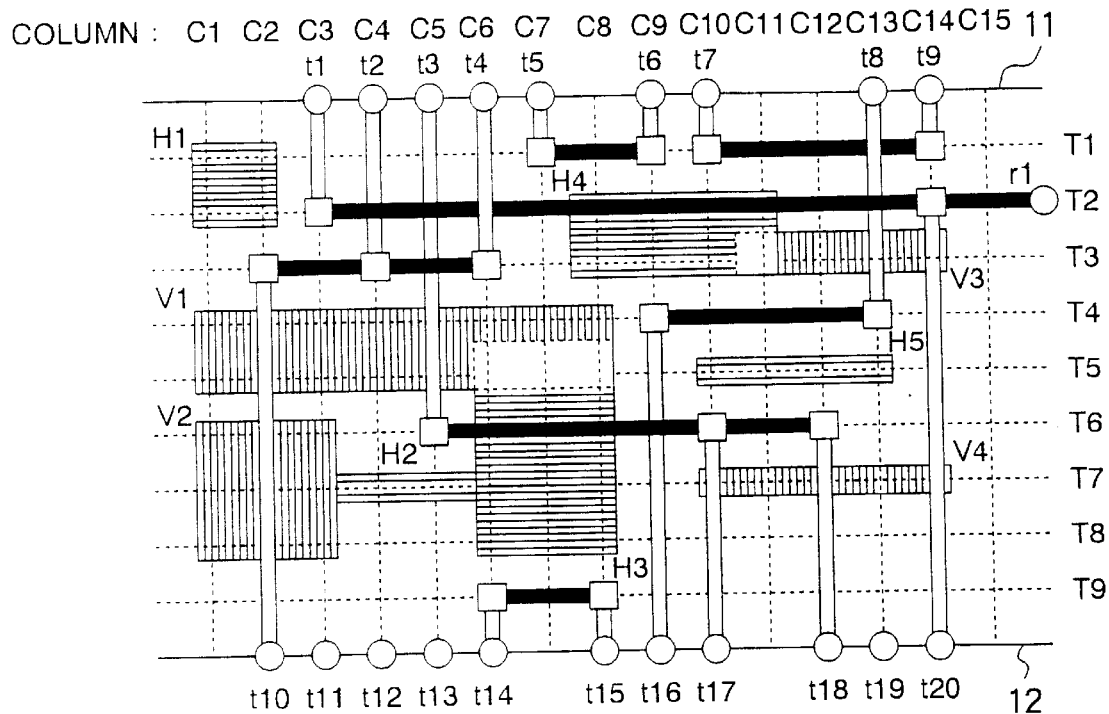
Figure 46B:
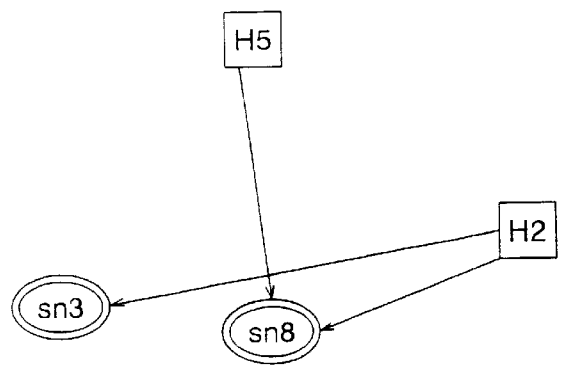
Figure 47:
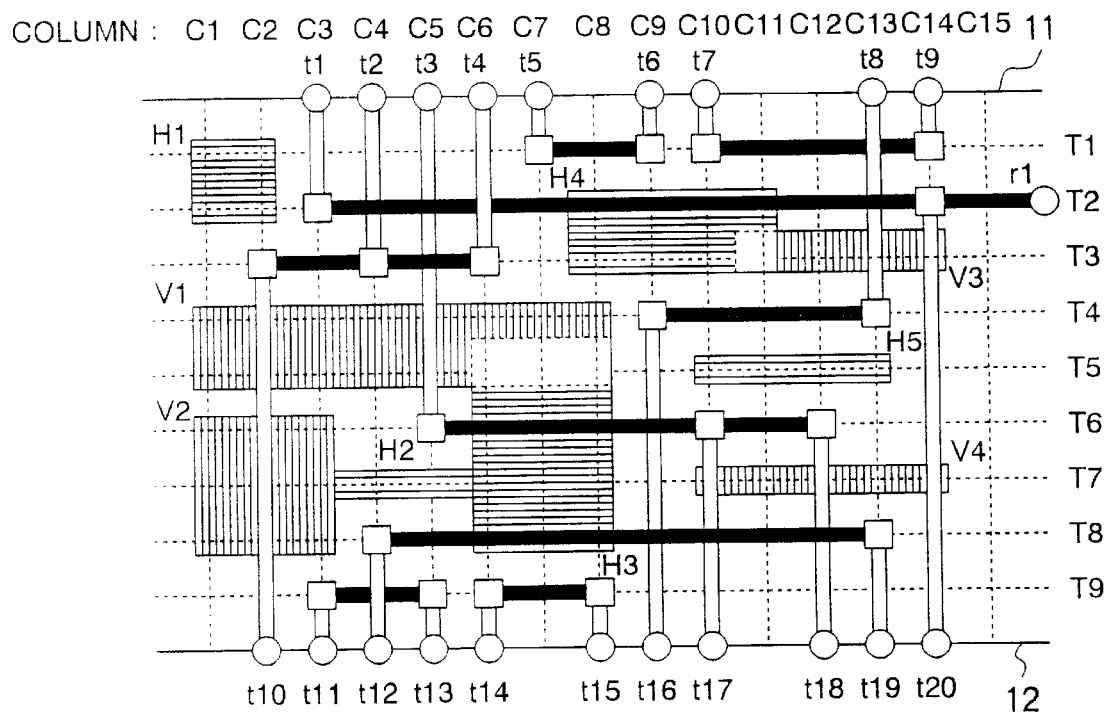
FIG. 47 illustrate the fourth example of the first embodiment of the invention and shows a result of track assignment in a fourth processing loop.

FIGS. 44B, 45B, and 46B show prohibition constraint graphs generated in steps S305–S310 of the second to fourth loops, respectively. Partial prohibition constraint graphs G* are indicated by solid lines. FIGS. 45A, 46A, and 47 show results of the track assignment. The net list N becomes an empty set at step S309 of the fourth loop. Since no free track exists at step S310, the routing process is finished.

(Example 5 of Embodiment 1)

The operation of a fifth example of the first embodiment of the invention will be described below in detail.

Figure 48A:
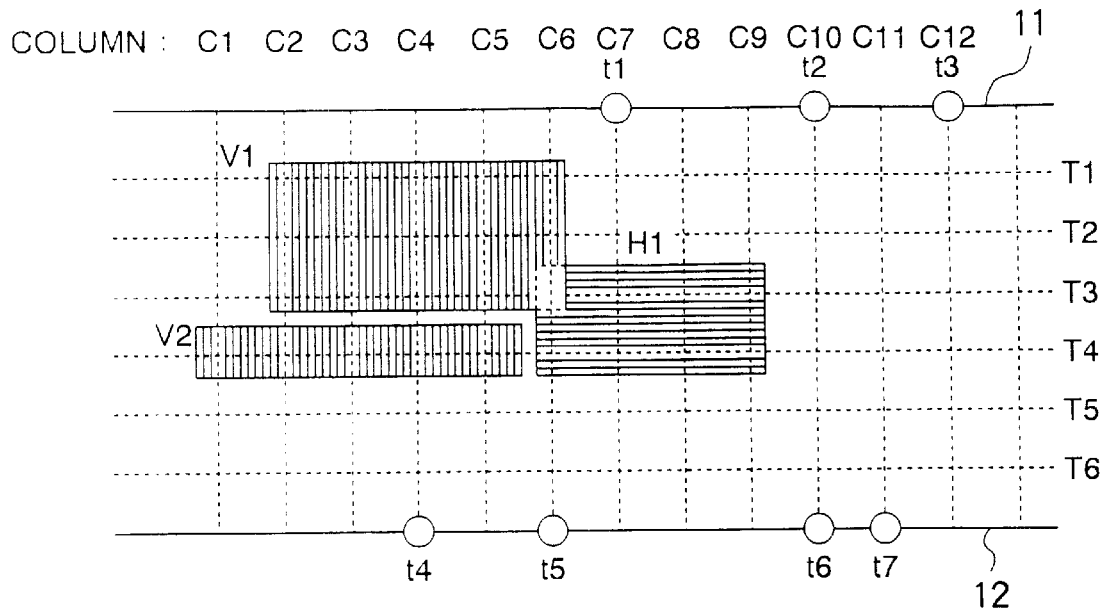

A consideration will be given to the channel routing region shown in FIG. 48A. A net list N={n1, n2, n3}, where n1={t1, t3, t5}, n2={t2, t7}, and n3={t4, t6}. H1 denotes a vertical passage prohibition figure and V1 and V2 denote horizontal passage prohibition figures. Tracks are denoted by T1–T6 downward. Columns are denoted by C1–C12 rightward from the left end of the channel routing region.

First, at step S301, the above channel routing region is set. At step S302, the nets are divided into subnets in the following manner. Net n1 is divided into subnets sn1_1={t5, t1} and sn1_2={t1, t3}. Nets n2 and t3 themselves become subnets sn2 and sn3. Thus, a new net list N={sn1_1, sn1_2, sn2, sn3}.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. The sets AT(sn) of assignable tracks of the respective subnets sn are such that AT(sn1_1)=φ, AT(sn_

2)={T1, T2}, AT(sn2 )=(T1, T2, T3, T4, T5, T6}, and AT(sn3 )={T5, T6}.

At step S304, since AT(sn1__1)=φ, to bypass the collective routing prohibition figure for the original net n1 of subnet sn1, net n1 is again divided into the following three subnets: sn1__1={t1, t3}, sn1*__a={t*, t1}, and sn1*__b={t*, t5}. A consideration will be given to a case where the values of the coefficients α, β, γ, and δ of the evaluation function F0 are set such that α=1 and β=γ=δ=0 and column C10 is selected which maximizes the value of F0.

For subnets sn1__1, sn1*__a, and sn1*__b, AT(sn1__1)={T1, T2}, AT(sn1*__a)={T1, T2} and AT(sn1*__b)={T5, T6}.

Figure 48B:
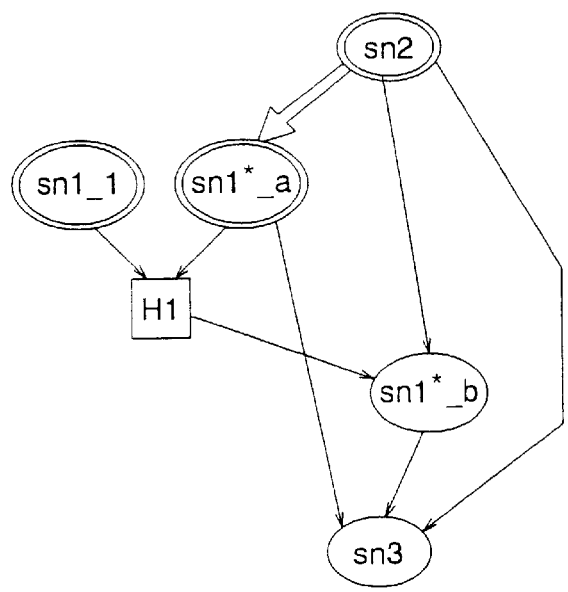

At step S305, a prohibition constraint graph G is generated as shown in FIG. 48B. At step S306, a prohibition constraint subgraph G* is obtained as a solid-line portion in FIG. 48B.

At step S307, a set N* of subnets as a subject of the assignment process becomes such that N*={sn1__1, sn1*__a, sn2}.

Figure 49A:
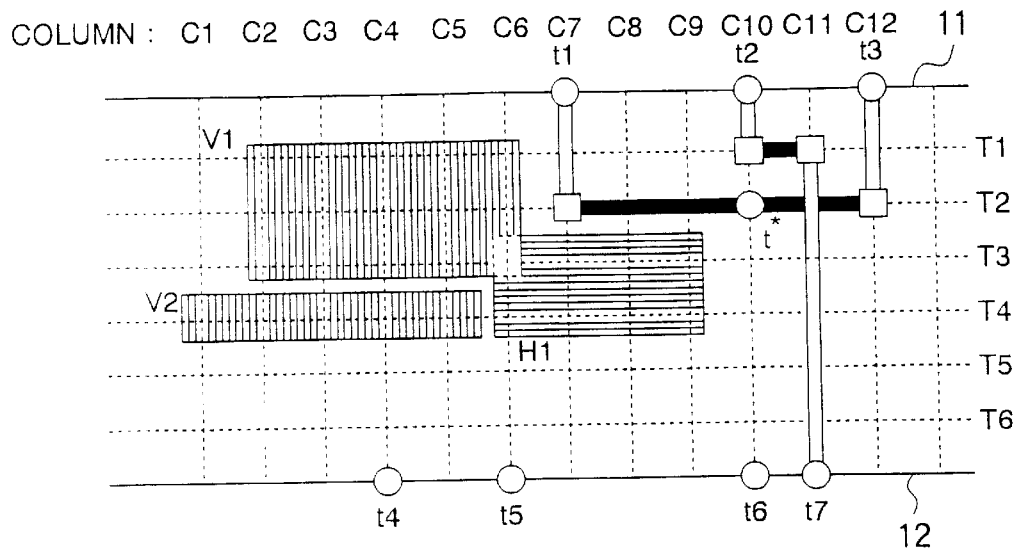

At step S308, trunks of the subnets of N* are assigned to tracks. FIG. 49A shows a result of the track assignment. Trunks of subnets sn1__1 and sn1*__a are assigned to the same track T2.

Figure 49B:
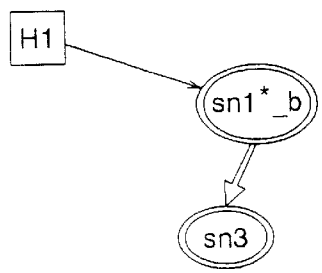
Figure 49C:
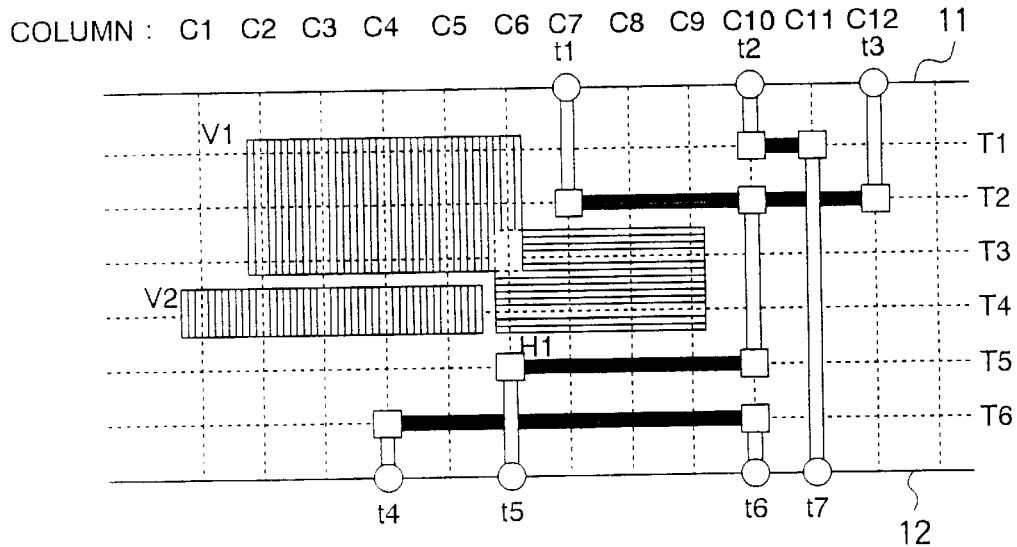

FIG. 49B shows a prohibition constraint graph G generated in steps S305–S310 of the second loop. A prohibition constraint subgraph G* is a solid-line portion in FIG. 49B. FIG. 49C shows a result of the track assignment. The net list N becomes an empty set at step S309 of this loop. Since no free track exists at step S310, the routing process is finished.

(2) Embodiment 2 of the Invention (2-1) Configuration

The configuration of the second embodiment of the invention will be described below in detail with reference to the drawings.

Figure 12:
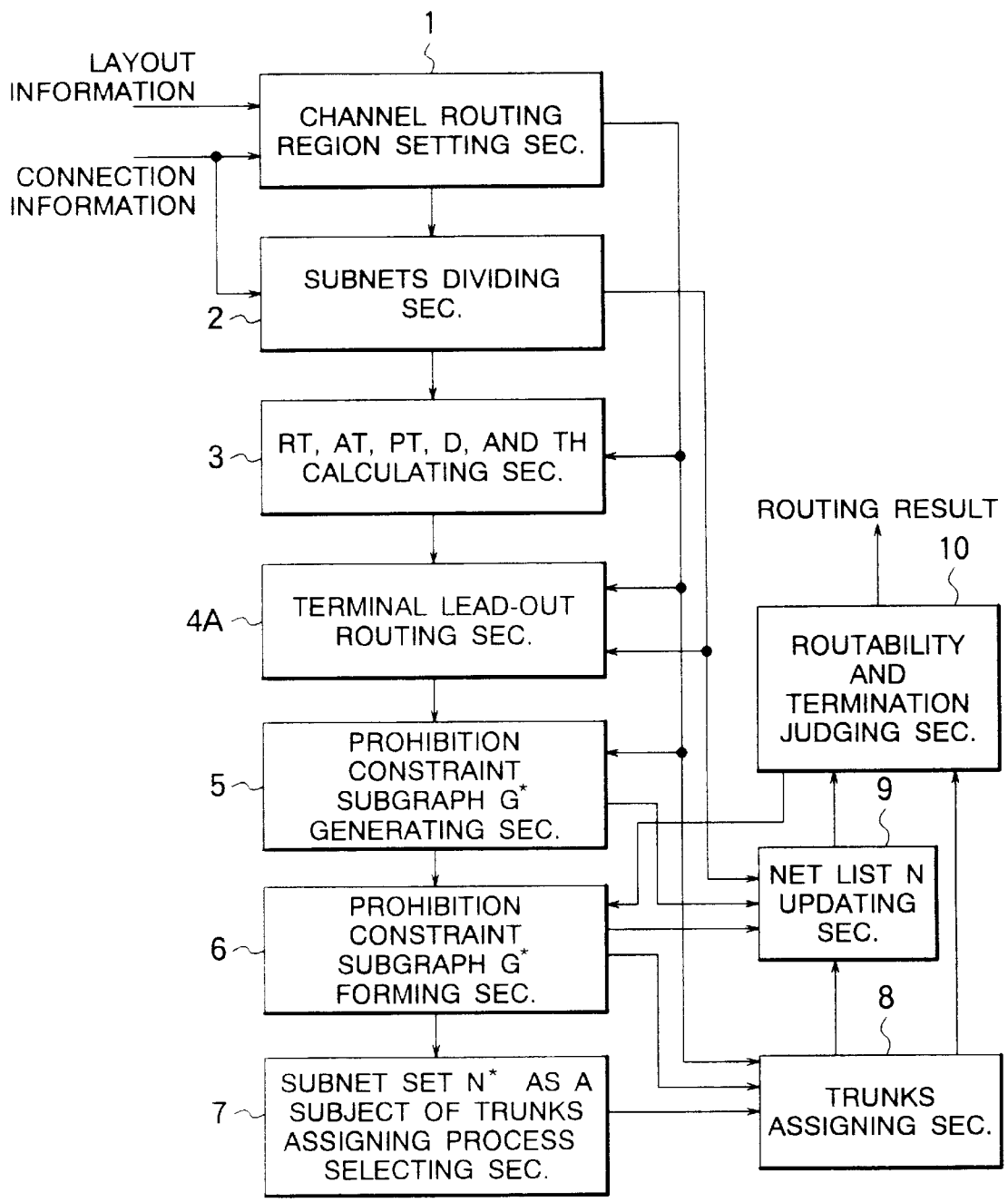
FIG. 12 is a block diagram showing the configuration of a second embodiment of the invention.

Referring to FIG. 12, the second embodiment is different from the first embodiment shown in FIG. 9 in that the vertical passage prohibition figure avoiding section 4 is replaced by a terminal lead-out routing section 4A.

To avoid a vertical passage prohibition figure, the terminal lead-out routing section 4A draws an interconnection from a terminal existing in the range of the prohibition figure to a position that enables avoidance of the prohibition figure and sets a new terminal there.

(2-2) Operation

The operation of the second embodiment of the invention will be described below in detail with reference to the drawings.

Figure 13:
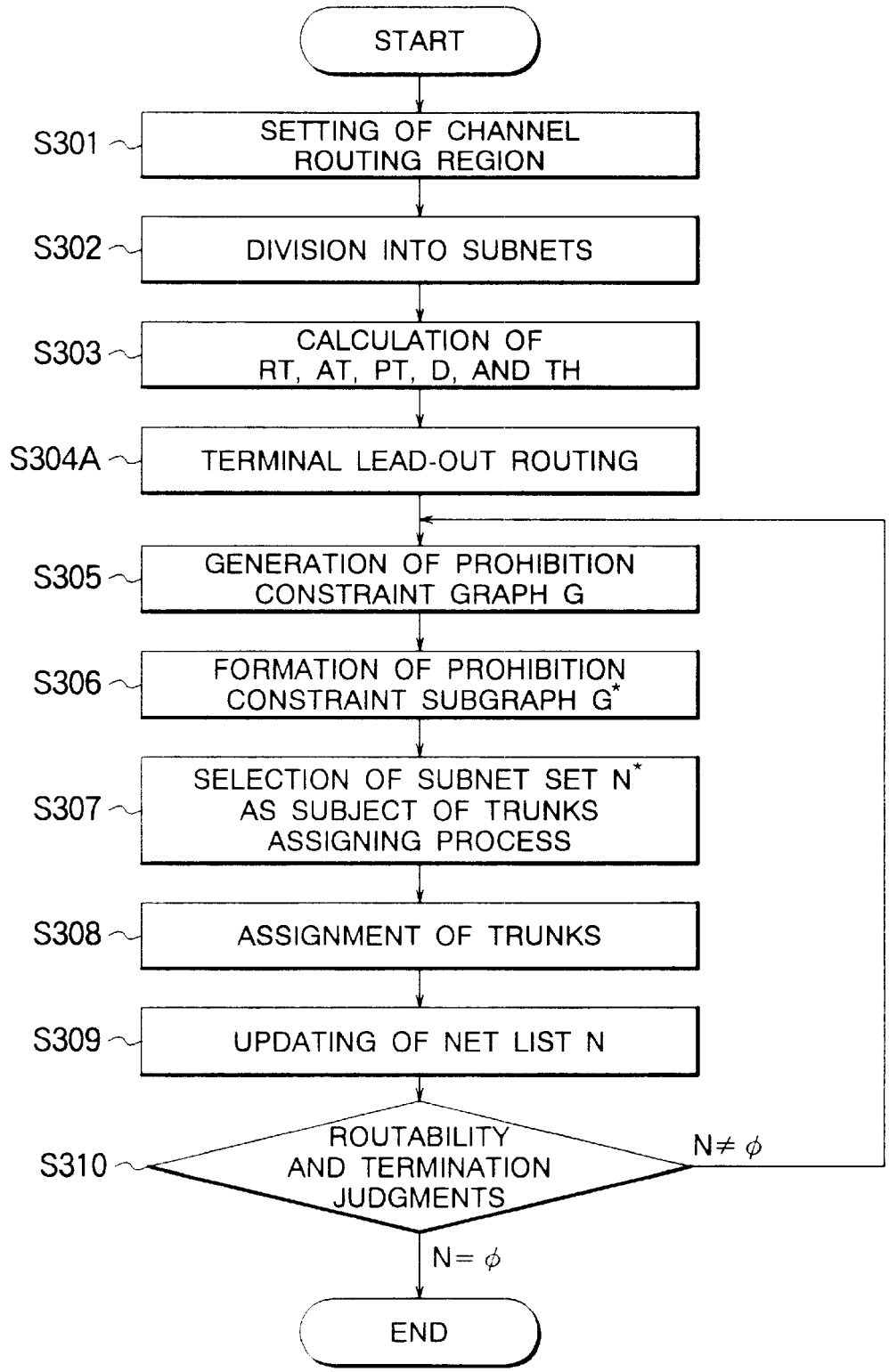
FIG. 13 is a flowchart showing the operation of the second embodiment of the invention.

Steps S301–S303 and S305–S310 of the second embodiment shown in FIG. 13 are the same as in the first embodiment, and hence descriptions therefor will be omitted.

S304A (Terminal lead-out routing): Prior to routing of other nets, routing is performed on a subnet n whose set AT(n) of assignable tracks is an empty set by an unrouted portion processing method such as a maze running router or a line search router from terminal t located within the range of an obstructing prohibition figure to a point p outside that range. Based on a wiring layer used, a resulting route is registered as a horizontal passage prohibition figure and a vertical passage prohibition figure. Terminal t* is provided at point p. For example, point p is set at an intersection of a column closest to the prohibition figure and the thus-obtained route. A subnet obtained by deleting terminal t from subnet n and instead adding the new terminal t* to it is set as a new subnet n. A set AT of assignable tracks are recalculated for each subnet.

In the case of bypassing a routing prohibition figure for a subnet including part of existing interconnections, there may occur a redundant route depending on the position of the new terminal t*. In such a case, a redundant route and a corresponding routing prohibition figure are deleted in setting the new terminal t*.

(2-3) Advantages

Advantages of the second embodiment of the invention will be described below.

In the second embodiment of the invention, to avoid a vertical passage prohibition figure, a lead-out interconnection is drawn in advance from a terminal that is located within the range of the prohibition figure. Therefore, the second embodiment can easily accommodate, without complicating an ensuing routing process, even a case where it is difficult to determine a route due to a circumstance relating to layout positions of routing prohibition figures.

(Example 1 of Embodiment 2)

The operation of a first example of the second embodiment of the invention will be described below in detail. In particular, step S304 A which is different from the corresponding step in the first embodiment will be described mainly.

Figure 50A:
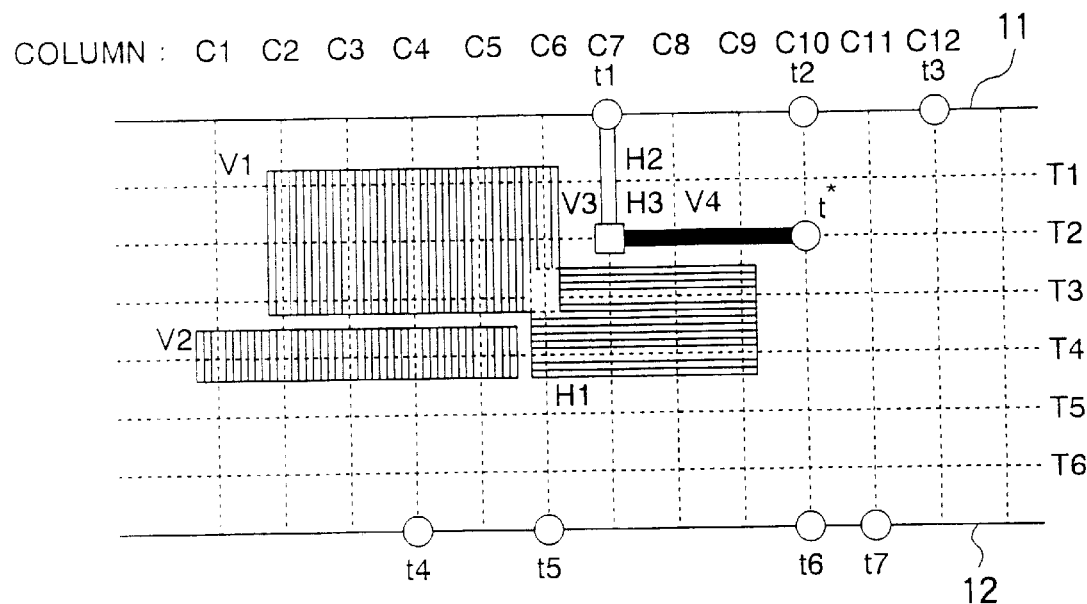

A consideration will be given to the channel routing region shown in FIG. 49A. As described above in connection with the first embodiment, AT(sn1__1) of subnet sn1__1={t5, t1} is an empty set. In this example, as shown in FIG. 50A, an interconnection is drawn from terminal t1 which is closer to the end of the obstructing routing prohibition figure to column C10. A new terminal t* is set at the end point of the lead-out interconnection. The lead-out interconnection is registered as routing prohibition figures. Subnets sn1__1 and sn1__2 are respectively changed to sn1__1={t5, t*} and sn1__2={t*, t3}, and sets AT of assignable tracks are recalculated, to obtain AT(sn1__1)={T5, T6}, AT(sn1__2)={T1, T2, T3, T4, T5, T6}, AT(sn2 )={T1}, and AT(sn3)={T5, T6}.

Figure 50B:
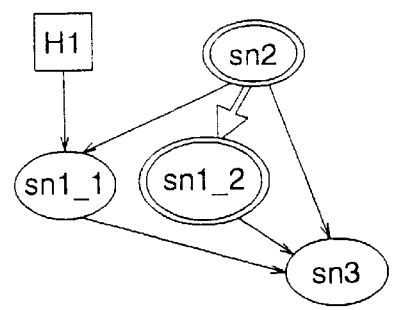

At step S305, a prohibition constraint graph G is generated as shown in FIG. 50B. At step S306, a prohibition constraint subgraph G* is obtained as a solid-line portion in FIG. 50B.

Figure 51A:
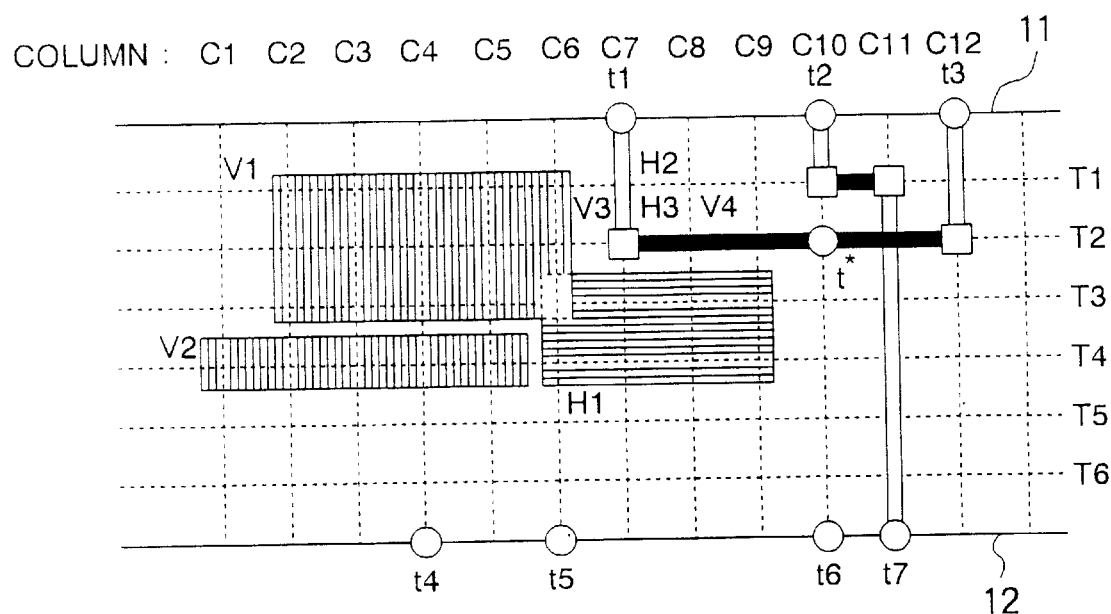

At step S307, a set N* as a subject of the assignment process becomes such that N*={sn1__2, sn2}. At step S308, trunks of the subnets of N* are assigned to tracks as shown in FIG. 51A.

Figure 51B:
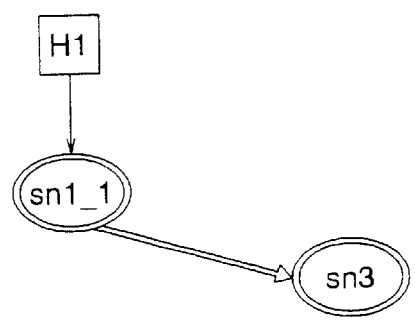

FIG. 51B shows a prohibition constraint graph G generated in steps S305–S310 of the second loop. A prohibition constraint subgraph G* is a solid-line portion in FIG. 51B. FIG. 49C shows a result of the track assignment. The net list N becomes an empty set at step S309 of this loop. Since no free track exists at step S310, the routing process is finished.

(3) Embodiment 3 of the Invention (3-1) Configuration

The configuration of a third embodiment of the invention will be described below in detail with reference to the drawings.

Figure 14:
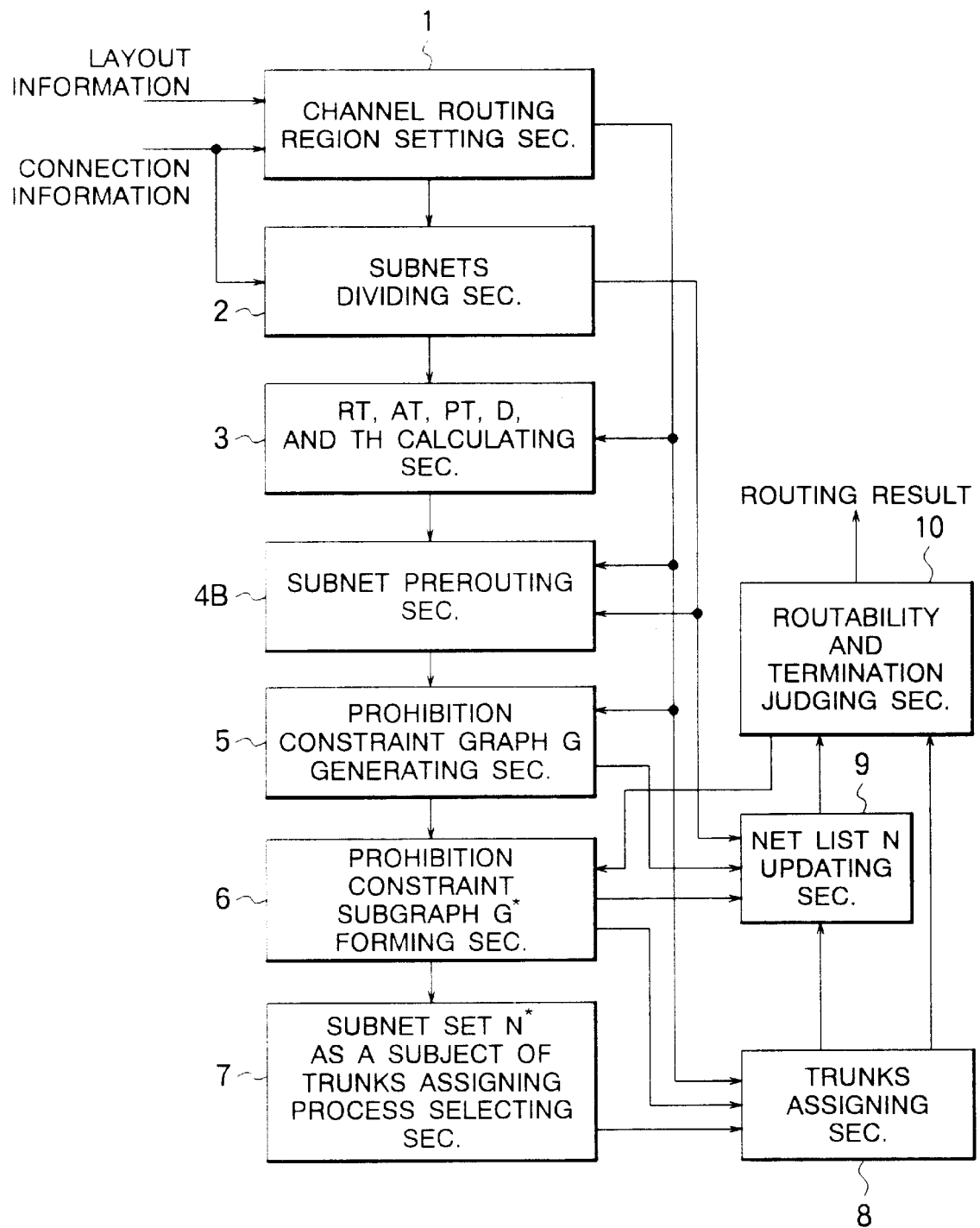
FIG. 14 is a block diagram showing the configuration of a third embodiment of the invention.

Referring to FIG. 14, the third embodiment is different from the first embodiment shown in FIG. 9 in that the vertical passage prohibition figure avoiding section 4 is replaced by a subnet prerouting section 4 B.

To avoid a vertical passage prohibition figure, the subnet prerouting section 4B routes a subnet having a terminal that is located within the range of the prohibition figure and sets a new terminal for a connection to another terminal belonging to the original net.

(3-2) Operation

The operation of the third embodiment of the invention will be described below in detail with reference to the drawings.

Figure 15:
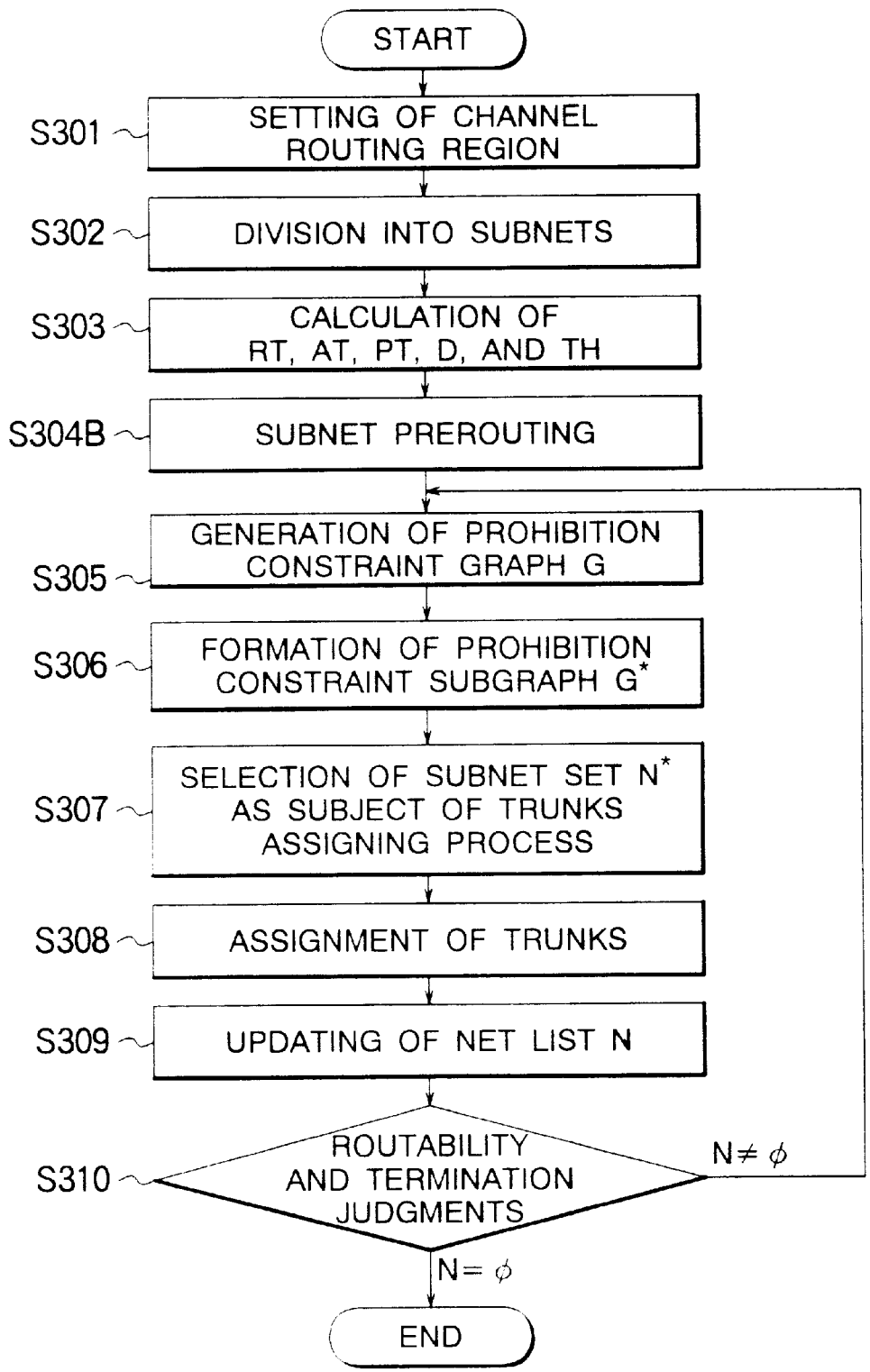
FIG. 15 is a flowchart showing the operation of the third embodiment of the invention.

Steps S301–S303 and S305–S310 of the third embodiment shown in FIG. 15 are the same as in the first and second embodiments, and hence descriptions therefor will be omitted.

S304B (subnet prerouting): Prior to routing of the other nets, routing is performed on a subnet n whose set AT(n) of assignable tracks is an empty set by an unrouted portion processing method such as a maze router or a line search router. Based on a wiring layer used, a resulting route is registered as a horizontal passage prohibition figure and a vertical passage prohibition figure. Where subnet n is one obtained by dividing a net (denoted by "ont") having three or more terminals, it is necessary to set a terminal for a connection to another terminal belonging to the original net ont. Terminal t* is provided at point p that is located on the route of subnet n and outside an obstructing prohibition figure. For example, point p is set at an intersection of a column closest to the prohibition figure and the route. A subnet obtained by deleting the terminal of subnet n from the original net ont and instead adding the new terminal t* to it is set as a new net ont. The new net ont is divided into subnets. A set AT of assignable tracks are recalculated for each subnet.

In the case of bypassing a routing prohibition figure for a subnet including part of existing interconnections, there may occur a redundant route depending on the position of an imaginary terminal t*. In such a case, a redundant route and a corresponding routing prohibition figure are deleted in setting an imaginary terminal t*.

(3-3) Advantages

Advantages of the third embodiment of the invention will be described below.

In the third embodiment of the invention, to avoid a vertical passage prohibition figure, a subnet to be connected to a terminal that is located within the range of the prohibition figure is routed in advance. Therefore, such a subnet can be eliminated from the subject of an ensuing routing process. Thus, the third embodiment can easily accommodate, without complicating the routing process, even a case where there exists a subnet whose route is difficult to determine due to a circumstance relating to layout positions of routing prohibition figures. Further, since a subnet to be connected to a terminal that is located within the range of a prohibition figure is routed before other nets, it is possible to set a route between terminals of the subnet which route satisfies a timing-related constraint with preference over routes of other nets.

(Example 1 of Embodiment 3)

The operation a first example of the third embodiment of the invention will be described below in detail. In particular, step S304B which is different from the corresponding step in the first embodiment will be described mainly.

A consideration will be given to the channel routing region shown in FIG. 49A. As described above in connection with the first embodiment, AT(sn1_1) of subnet sn1_1={t5, t1} is an empty set.

Figure 52A:
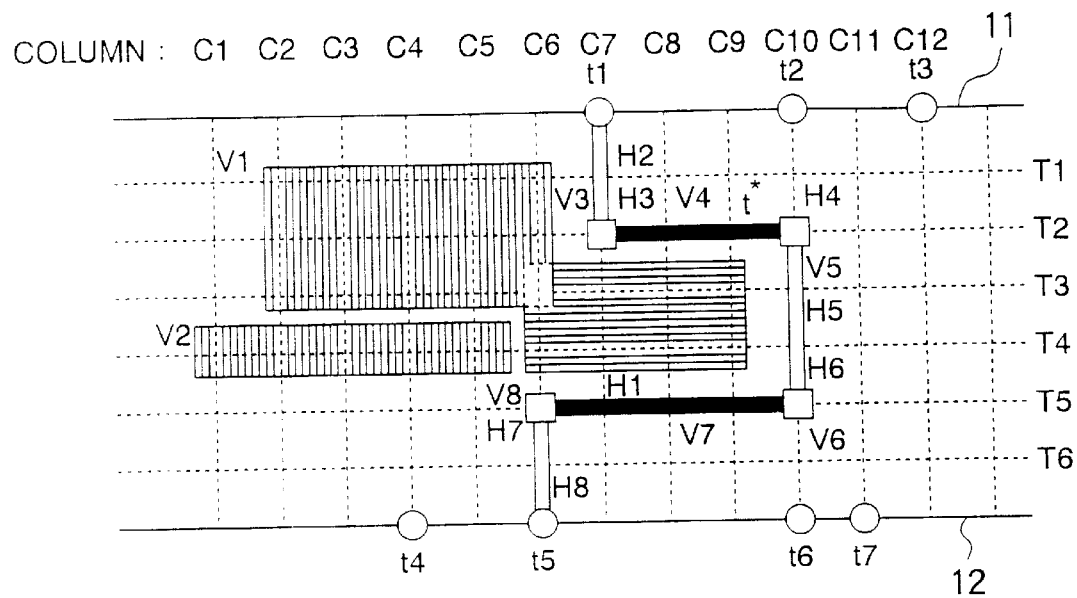

At step S304B, as shown in FIG. 52A, a route is set so as to connect terminals t1 and t5 of subnet sn1_1. This example is directed to a case of setting a route by using a track and a column closest to the obstructing prohibition figure. A new terminal t* is set on the side of terminal t1 which is closer to the end of the obstructing routing prohibition figure at an intersection of the route and column C10 which is outside and closest to the prohibition figure. The route of subnet sn1_1 is registered as routing prohibition figures. Subnet sn1_1 is deleted from the net list and subnet sn1_2 is changed to sn1_2={t*, t3}. Sets AT of assignable tracks are recalculated, to obtain AT(sn1_2)={T1, T2, T3, T4, T5, T6}, AT(sn2)={T1}, and AT(sn3)={T6}.

Figure 52B:
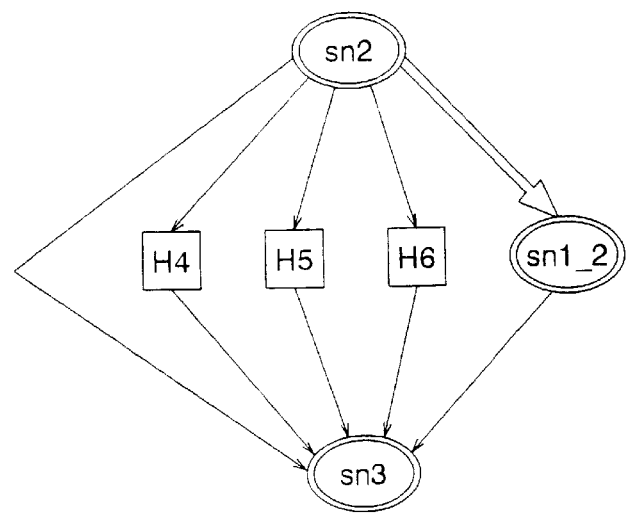

At step S305, a prohibition constraint graph G is generated as shown in FIG. 52B. Since subnets sn1_1 and sn1_2 are ones obtained by dividing the same net n1, a constraint on subnet sn1_2 is considered while disregarding routing prohibition figures H2–H8 and V3–V8 (see FIG. 52A) corresponding to the route of subnet sn1_1.

At step S306, a prohibition constraint subgraph G* is obtained as a solid-line portion in FIG. 52B.

Figure 53A:
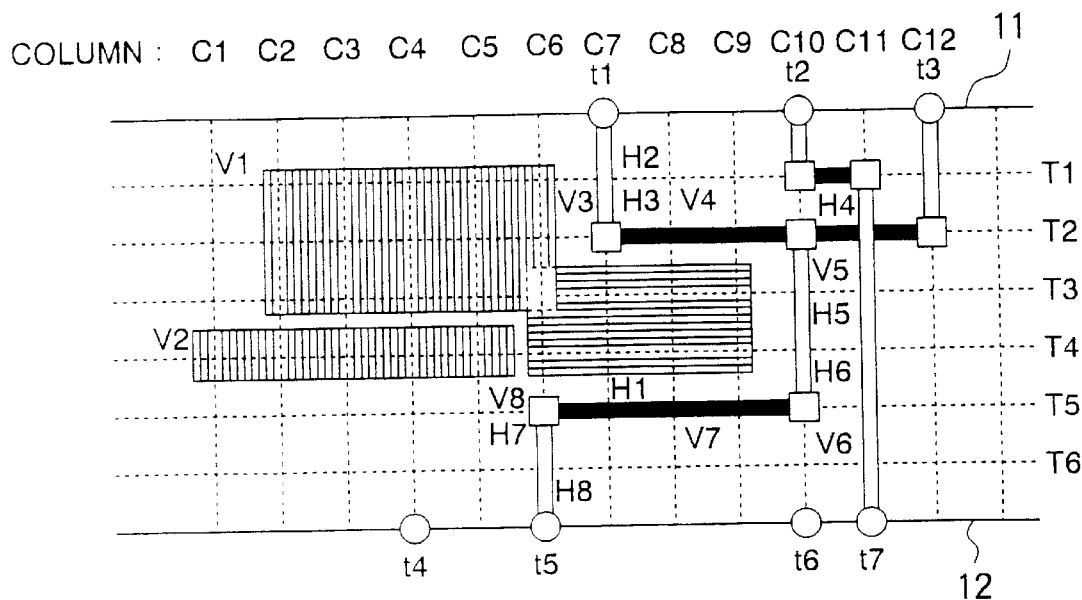

At step S307, a set N* as a subject of the assignment process becomes such that N*={sn1_2, sn2}. At step S308, trunks of the subnets of N* are assigned to tracks as shown in FIG. 53A.

Figure 53B:
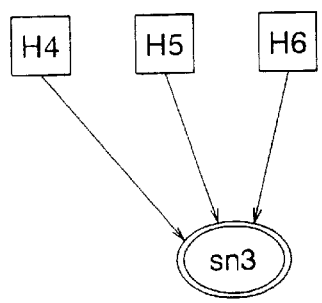

A prohibition constraint subgraph indicated by a solid line in a prohibition constraint graph of FIG. 53B is obtained in steps S305–S310 of the second loop. Thus, a set N*={sn3} is obtained as a subject of the track assignment. A trunk of subnet sn3 is assigned to track T6 at step S308, and the routing process is finished. FIG. 49C shows a routing result.

(Example 2 of Embodiment 3)

The operation a second example of the third embodiment of the invention will be described below in detail. In particular, step S304B which is different from the corresponding step in the first embodiment will be described mainly.

Figure 54A:
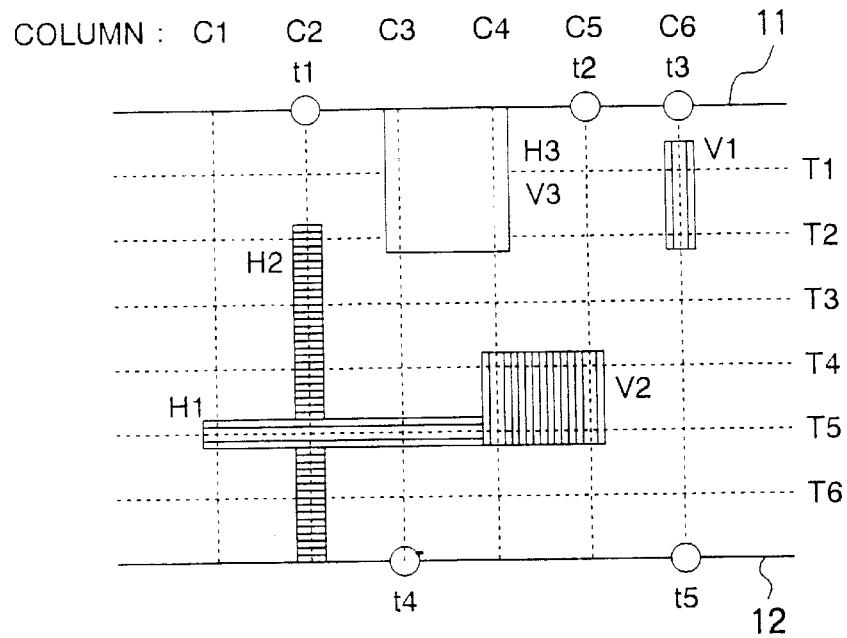

A consideration will be given to a channel routing region shown in FIG. 54A. A net list N={n1, n2}, where n1={t1, t3, t4} and n2={t2, t5}. Net n1 is divided into subnets sn1_1={t1, t4} and sn1_2={t4, t3}. Net n2 itself becomes subnet sn2={t2, t5}. Since routing of subnet sn1_1 is obstructed by the collective routing prohibition figure, AT(sn1_1) is an empty set.

Figure 54B:
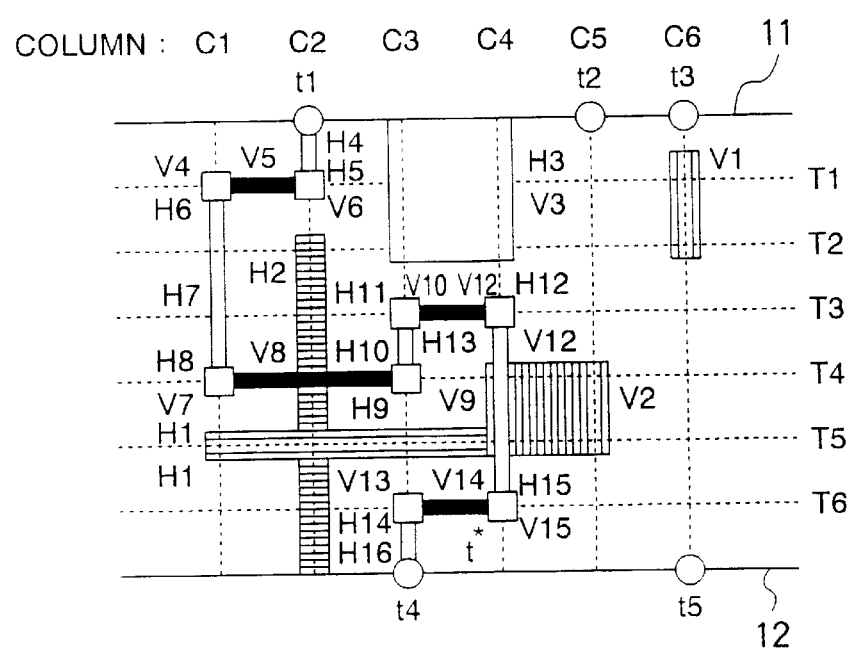

At step S304B, as shown in FIG. 54B, a route is set so as to connect terminals t1 and t4 of subnet sn1_1. In this example, since the routing prohibition figures are arranged in a complex manner, it is expected that the process of bypassing routing prohibition figures through subnet division for bypass routing will be cumbersome. The ensuing steps can be made more efficient by determining a bypass route in advance by using, for instance, a maze router prior to routing of other subnets, as is done in this step.

A new terminal t* is set on the side of terminal t4 which is closer to the end of the obstructing routing prohibition figure at an intersection of the thus-determined route of subnet sn1_1 and column C4 which is closest to terminal t3. The route of subnet sn1_1 is registered as routing prohibition figures. Subnet sn1_1 is deleted from the net list and subnet sn1_2 is changed to sn1_2={t*, t3}. Sets AT of assignable tracks are recalculated, to obtain AT(sn1_2)={T1, T2} and AT(sn2)={T3, T6}.

Figure 55A:
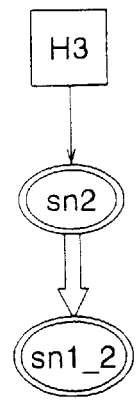

At step S305, a prohibition constraint graph G is generated as shown in FIG. 55A. In considering a constraint on subnet sn1_2, routing prohibition figures H4–H16 and V4–V15 (see FIG. 54B) corresponding to the route of subnet sn1_1 are disregarded. At step S306, a prohibition constraint subgraph G* is obtained as a solid-line portion in FIG. 55A.

Figure 55B:
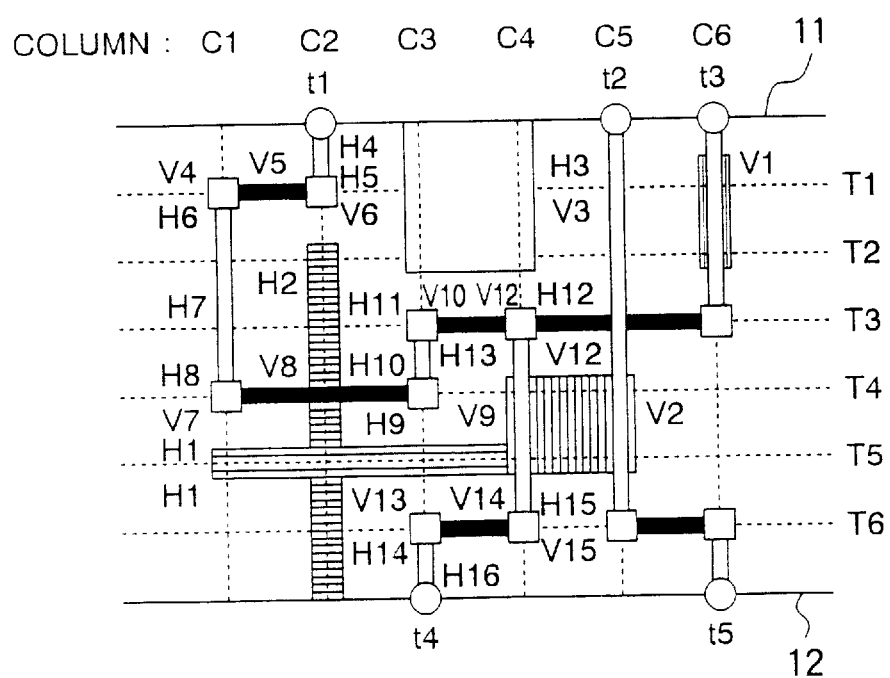

At step S307, a set N* as a subject of the assignment process becomes such that N*={sn1_2, sn2}. At step S308, trunks of the subnets of N* are assigned to tracks as shown in FIG. 55B. Since the net list N becomes an empty set, the routing process is finished.

(4) Embodiment 4 of the Invention (4-1) Configuration

The configuration of a fourth embodiment of the invention will be described below in detail with reference to the drawings.

Figure 16:
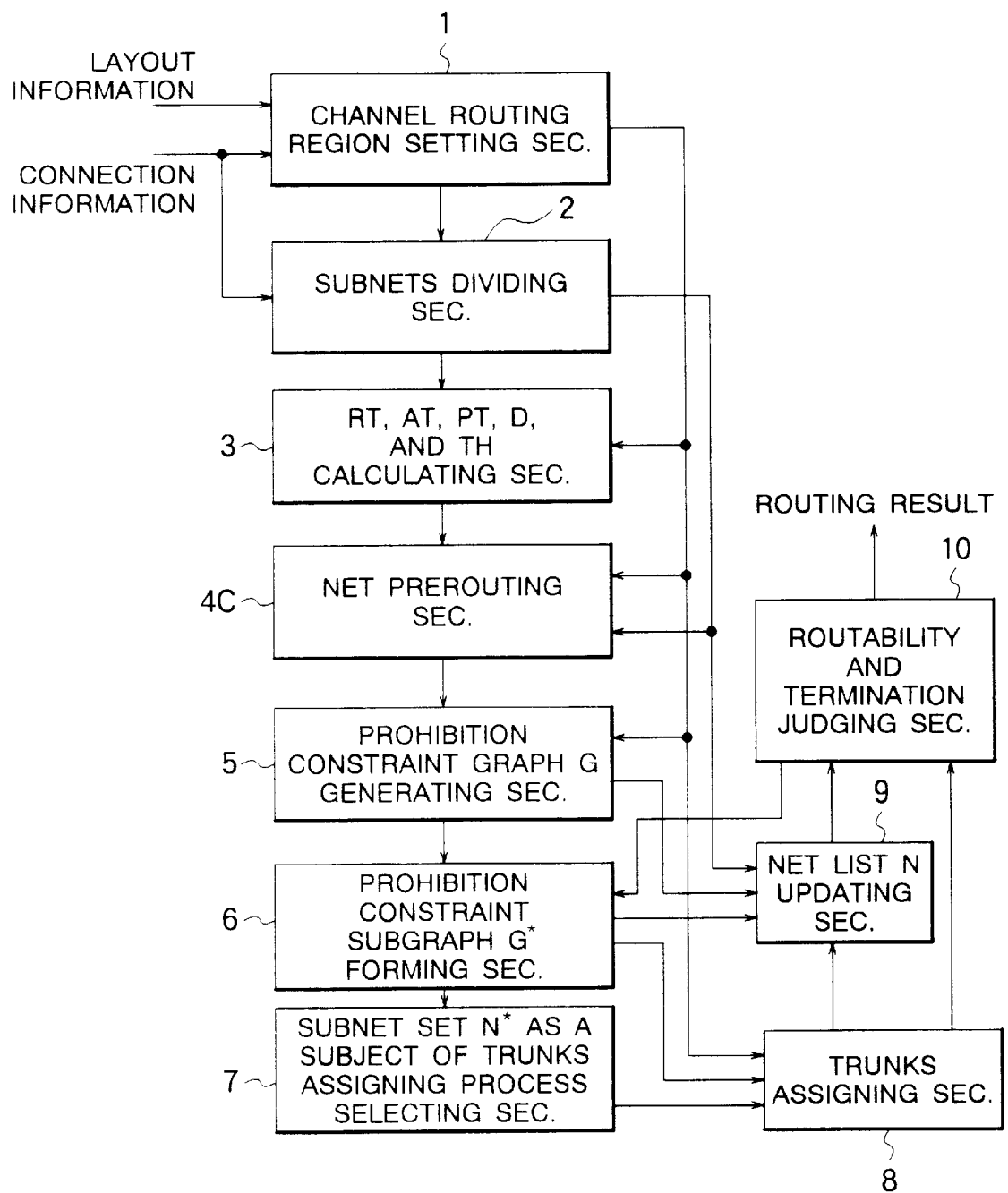
FIG. 16 is a block diagram showing the configuration of a fourth embodiment of the invention.

Referring to FIG. 16, the fourth embodiment is different from the first embodiment shown in FIG. 9 in that the vertical passage prohibition figure avoiding section 4 is replaced by a net prerouting section 4C.

To avoid a vertical passage prohibition figure, the net prerouting section 4C routes an original net of a subnet having a terminal that is located within the range of the prohibition figure.

(4-2) Operation

The operation of the fourth embodiment of the invention will be described below in detail with reference to the drawings.

Figure 17:
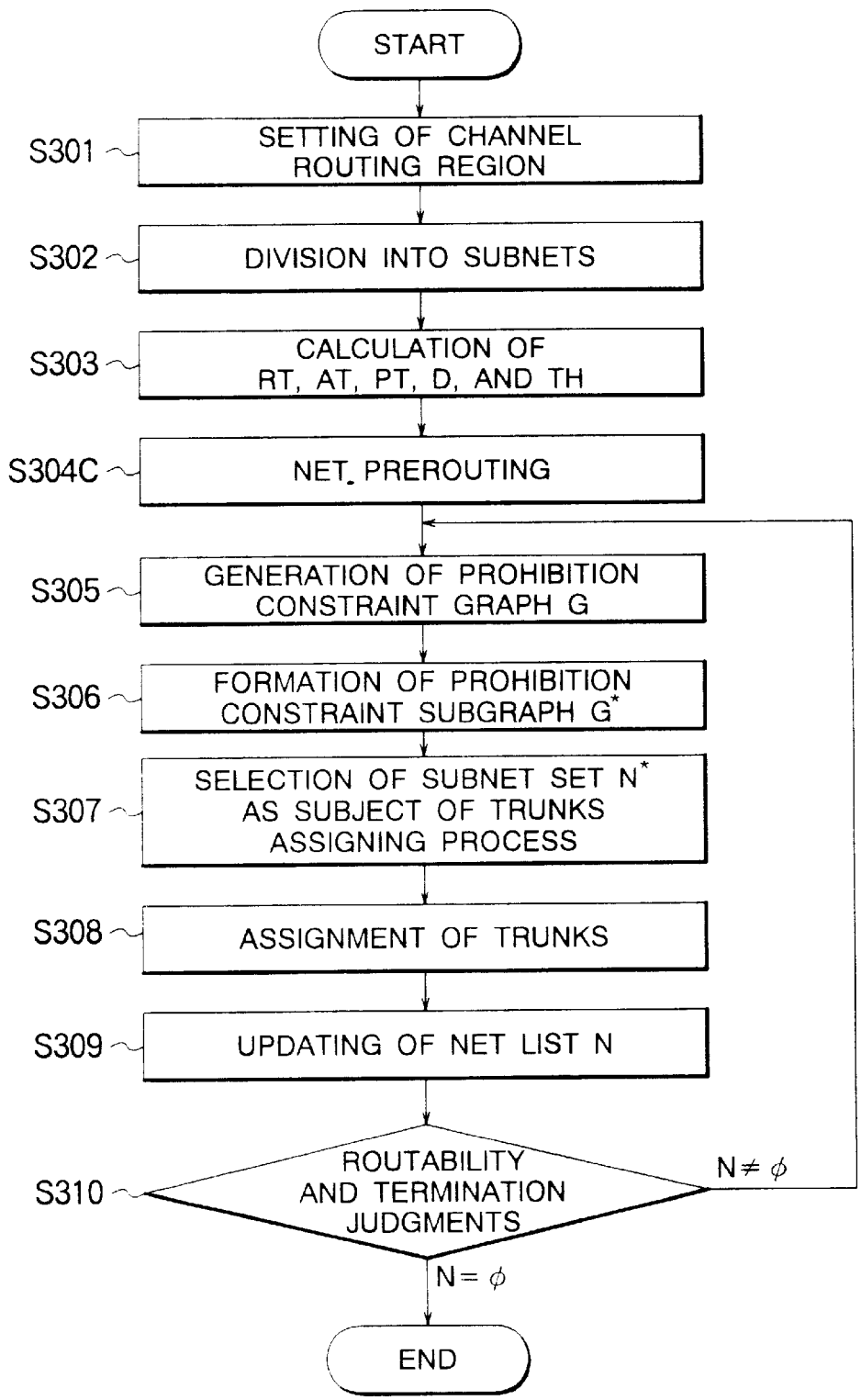
FIG. 17 is a flowchart showing the operation of the fourth embodiment of the invention.

Steps S301–S303 and S305–S310 of the fourth embodiment shown in FIG. 17 are the same as in the first to third embodiments, and hence descriptions therefor will be omitted.

S304C (net prerouting): Prior to routing of the other nets, routing is performed between all terminals belonging to an original net of a subnet n whose set AT(n) of assignable tracks is an empty set by an unrouted portion processing method such as a maze router or a line search router. Based on a wiring layer used, a resulting route is registered as a horizontal passage prohibition figure and a vertical passage prohibition figure. Subnets obtained by dividing the original net are deleted from a net list N. A set AT of assignable tracks are recalculated for each subnet.

In the case of bypassing a routing prohibition figure for a subnet including part of existing interconnections, there may occur a redundant route. In such a case, a redundant route and a corresponding routing prohibition figure are deleted in determining a route of a net.

(4-3) Advantages

Advantages of the fourth embodiment of the invention will be described below.

In the fourth embodiment of the invention, to avoid a vertical passage prohibition figure, the entire original net of a subnet to be connected to a terminal that is located within the range of the prohibition figure is routed in advance. Therefore, subnets of such a net can be eliminated from the subject of an ensuing routing process. Thus, the fourth embodiment can easily accommodate, without complicating the routing process, even a case where there exists a net whose route is difficult to determine due to a circumstance relating to layout positions of routing prohibition figures. Further, since a net to be connected to a terminal that is located within the range of a prohibition figure is routed before other nets, it is possible to set a route between terminals of the net which route satisfies a timing-related constraint with preference over routes of other nets.

(Example 1 of Embodiment 4)

The operation a first example of the fourth embodiment of the invention will be described below in detail. In particular, step S304C which is different from the corresponding step in the first embodiment will be described mainly.

A consideration will be given to the channel routing region shown in FIG. 48A. As described above in connection with the first embodiment, AT(sn1_1) of subnet sn1_1={t5, t1} is an empty set.

Figure 56A:
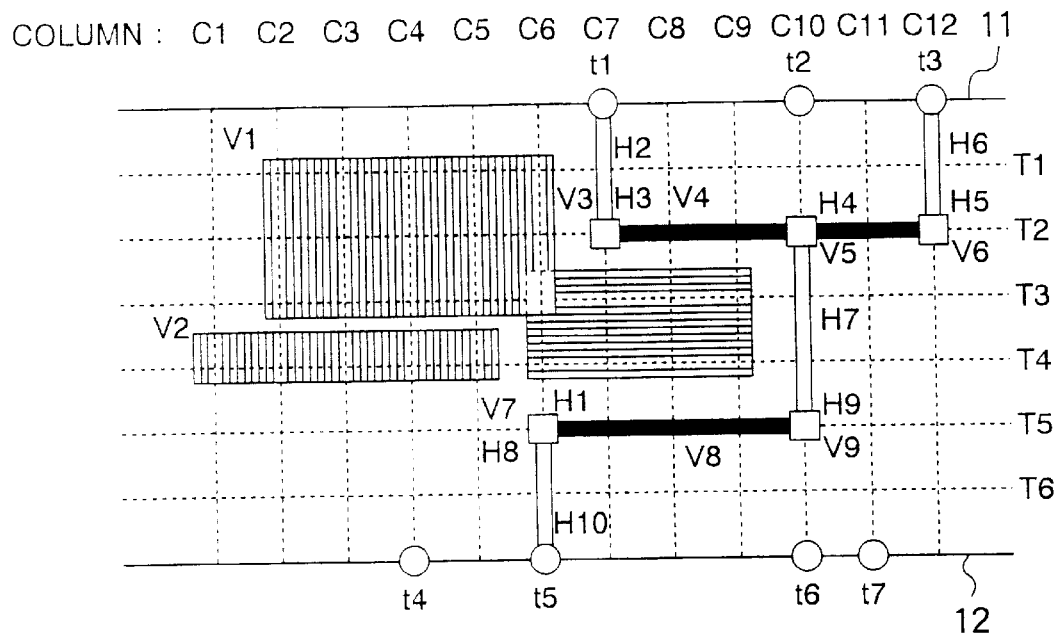

At step S304C, as shown in FIG. 56A, routing is performed on the original net n1={t1, t3, t5} of subnet sn1_1. The route of net n1 is registered as routing prohibition figures. Subnets sn1_1 and sn1_2 are deleted from the net list. Sets AT of assignable tracks are recalculated, to obtain AT(sn2)={T1} and AT(sn3)={T6}.

Figure 56B:
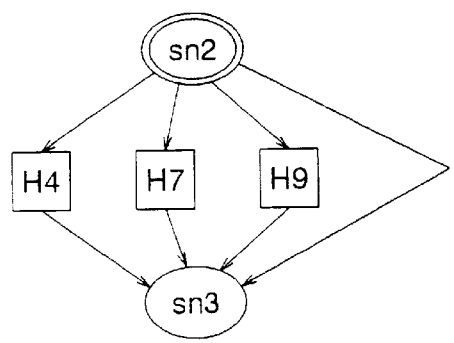

At step S305, a prohibition constraint graph G is generated as shown in FIG. 56B. At step S306, a prohibition constraint subgraph G* is obtained as a solid-line portion in FIG. 56B.

At step S307, a set N* as a subject of the assignment process becomes such that N*={sn2}. At step S308, a trunk of subnet sn2 is assigned to track T1.

A set N*={sn3} is obtained as a subject of the track assignment in steps S305–S310 of the second loop. A trunk of subnet sn3 is assigned to track T6 at step S308, and the routing process is finished. FIG. 49C shows a routing result.

(Example 2 of Embodiment 4)

The operation a second example of the fourth embodiment of the invention will be described below in detail. In particular, step S304C which is different from the corresponding step in the first embodiment will be described mainly.

Figure 57A:
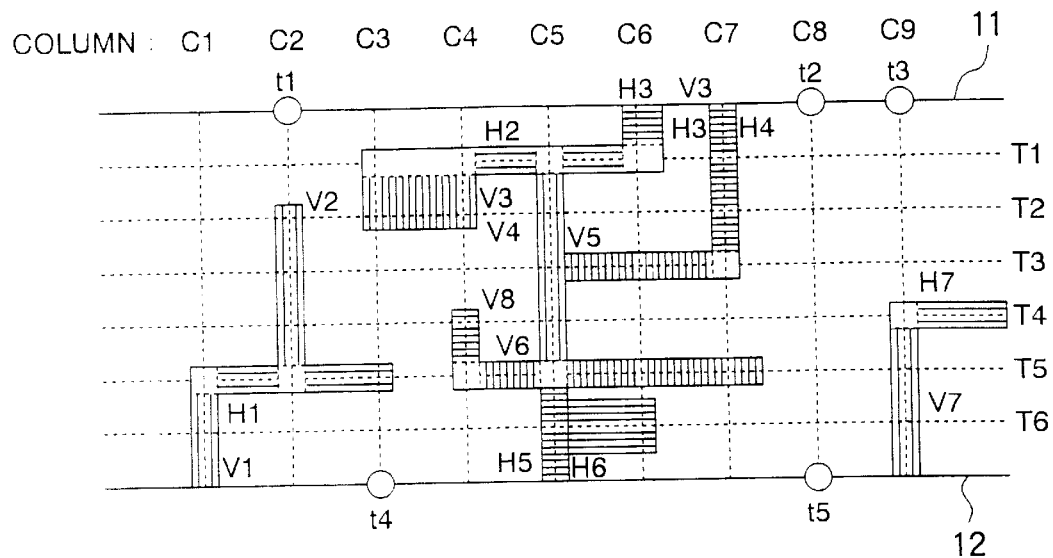

A consideration will be given to a channel routing region shown in FIG. 57A. A net list N={n1, n2}, where n1={t1, t2, t4} and n2={t3, t5}. Net n1 is divided into subnets sn1_1={t1, t4} and sn1_2={t4, t2}. Net n2 itself becomes subnet sn2={t3, t5}. Since routing of subnet sn1_1 is obstructed by the collective routing prohibition figure, AT(sn1_1) is an empty set.

Figure 57B:
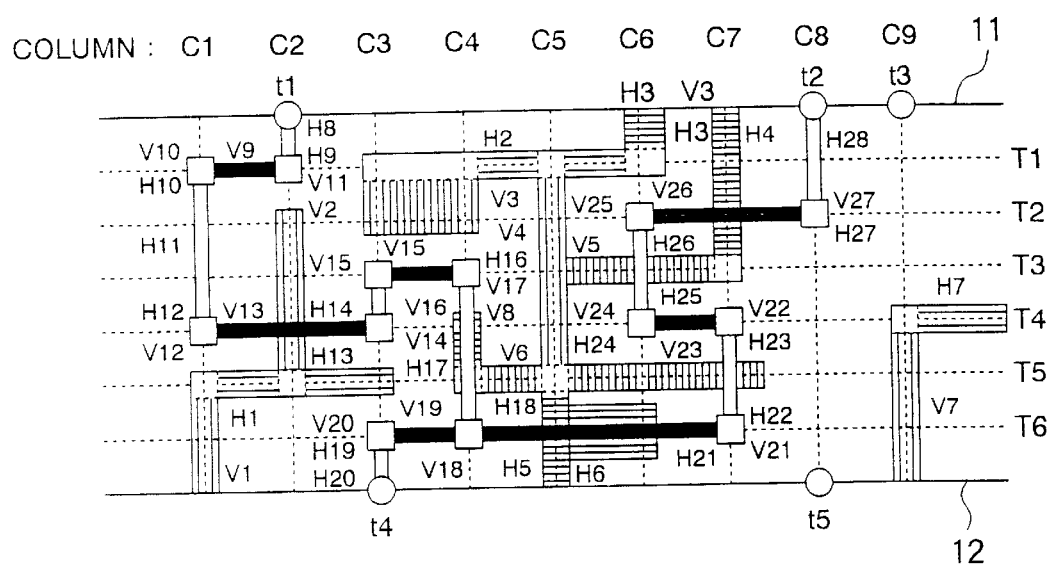

At step S304C, as shown in FIG. 57B, routing is performed for connections of the original net n1={t1, t2, t4}. The routes of net n1 are registered as routing prohibition figures (H8–H28 and V8–V27 in FIG. 57B). Subnets sn1_1 and sn1_2 are deleted from the net list. Sets AT of assignable tracks are recalculated, to obtain AT(sn2)={T3}.

Figure 58A:
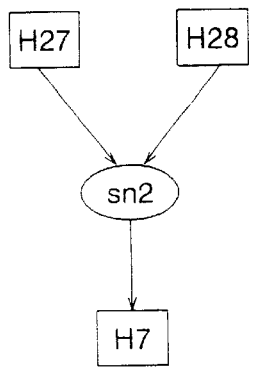

At step S305, a prohibition constraint graph G is generated as shown in FIG. 58A.

Figure 58B:
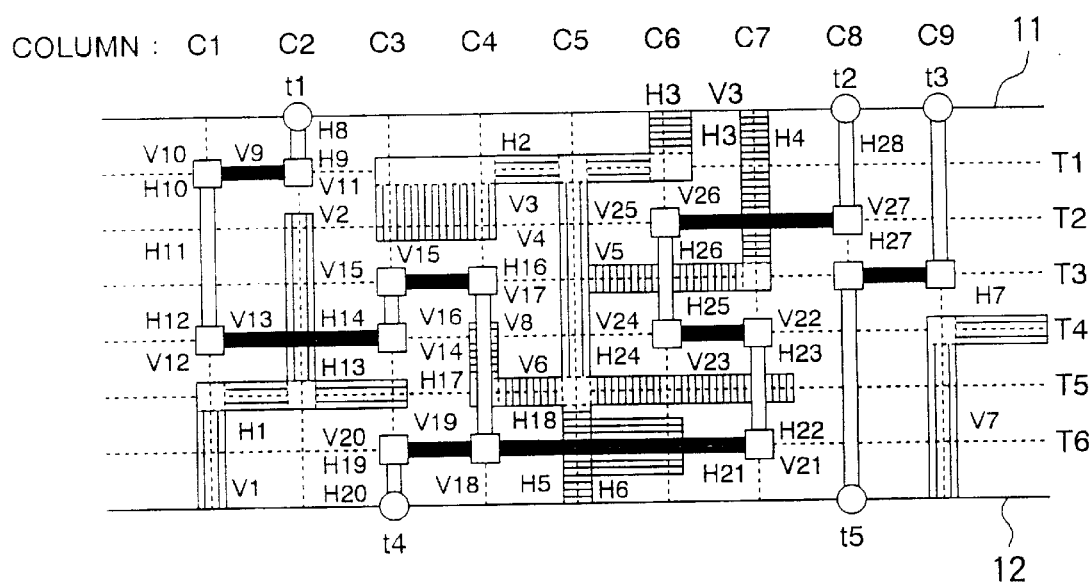

At step S307, a set N* as a subject of the assignment process becomes such that N*={sn2}. At step S308, a trunk of subnet sn2 is assigned to a track as shown in FIG. 58B. Since the net list N becomes an empty set, the routing process is finished.

In this example, since the routing prohibition figures are arranged in a complex manner, it is expected that the process of bypassing routing prohibition figures through subnet division for bypass routing will be cumbersome. The ensuing steps can be made more efficient by determining a bypass route in advance by using, for instance, a maze router prior to routing of other subnets, as is done in this step.

(5) Embodiment 5 of the Invention (5-1) Configuration

The configuration of a fifth embodiment of the invention will be described below in detail with reference to the drawings.

Figure 18:
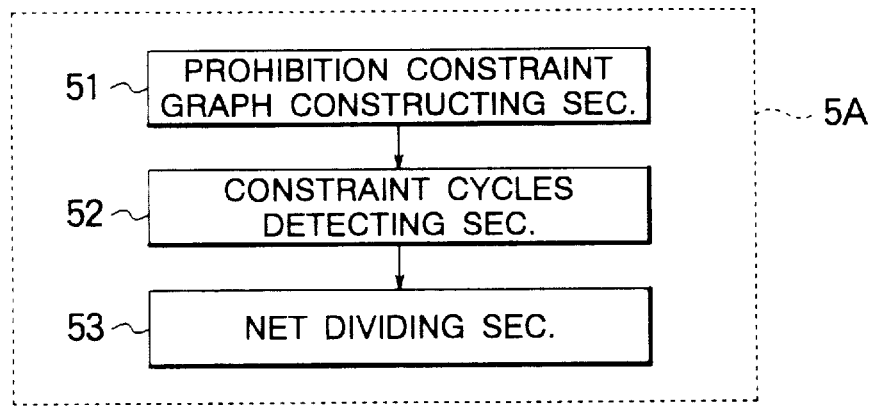
FIG. 18 is a block diagram showing the configuration of a prohibition constraint graph G generating and net dividing section in a fifth embodiment of the invention.

Referring to FIG. 18, the fifth embodiment is different from the first to fourth embodiments shown in FIGS. 9, 12, 14, and 16 in that a prohibition constraint graph G generating and net dividing section 5A, which replaces the prohibition constraint graph G generating section 5, has a prohibition constraint graph constructing section 51, a constraint cycles detecting section 52, and a net dividing section 53.

The prohibition constraint graph constructing section 51 constructs a prohibition constraint graph G, which corresponds to the prohibition constraint graph G generating section 5 of the first to fourth embodiments.

The constraint cycles detecting section 52 detects constraint cycles existing in the prohibition constraint graph G constructed by the section 51.

The net dividing section 53 divides nets to cancel the detected constraint cycles detected by the section 52.

(5-2) Operation

The operation of the fifth embodiment of the invention will be described below in detail with reference to the drawings.

Steps S301–S304 and S306–S310 of the fifth embodiment are the same as in the first to fourth embodiments, and hence descriptions therefor will be omitted.

Figure 19:
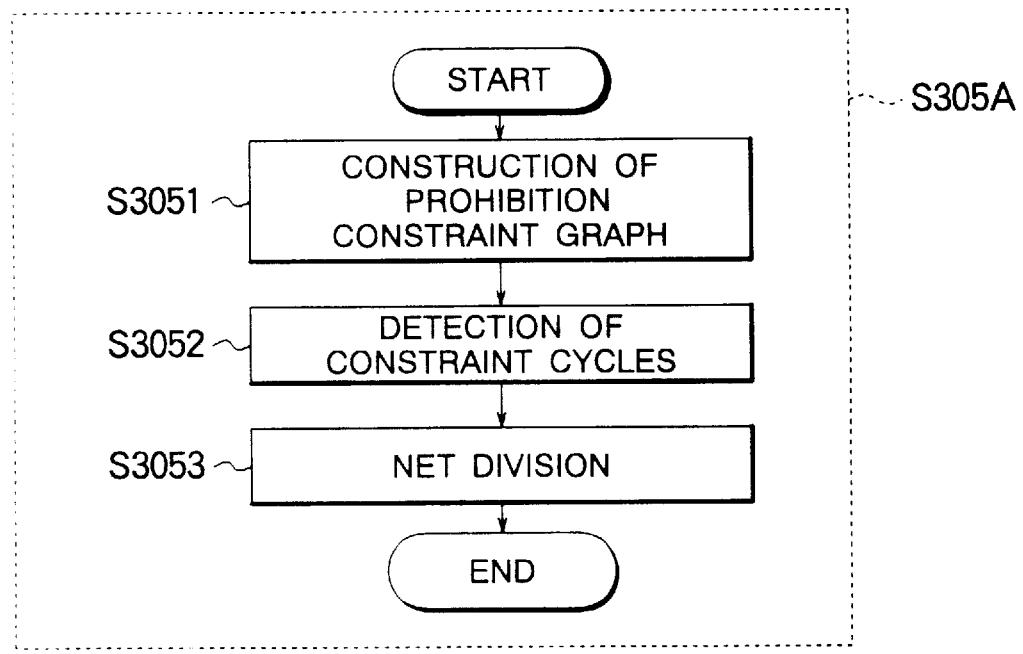
FIG. 19 is a flowchart showing the operation of step S305A (generation of prohibition constraint graph G and net division) in the fifth embodiment of the invention.

S305A (generation of prohibition constraint graph G and net division): As shown in FIG. 19, construction of a prohibition constraint graph, detection of constraint cycles, and net division for canceling the constraint cycles are performed at steps S3051–S3053.

S3051 (construction of prohibition constraint graph): A prohibition constraint graph G is generated.

S3052 (detection of constraint cycles): Cycles existing in the prohibition constraint graph G (referred to as "constraint cycles") are detected in which a double branch in the prohibition constraint graph G is regarded as a bidirectional directed branch. Cycles consisting of only one double branch are excluded from the detection.

S3053 (net division): Attention is paid to cycle C having at least one double branch among the constraint cycles detected at step S3052. Now consider a case where there exists a path passing through only a double branch to go between two nodes n1 and nk that correspond to subnets and there exists a path passing through at least one directed branch to go from n1 to nk. In the double branch path connecting n1 and nk, a node adjacent to n1 is denoted by nj (when net n is divided into two subnets, nj=nk). In this case, cycle C can be canceled by deleting the double branch between n1 and nk. Double branch e satisfying the following conditions 1) and 2) is made a candidate for deletion:

1) Branch e is included in a cycle.

2) In a subnet connected by a double branch, column c where a common terminal exists satisfies $|TH(c)|>0$ and $|PT(c)|>D(c)$.

Where a plurality of cycles exist in the prohibition constraint graph G, they are canceled by deleting double branch e that is selected based on an evaluation function F1. The evaluation function F1 is defined so as to reflect the following items (1) to (4):

(1) The number NumC of cycles including double branch e.

(2) Length LenC of the longest cycle among the cycles including double branch e.

(3) A longer one LenL of a length from node u to branch e as measured along cycle C and a length from branch e to node v as measured long cycle C when branch e exists between node u having an incoming branch and node v having an outgoing branch in tracing cycle C that includes double branch e in the directions of branches of cycle C.

(4) The number of tracks of TH(c).

The function F1 is defined as $$F1=\alpha'\cdot NumC+\beta'\cdot LenC+\gamma'\cdot LenL+\delta'\cdot TH(c)$$

where $\alpha'$, $\beta'$, $\gamma'$, and $\delta'$ are non-negative constants. Desired preference order can be set for items (1) to (4) by properly setting the values of $\alpha'$, $\beta'$, $\gamma'$, and $\delta'$. For example, if they are set such that a $\alpha'>\beta'>\gamma'>\delta'$ with sufficiently large differences therebetween, the evaluation function F1 is given such preference order that a highest preference is given to item (1) and the rank lowers in order of the item number.

(5-3) Advantages

Advantages of the fifth embodiment of the invention will be described below.

In the fifth embodiment of the invention, a constraint cycle existing in a prohibition constraint graph is detected and canceled by dividing a net. Therefore, it becomes possible to assign a trunk of one net to different tracks on a subnet-by-subnet basis rather than assign the entire trunk of the net to a single track. Further, since a jog is inserted into only a column where a terminal included in a net exists, the number of through-holes that are added by setting jogs to cancel constraint cycles can be reduced.

(Example 1 of Embodiment 5)

The operation of a first example of the fifth embodiment of the invention will be described below in detail.

Figure 59A:
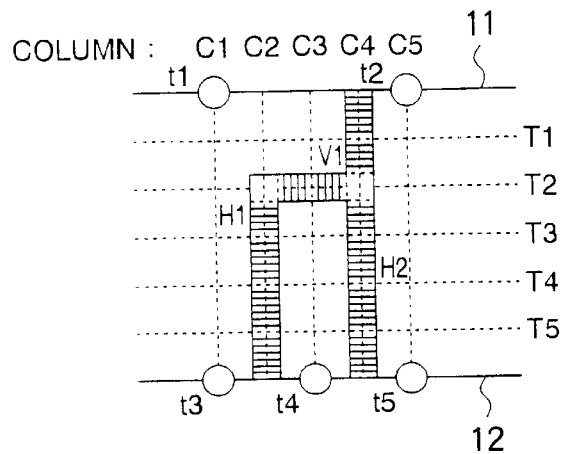

A consideration will be given to a channel routing region shown in FIG. 59A. A net list N={n1, n2}, where n1={t1, t4, t5} and n2={t2, t3}. H1 and H2 are vertical passage prohibition figures and V1 is a horizontal passage prohibition figure. Tracks are denoted by T1–T5 downward. Columns are denoted by C1–C5 rightward from the left end of the channel routing region.

First, at step S301, the above channel routing region is set. At step S302, the nets are divided into subnets in the following manner. Net n1 is divided into subnets sn1_1={t1, t4} and sn1_2={t4, t5}. Net n2 itself becomes subnet sn2. Thus, a new net list N={sn1_1, sn1_2, sn2}.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. The sets AT(sn) of assignable tracks of the respective subnets sn are such that AT(sn1_1)={T1, T3, T4, T5}, AT(sn1_2)={T1, T3, T4, T5}, and AT(sn2)={T1, T3, T4, T5}.

No processing is performed at step S304 because there is no subnet whose AT is an empty set.

Figure 59B:
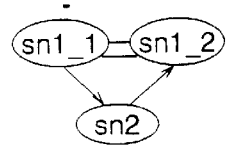

At step S3051 of step S305A, a prohibition constraint graph G is generated as shown in FIG. 59B. At step S3052, a constraint cycle existing in the prohibition constraint graph G, sn1_1→sn2→sn1_2→sn1_1, is detected.

Figure 59C:
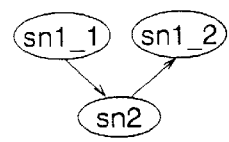

At step S3053, a double branch included in the loop is deleted to cancel the constraint cycle detected in step S3052. In this case, one constraint cycle is detected and only one double branch (sn1_1, sn1_2) is included therein. Therefore, double branch (sn1_1, sn1_2) is selected. If a plurality of double branches exist in a constraint cycle, a double branch that maximizes the value of the function F1 is selected with a setting of $\alpha'=1,000$, $\beta'=100$, $\gamma'=10$, and $\delta'=1$, for instance. FIG. 59C shows a prohibition constraint graph after the cancellation of the constraint graph.

At step S306, a prohibition constraint subgraph G* is obtained, which is the same as the graph of FIG. 59C.

At step S307, a set N* of subnets as a subject of the assignment process becomes such that N*={sn1_1, sn1_2, sn2}.

Figure 59D:
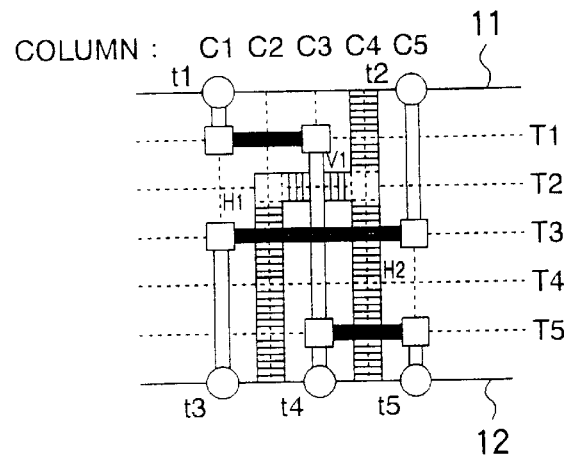

At step S308, trunks of the subnets of N* are assigned to tracks. FIG. 59D shows a result of the track assignment.

N becomes an empty set at step S309, and the routing process is finished at step S310.

(6) Embodiment 6 of the Invention (6-1) Configuration

The configuration of a sixth embodiment of the invention will be described below in detail with reference to the drawings.

Figure 20:
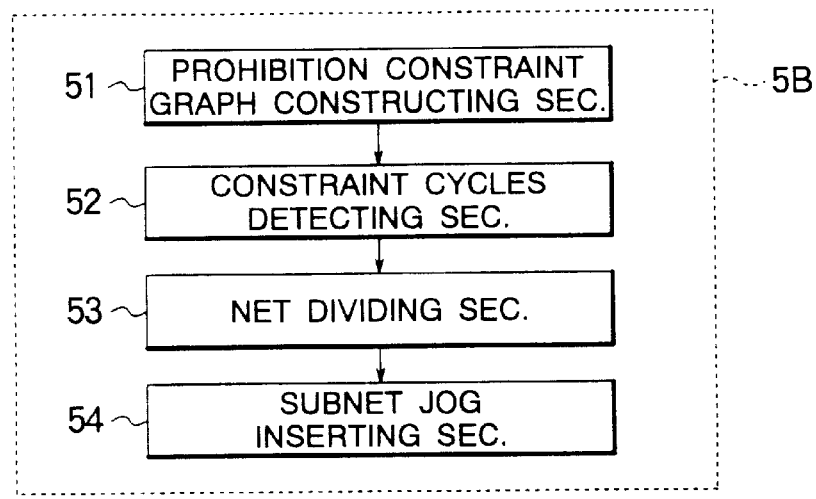
FIG. 20 is a block diagram showing the configuration of a prohibition constraint graph G generating and subnet jog inserting section in a sixth embodiment of the invention.

Referring to FIG. 20, the sixth embodiment is different from the fifth embodiment shown in FIG. 18 in that a prohibition constraint graph G generating and subnet jog inserting section 5B has a subnet jog inserting section 54 in addition to the components of the prohibition constraint graph G generating and net dividing section 5A of the fifth embodiment.

The subnet jog inserting section 54 cancels a constraint cycle that cannot be canceled by the net dividing section 53 among constraint cycles detected by the constraint cycles detecting section 52, by inserting a jog into a subnet corresponding to a node that is included in the constraint cycle.

(6-2) Operation

The operation of the sixth embodiment of the invention will be described below in detail with reference to the drawings.

Steps S301–S304 and S306–S310 of the sixth embodiment are the same as in the first to fifth embodiments, and hence descriptions therefor will be omitted.

Figure 21:
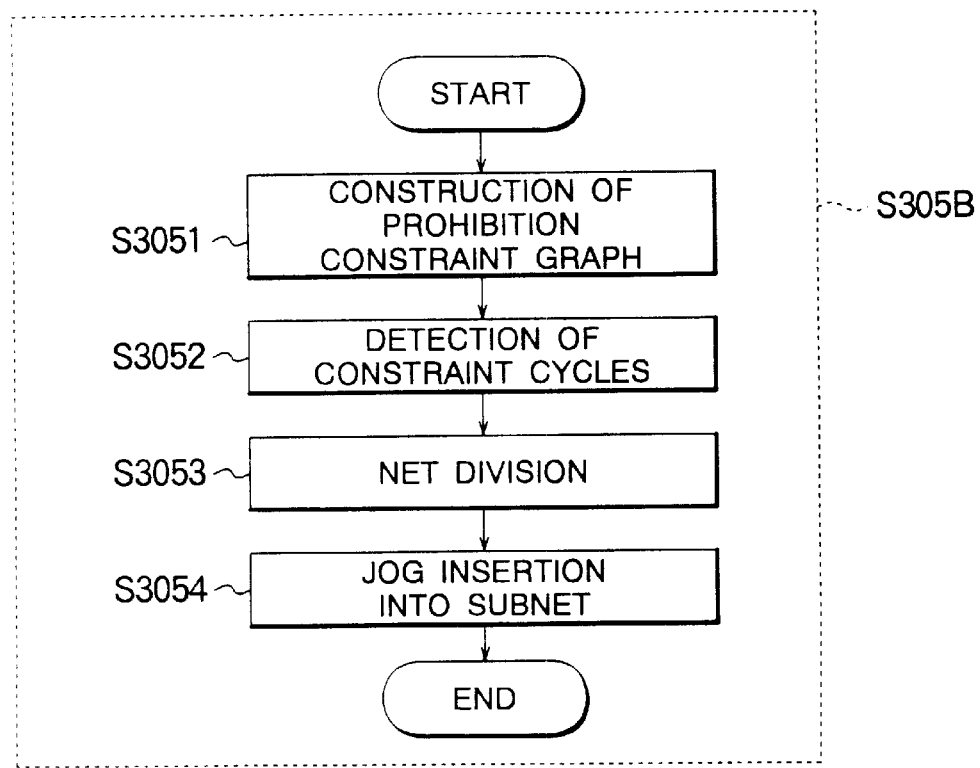
FIG. 21 is a flowchart showing the operation of step S305B (generation of prohibition constraint graph G and jog insertion into subnet) in the sixth embodiment of the invention.

S305B (generation of prohibition constraint graph G and subnet jog insertion): As shown in FIG. 21, the following step S3054 is performed after step S3053 of step S305A of the fifth embodiment.

S3054 (jog insertion into subnet): A cycle is canceled by dividing a node corresponding to subnet sn(i) into two nodes sn(i)__1 and sn(i)__2 by inserting a jog into subnet sn(i) included in a cycle. Since all constraint cycles including a double branch are canceled at step S3053 which has been described above in describing the operation of the fifth embodiment, a constraint cycle to be canceled in this step does not include a double branch. In cycle a(0)→ a(1)→ . . . →sn(i)→a(j)→a(j+1)→ . . . →a(C-1)→a(C) (=a(0)), node sn(i) is divided into two nodes sn(i)__1 and sn(i)__2, thereby converting the cycle into a path sn(i)__1→a(j)→ a(j+1)→ . . . →a(C-1)→a(C) (=a(0))→a(l)→ . . . →sn(i)__2.

Where a plurality of cycles exist in the prohibition constraint graph G, a subnet into which a jog is to be inserted is selected based on an evaluation function F2. The evaluation function F2 is defined so as to reflect the following items (1) to (3):

(1) The number NumC of cycles including node s corresponding to subnet sn.

(2) Length LenC of the longest cycle among the cycles including node corresponding to subnet sn.

(3) A longer one LenL of a length from node u to node s as measured along cycle C and a length from node s to node v as measured long cycle C when node s exists between node u having an incoming branch and node v having an outgoing branch in tracing cycle C that includes node s corresponding to subnet sn in the directions of branches of cycle C.

The function F2 is defined as $$F2=\alpha''\cdot NumC+\beta''\cdot LenC+\gamma''\cdot LenL$$

where $\alpha''$, $\beta''$, and $\gamma''$ are non-negative constants. Desired preference order can be set for items (1) to (3) by properly setting the values of $\alpha''$, $\beta''$, and $\gamma''$. For example, if they are set such that $\alpha''>\beta''\gg\gamma''$ with sufficiently large differences therebetween, the evaluation function F2 is given such preference order that a highest preference is given to item (1) and the rank lowers in order of the item number.

The position where to insert a jog is determined based on an evaluation function F3. By using the evaluation function F3, one of columns of the following items a) to e) is determined as a jog inserting position from among columns that satisfy $$|TH(c)|>0 \text{ and } |PT(c)|>D(c).$$

a) A column located within the interval (between the left end terminal and the right end terminal) of the subnet which column does not cause any new vertical constraint.

b) A column located outside the interval of the subnet which column does not cause any vertical constraint.

c) A column located within the interval of the subnet which column is subject to one of upward and downward vertical constraints.

d) A column located outside the interval of the subnet which column is subject to one of upward and downward vertical constraints.

e) A column located outside the channel routing region.

The function F3 is defined so as to reflect the following items (1) to (5):

(1) the number NumN of terminals of net n located on column c;

(2) the number NumO of other nets located on column c;

(3) the number of tracks of TH(c);

(4) a penalty Value1 that is given when column c is located outside the subnet; and (5) a penalty ValueC that is given when column c is located within the channel routing region.

Where the function F3 is a sum of the above items (1) to (5) that are multiplied by respective coefficients, a column into which a jog is to be inserted is determined in such preference order that a highest preference is given to item a) and the rank lowers in order from b) to e).

(6-3) Advantages

Advantages of the sixth embodiment of the invention will be described below.

In the sixth embodiment of the invention, constraint cycles existing in a prohibition constraint graph are detected and canceled first by dividing nets. Then, only the constraint cycles that could not be canceled by the net division are canceled by inserting a jog into a subnet. A jog is inserted, with reference, to a column on which a terminal that is included in a net, and then a jog is inserted into a column on which no terminal is located for constraint cycles that still remain uncanceled. Therefore, it becomes possible to reduce the number of through-holes that are added by setting jogs to cancel constraint cycles. Further, even if constraint cycles remain that could not be canceled by a method of assigning trunks of a net to different tracks on a subnet-by-subnet basis, the routing process can be performed by canceling such constraint cycles by dividing a trunk of a subnet and assigning resulting trunk portions to different tracks.

(Example 1 of Embodiment 6)

The operation of a first example of the sixth embodiment of the invention will be described below in detail.

Figure 60A:
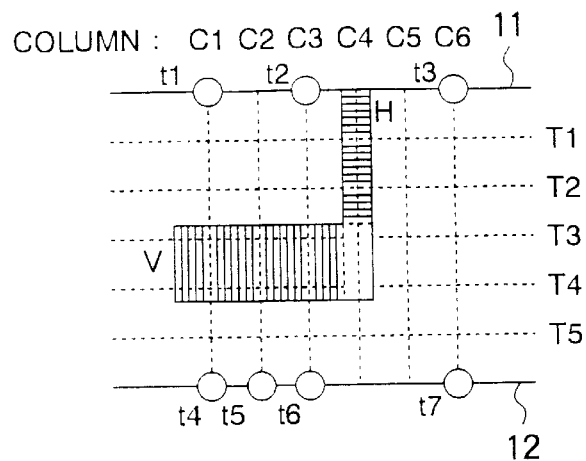
Figure 60B:
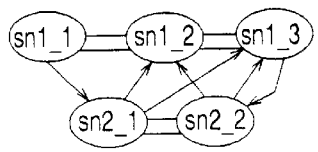

A consideration will be given to a channel routing region shown in FIG. 60A. A net list N={n1, n2}, where n1={t1, t3, t5, t6} and n2={t2, t4, t7}. H and V are a vertical passage prohibition figure and a horizontal passage prohibition figure, respectively. Tracks are denoted by T1–T5 downward. Columns are denoted by C1–C6 rightward from the left end of the channel routing region.

First, at step S301, the above channel routing region is set. At step S302, the nets are divided into subnets in the following manner. Net n1 is divided into subnets sn1__1= {t1, t5}, sn1__2={t5, t6}, and sn1__3={t6, t3}. Net n2 is divided into subnets sn2 __1={t4, t2} and sn__2={t2, t7}. Thus, a new net list N={sn1__1, sn1__2, sn1__3, sn2 __1, sn2 __2}.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. The sets AT(sn) of assignable tracks of the respective subnets sn are such that AT(sn1__1)=AT(sn1__2)= AT(sn1__3)=AT(sn2 __1)=AT(sn2 __2)={T1, T2, T5}.

No processing is performed at step S304 because there is no subnet whose AT is an empty set.

Figure 61A:
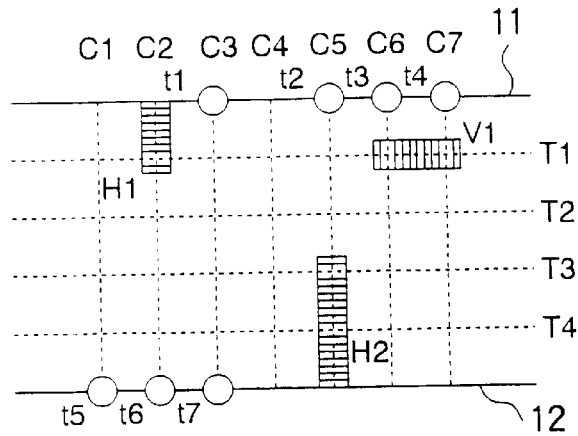
Figure 61B:
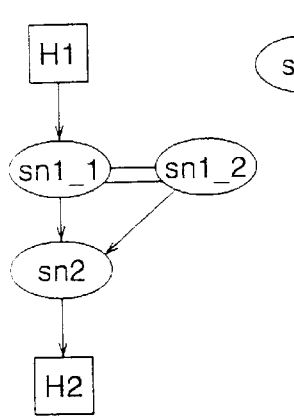

At step S3051 of step S305B, a prohibition constraint graph G is generated as shown in FIG. 61B. At step S3052, constraint cycles existing in the prohibition constraint graph G are detected. Candidate double branches to be deleted to cancel a constraint cycle are (sn1__1, sn1__2), (sn1__2, sn1__3), and (sn2__1, sn2__2).

Figure 60C:
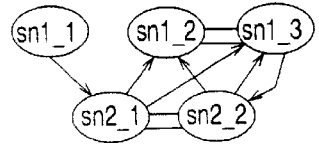
Figure 60D:
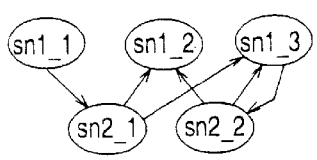

At step S3053, in this example, the coefficient values of the function F1 are set such that a'=1,000, β'=100, γ'=10, and δ'=1. Among the above candidate double branches, double branch (sn1__1, sn1__2) is selected. As shown in FIG. 60C, even after the deletion of the above double branch the constraint cycles including a double branch remain in the prohibition constraint graph. A double branch (sn1_2, sn1_3) that maximizes the value of the evaluation function F1 is selected from among the residual candidates, and deleted. Since the constraint cycle including the last double branch (sn2_1, sn2 _2) still exists, this double branch is deleted. FIG. 60D shows a prohibition constraint graph that is obtained after the deletion of the constraint cycles including a double branch.

At step S3054, a constraint cycle including no double branch are canceled. In the prohibition constraint graph shown in FIG. 60D, i.e., the constraint graph obtained after execution of step S3053, a constraint loop sn1_3→sn2_2→sn1_3 remains. From among the subnets included in this constraint cycle, a subnet into which a jog is to be inserted is selected based on the evaluation function F2. In this case, since a subnet for jog insertion is selected from two subnets included in one constraint cycle, the third term is important among the three terms of the evaluation function F2. Therefore, the coefficient values of the function F2 are set such that $\alpha''=\beta''=0$ and $\gamma''=1$. The functions F2 has values 2 and 3 for subnets sn1_3 and sn2_2, respectively. Thus, a jog is inserted into subnet sn1_3 that minimizes the value of the function F2.

Figure 60E:
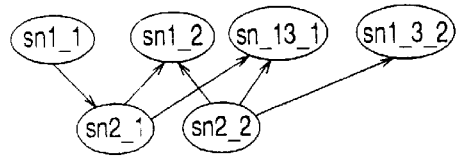

Then, a jog inserting position in subnet sn1_3 is determined based on the evaluation function F3. With the first term of the function F3 given a highest preference, column C5 is selected which does not cause a new vertical constraint when a jog is inserted thereinto. Since column C5 has no terminal, it causes no new vertical constraint. A jog is inserted into subnet sn1_3, whereby it is divided into subnets sn1_3_1 and sn1_3_2. FIG. 60E shows a prohibition constraint graph that is obtained after the above constraint cycle cancellation. A new net list N becomes such that N={sn1_1, sn1_2, sn1_1, sn1_3_2, sn2_1, sn2_2}.

At step S306, a prohibition constraint subgraph G* is obtained. In this example, the entire prohibition constraint graph is also a prohibition constraint subgraph G*.

At step S307, a set N* of subnets as a subject of the assignment process becomes such that N*={sn1_1, sn1_2, sn1_3_1, sn1_3_2, sn2 _1, sn2_2}.

Figure 60F:
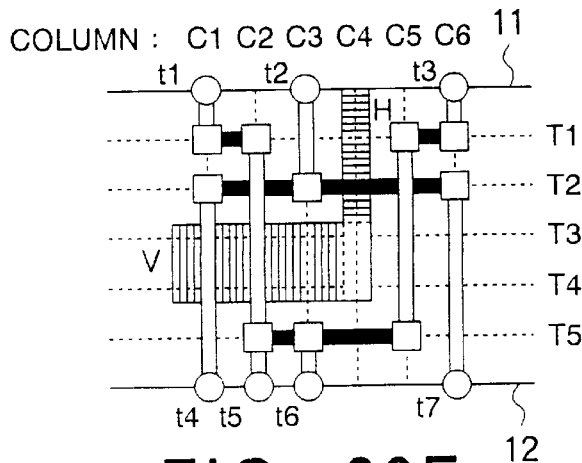

At step S308, trunks of the subnets of N* are assigned to tracks. FIG. 60F shows a result of the track assignment.

N becomes an empty set at step S309, and the routing process is finished at step S310.

(7) Embodiment 7 of the Invention (7-1) Configuration

The configuration of a seventh embodiment of the invention will be described below in detail with reference to the drawings.

Figure 22A:
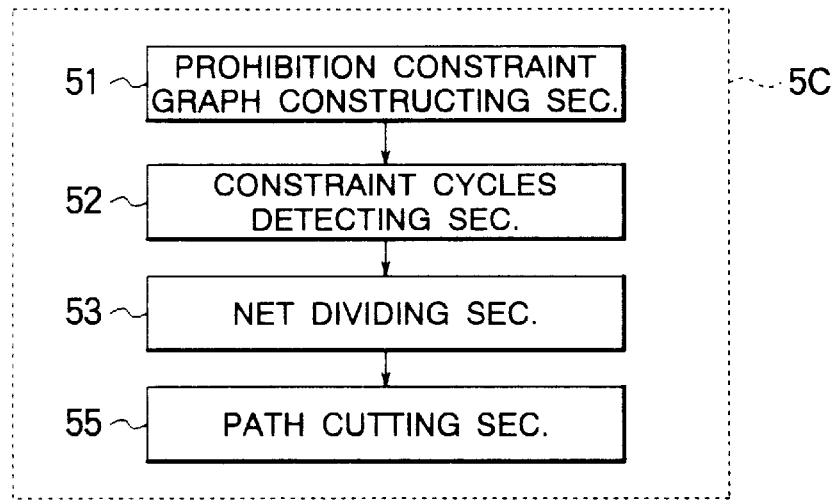
FIGS. 22A and 22B are block diagrams showing configurations of a prohibition constraint graph G generating and path cutting section in a seventh embodiment of the invention in which in FIG. 22A a path cutting section 55 is added to the prohibition constraint graph G generating and net dividing section 5A of the fifth embodiment and in FIG. 22B a path cutting section 55 is added to the prohibition constraint graph G generating and subnet jog inserting section 5B of the sixth embodiment.

Referring to FIGS. 22A and 22 B, the seventh embodiment is different from the fifth and sixth embodiments shown in FIGS. 18 and 20 in that a prohibi- tion constraint graph G generating and path cutting section 5C has a path cutting section 55 in addition to the components of the prohibition constraint graph G generating and net dividing section 5A of the fifth embodiment or in addition to the components of the prohibition constraint graph G generating and subnet jog inserting section 5B of the sixth embodiment.

The path cutting section 55 detects a subnet that cannot be routed with only a single trunk due to obstruction by routing prohibition figures and cuts a path in a prohibition constraint graph G by inserting a jog into the detected subnet.

(7-2) Operation

The operation of the seventh embodiment will be described below in detail with reference to the drawings.

Steps S301–S304 and S306–S310 of the seventh embodiment are the same as in the first to sixth embodiments, and hence descriptions therefor will be omitted.

Figure 23A:
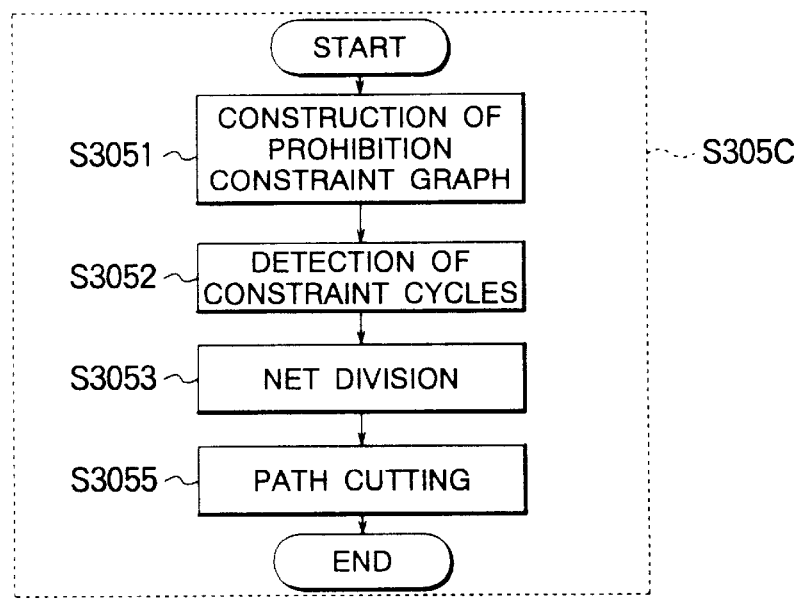
FIGS. 23A and 23B are flowcharts showing operations of step S305C (generation of prohibition constraint graph and path cutting) in the seventh embodiment of the invention in which in FIG. 23A a path cutting step is added to step S305A (generation of prohibition constraint graph and net division) of the fifth embodiment and in FIG. 23B a path cutting step is added to step S305B (generation of prohibition constraint graph and jog insertion into subnet) of the sixth embodiment.
Figure 23B:
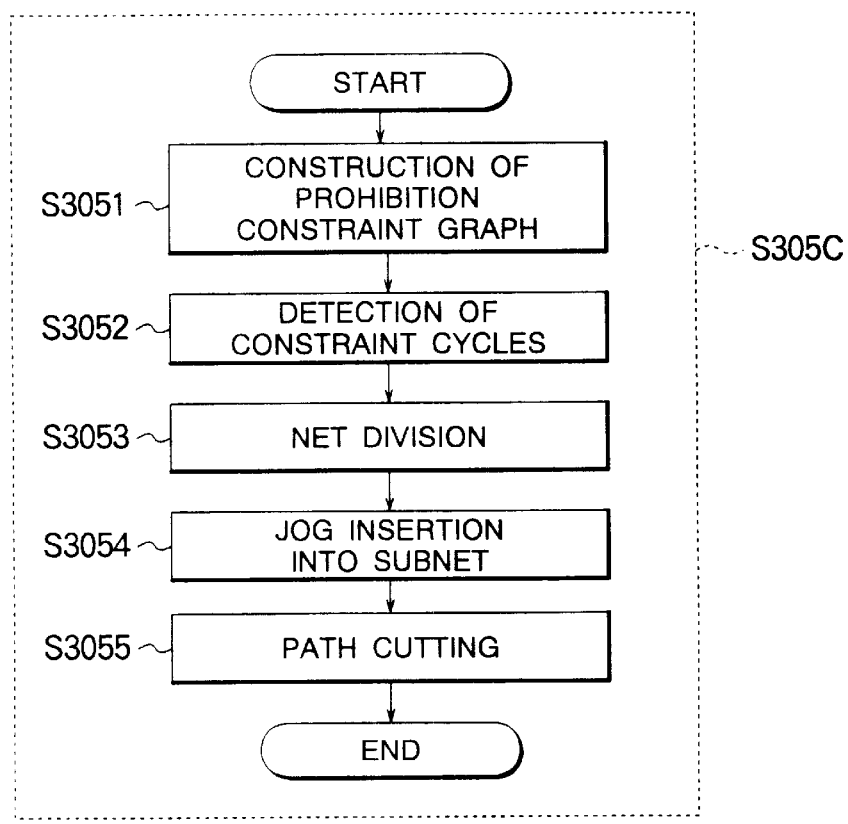

S305C (generation of prohibition constraint graph G and path cutting): As shown in FIG. 23A or 23B, the following step S3055 is performed after step S3053 of step S305A of the fifth embodiment or after step S3054 of step S305 B of the sixth embodiment.

S3055 (path cutting): At the following steps S5C1–S5C3, a jog is inserted into a routing-impossible subnet and a path in a prohibition constraint graph is cut.

S5C1: For a net n, a set AT*(n) of tracks, which is called a set of assignable effective tracks of net n, is made AT(n).

S5C2: In the prohibition constraint graph G, an imaginary node BOTTOM is provided and a directed branch that is directed from a node having no outgoing branch to node BOTTOM is provided.

S5C3: A breadth first search is performed so as to trace the directed branch backward from node BOTTOM (start point). In doing so, the following steps S5C31–S5C38 are performed for each branch e=(u, v) as a subject of the search. When a jog is inserted, the prohibition constraint graph G and the net list N are updated. A set AT of assignable tracks and a set AT* of assignable effective tracks of each of a subnet corresponding to node u or v and a divided subnet are recalculated.

S5C31: If node u or v corresponds to a prohibition figure, the process goes to a next search.

S5C32: The highest track among the tracks of AT*(u) is set as Highest_u.

S5C33: AT*(v) is updated to a set {tr|tr<Highest_u and tr ∈AT*(v)}. Since there exists a directed branch directed from node u to node v, there is a constraint between nets u and v corresponding to nodes u and v that a trunk of net u must be assigned to a track that is located above a track to which a trunk of net v is assigned. The number of candidate tracks to which a trunk of net v can be assigned is maximum when a trunk of net u has been assigned to the highest track Highest_u among assignable effective tracks of set AT*(u). In this case, a trunk of net v is assignable to tracks lower than the track Highest_u.

S5C34: If AT*(v) is an empty set, the net corresponding to node v is made a subject of jog insertion and the process goes to step S5C38.

S5C35: The lowest track among the tracks of AT*(v) is set as Lowest_v.

S5C36: AT*(u) is updated to a set {tr|tr>Lowest_v and tr ∈AT*(u)}. As described above in the description of step S5C33, the number of candidate tracks to which a trunk of net u can be assigned is maximum when a trunk of net v has been assigned to the lowest track Lowest_v among assignable effective tracks of set AT*(v). In this case, a trunk of net u is assignable to tracks higher than the track Lowest_v.

S5C37: If AT*(u) is an empty set, the net corresponding to node u is made a subject of jog insertion.

S5C38: A jog is inserted into the net as the subject of jog insertion based on the above-mentioned evaluation function F3. In this manner, a path passing through the node corresponding to net n can be cut.

(7-3) Advantages

Advantages of the seventh embodiment of the invention will be described below.

In assigning trunks of subnets corresponding to nodes included in a path that exists in a prohibition constraint graph, tracks are needed in a number equal to the number of the nodes corresponding to the subnets. Even when a sufficient number of tracks to assign all trunks of subnets do not exist because of the existence of routing prohibition figures in assigning to tracks trunks of subnets corresponding to nodes on a path that exists in a prohibition constraint graph, the seventh embodiment of the invention enables the routing with the use of only the existing tracks by dividing a trunk of a subnet and assigning resulting trunk portions to different tracks. In addition, a subnet that requires jog insertion can be determined efficiently by calculating a set of assignable effective tracks.

(Example 1 of Embodiment 7)

The operation of a first example of the seventh embodiment of the invention will be described below in detail.

A consideration will be given to a channel routing region shown in FIG. 61A. A net list N={n1, n2, n3}, where n1={t1, t3, t6}, n2={t2, t7}, and n3={t4, t5}. H1 and H2 are vertical passage prohibition figures and V1 is a horizontal passage prohibition figure. Tracks are denoted by T1–T4 downward. Columns are denoted by C1–C7 rightward from the left end of the channel routing region.

First, at step S301, the above channel routing region is set. At step S302, the nets are divided into subnets in the following manner. Net n1 is divided into subnets sn1_1={t6, t1} and sn1_2={t1, t3}. Nets n2 and n3 themselves become subnets sn2 and sn3. Thus, a new net list N={sn1_1, sn1_2, sn2, sn3}.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. The sets AT(sn) of assignable tracks of the respective subnets sn are such that AT(sn1_1)=AT(sn1_2)={T2, T3, T4}, AT(sn2)={T1, T2}, and AT(sn3)={T2, T3, T4}.

No processing is performed at step S304 because there is no subnet whose AT is an empty set.

At step S3051 of step S305C, a prohibition constraint graph G is generated as shown in FIG. 61B. At step S3052, constraint cycles existing in the prohibition constraint graph G are detected. No processing is performed at steps S3053 and S3054 because no constraint cycle exists in the prohibition constraint graph.

At step S3055, a consideration will be given to a case where a directed branch (sn1_2, sn2) is found. At step S5C32, since AT*(sn1_2)={T2, T3, T4}, T2 is a track Highest_u. Further, AT*(sn2)={T1, T2}. At step S5C33, AT*(sn2) is updated to an empty set. Therefore, subnet sn2 is made a candidate of jog insertion at step S5C34.

Figure 61C:
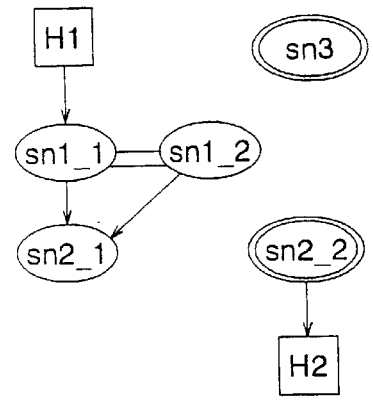

At step S5C38, a jog is inserted into subnet sn2 based on the evaluation function F3. With the first term of the evaluation function F3 set as a highest preference evaluation item, a jog is inserted into subnet sn2 on column C4 that does not cause any new vertical constraint. Subnet n2 is divided into subnets sn2_1={t7, t*} and sn2_2={t*, t2}. Terminal t* is an imaginary terminal that is introduced to represent a jog on column C4. FIG. 61C shows an updated prohibition constraint graph. Sets AT of assignable tracks of the respective subnets are such that AT(sn1_1)={T2, T3, T4}, AT(sn1_2)={T2, T3, T4}, AT(sn2_1)={T1, T2, T3, T4}, and AT(sn2_2)={T1, T2}. Sets AT* of assignable effective tracks are such that AT*(sn1_1)={T2, T3}, AT*(sn1_2)={T2, T3}, AT*(sn2_1)={T3, T4}, and AT*(sn2_2)={T1, T2}. Thus, there is no subnet whose AT* is an empty set.

At step S306, a prohibition constraint subgraph G* is obtained as a solid-line portion in FIG. 61C.

At step S307, a set N* of subnets as a subject of the assignment process becomes such that N*={sn2_2, sn3}.

At step S308, trunks of the subnets of N* are assigned to tracks. A trunk of subnet sn2_2 is assigned to track T1 and a trunk of subnet sn3 is assigned to track T2.

At step S309, N becomes such that N={sn1_1, sn1_2, sn2_1}.

Figure 61D:
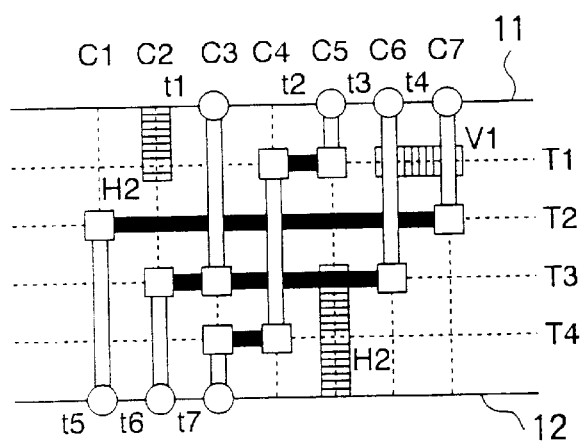

At steps S305–S310 of the second loop, trunks of subnets sn1_1 and sn1_2 are assigned to track T3 and a trunk of subnet sn2_1 is assigned to track T4. The net list N becomes an empty set at step S309 and the routing process is finished. FIG. 61D shows a routing result.

(8) Embodiment 8 of the Invention (8-1) Configuration

The configuration of an eighth embodiment of the invention will be described below in detail with reference to the drawings.

Figure 22B:
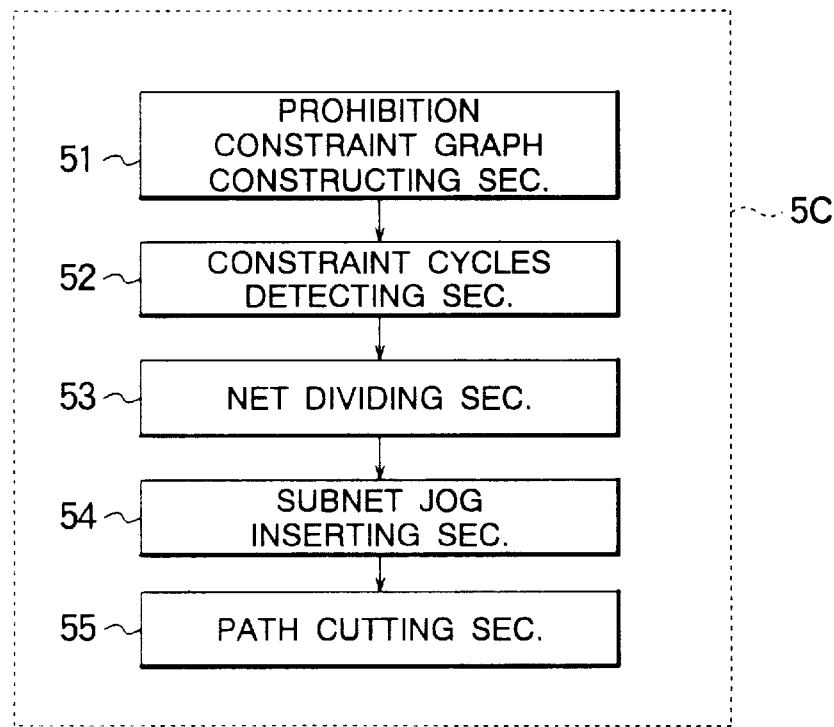
Figure 24A:
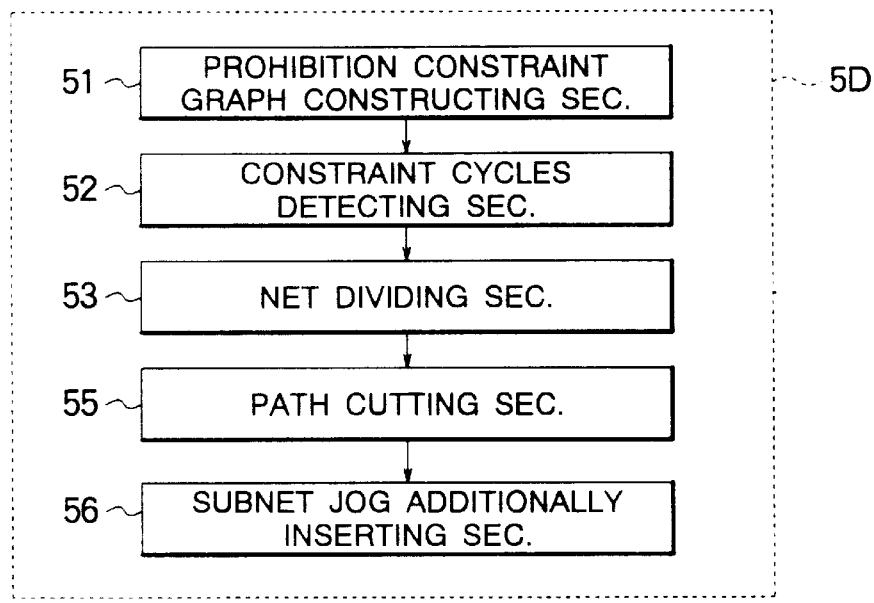
FIGS. 24A and 24B are block diagrams showing configurations of a prohibition constraint graph G generating and subnet jog additionally inserting section in an eighth embodiment of the invention in which in FIG. 24A a subnet jog additionally inserting section 56 is added to the prohibition constraint graph G generating and path cutting section 5C of the seventh embodiment shown in FIG. 22A and in FIG. 24B a subnet jog additionally inserting section 56 is added to the prohibition constraint graph G generating and path cutting section 5C of the seventh embodiment shown in FIG. 22B.
Figure 24B:
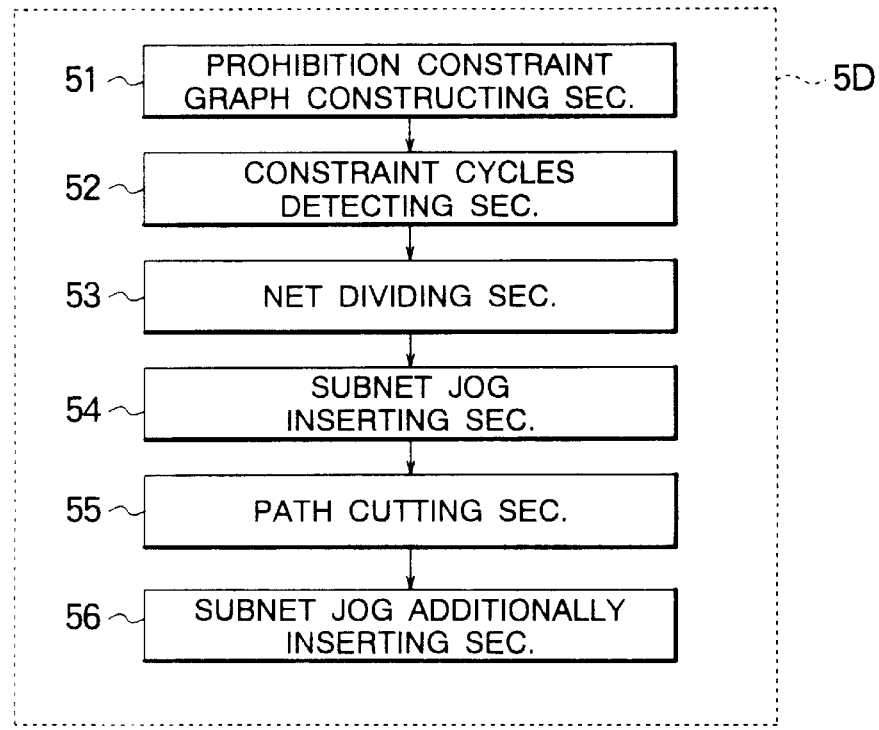

Referring to FIGS. 24A and 24B, the eighth embodiment is different from the seventh embodiment in that a prohibition constraint graph G generating and subnet jog additionally inserting section 5D has a subnet jog additionally inserting section 56 in addition to the prohibition constraint graph G generating and path cutting section 5C of the seventh embodiment shown in FIG. 22A or 22B.

The subnet jog additionally inserting section 56 selects candidate subnets into which a jog should be inserted based on a relationship between the number of trunk-assignable tracks and the number of subnets, and determines jog inserting positions.

(8-2) Operation

The operation of the eighth embodiment will be described below in detail with reference to the drawings.

Steps S301–S304 and S306–S310 of the eighth embodiment are the same as in the first to seventh embodiments, and hence descriptions therefor will be omitted.

Figure 25A:
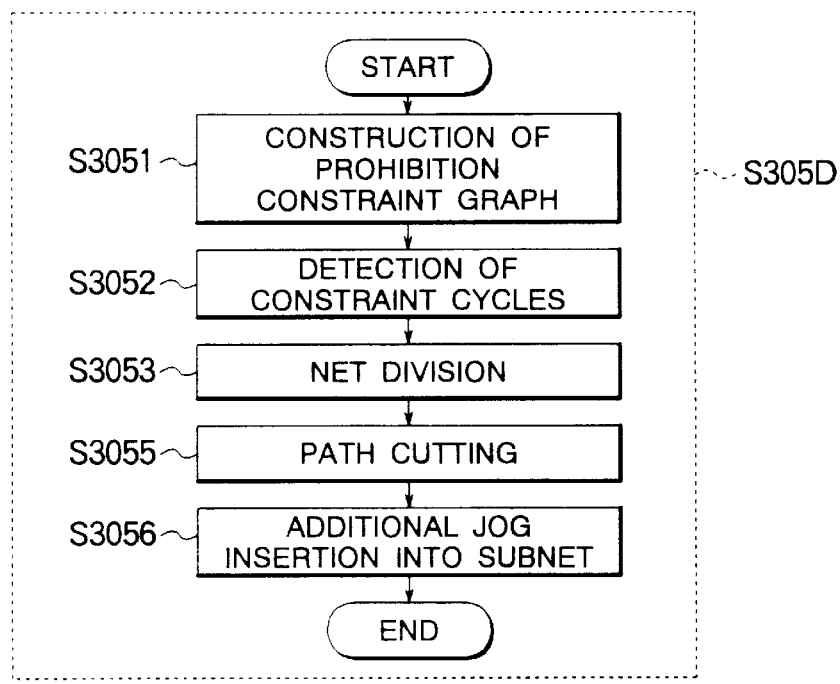
FIGS. 25A and 25B are flowcharts showing operations of step S305D (generation of prohibition constraint graph and additional jog insertion into subnet) in the eighth embodiment of the invention in which in FIG. 25A a step of additional jog insertion into subnet is added to step S305C (generation of prohibition constraint graph and path cutting) of the seventh embodiment shown in FIG. 23A and in FIG. 25B a step of additional jog insertion into subnet is added to step S305C (generation of prohibition constraint graph and path cutting) of the seventh embodiment shown in FIG. 23B.
Figure 25B:
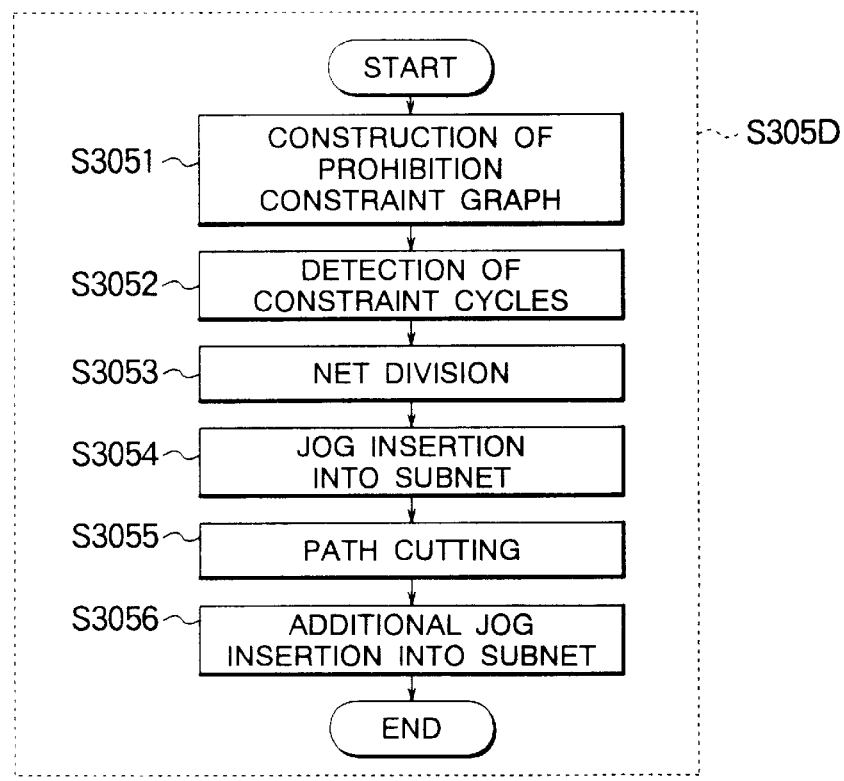

S305D (generation of prohibition constraint graph G and additional jog insertion into subnet): As shown in FIG. 25A or 25B, the following step S3056 is performed after step S3055 of step S305C of the seventh embodiment.

S3056 (additional jog insertion into subnet): At the following steps S5D1–S5D9, it is judged where there exists a routing-impossible subnet, and, if such a subnet exists, candidate subnets for jog insertion are determined and a jog is inserted. In calculating the number of elements |Net| of a set Net of nets, subnets whose corresponding nodes in a prohibition constraint graph G are connected to each other by a double branch is counted as one.

S5D1: A set RT_all(0) of tracks, sets Net(0) and Jog of nets are initialized to empty sets.

S5D2: Symbol c, which denotes a column, is given a value 1 (leftmost column of the channel routing region).

S5D3: A set RT_all(c) of tracks is made TR_all(c−1), and a set Net(c) of nets is made Net(c−1). Flag(c) which indicates a result of judgment as to whether there exists a routing-impossible subnet on column c is made "OK".

S5D4: If no terminal exists at each of the top and bottom ends of column c, or if terminals at the top and bottom ends of column c belong to the same net, the process goes to step S5D8.

S5D5: Terminals at the top and bottom ends are denoted by p and q, respectively, and nets of terminals p and q are denoted by np and nq, respectively.

RT_all(c) is updated to (RT_all(c) ∪ AT*(np)∪ AT*(nq))∩ PT(c). If terminal p is not located at the right end of net np, Net(c) is updated to Net(c)∪ {np}. Similarly, if terminal q is not located at the right end of net nq, Net(c) is updated to Net(c)∪ {nq}.

S5D6: If |RT_all(c)|<|Net(c)|, the judgment result Flag(c) is made "NG". RT_all(c) represents a set of assignable tracks on column c, and Net(c) represents a set of nets to which trunks should be assigned on column c.

Where the set Jog is an empty set, if the number of assignable tracks (i.e., the number of elements of RT_all(c))

is smaller than the number of trunks that should be assigned (i.e., the number of elements of Net(c)), the insufficiency of tracks must be solved by inserting jogs into nets in a number equal to the insufficient number of assignable tracks (i.e., |Net(c)|–|RT_all(c)|). Where the set Jog is not an empty set, if |Net(c)–Jog|>|RT_all(c)|, jogs are inserted into (|Net(c)–Jog|–|RT_all(c)|) nets among nets of a set Net(c)–Jog.

(|Net(c)–Jog|–|RT_all(c)|) subnets are selected from among the set Net(c)–Jog based on the following evaluation function F4. The selected subnets are added to the set Jog.

The evaluation function F4, the value of which is determined for each subnet, is defined so as to reflect the following items (1) to (3):

(1) the number NumJ of jogs that have been inserted in the original net in the previous process;

(2) length LenN of the interval of the original net; and (3) the number NumT of terminals of the original net.

That is, the function F4 is defined as $$F4 = \alpha''' \cdot NumJ + \beta''' \cdot LenN + \gamma''' \cdot NumT$$

where $\alpha'''$, $\beta'''$, and 65 ''' are non-negative constants. Desired preference order can be set for items (1) to (3) by properly setting the values of $\alpha'''$, $\beta'''$, and $\gamma'''$. For example, if they are set such that $\alpha''' > \beta''' > \gamma'''$ with sufficiently large differences therebetween, the evaluation function F4 is given such preference order that a highest preference is given to item (1) and the rank lowers in order of the item number.

S5D7: If terminal p is located at the right end of net np, np is deleted from Net. Similarly, if terminal q is located at the right end of net nq, nq is deleted from Net.

S5D8: If column c is not located at the right end of the channel routing region, c is updated to c+1 and the process goes to step S5D4.

S5D9: A jog inserting method will be described below. The reason why a jog needs to be inserted into a net at this step is that a track is divided by a routing prohibition figure. Therefore, in bending a route by inserting a jog, it is necessary to complete routing by effectively using the divided track. For a subnet that requires bent routing, no continuous track exists over the interval of the subnet due to the existence of a prohibition figure and no trunk-assignable track exists. In view of the above, it is attempted to divide the interval of a subnet into several intervals in the range of columns for which the above judgment becomes "NG" consecutively in consideration of the set PT of passable tracks.

As columns within the range are checked from left to right, for instance, a track that was not included previously is added and the number of elements of PT is increased. As columns are checked further, a track that belonged to PT before the track addition is deleted and a new track is added (at the same time). This kinds of element addition/deletion occurs due to the fact that a track is divided by a prohibition figure.

Now, attention is paid to column c' where the number of tracks increases and column c" where a track that previously belonged to PT (the number of elements has once increased) is deleted. Columns existing in the interval [c', c"] are employed as candidates positions for jog insertion. There is a possibility that a plurality of such intervals in the range of judgment results "NG". An actual inserting position is determined from the candidates based on the evaluation function F3 except that it should not be inside the interval [c', c"]. Based on the thus-determined jog inserting position, the routing prohibition constraint graph G and the net list N are updated.

(8-3) Advantages

Advantages of the eighth embodiment of the invention will be described below.

Even where no path exists in a prohibition constraint graph, there may occur, in a channel routing region where a track is divided by a routing prohibition figure, a case that a trunk of a subnet cannot be assigned to any track. According to the eighth embodiment of the invention, a subnet into which a jog should be inserted can be determined efficiently by determining, for each column c, a set RT_all(c) of assignable tracks and a set Net(c) of nets whose trunks should be assigned and comparing the numbers of elements of those sets. Further, it becomes possible to find a track assignment constraint that relates to a routing constraint figure that cannot be expressed by a prohibition constraint graph, and to deal with such a constraint by inserting a jog into a subnet.

(Example 1 of Embodiment 8)

The operation of a first example of the eighth embodiment of the invention will be described below in detail.

Figure 62A:
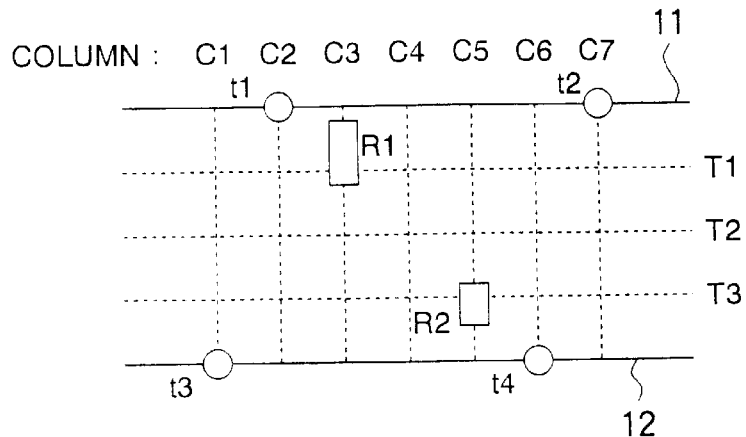

A consideration will be given to a channel routing region shown in FIG. 62A. A net list N={n1, n2}, where n1={t1, t4} and n2={t2, t3}. R1 and R2 are passage prohibition figures in both vertical and horizontal directions. Tracks are denoted by T1–T3 downward. Columns are denoted by C1–C7 rightward from the left end of the channel routing region.

First, at step S301, the above channel routing region is set. At step S302, the nets are divided into subnets in the following manner. Since each of nets n1 and n2 is a net connecting only two terminals, nets n1 and n2 themselves become subnets sn1 and sn2. Thus, a new net list N={sn1, sn2}.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. The sets AT(sn) of assignable tracks of the respective subnets sn are such that AT(sn1)={T2} and AT(sn2)={T2}.

No processing is performed at step S304 because there is no subnet whose AT is an empty set.

Figure 62B:

At step S3051 of step S305D, a prohibition constraint graph G is generated as shown in FIG. 62B, which consists of two isolated nodes corresponding to the respective subnets sn1 and sn2. At step S3052, constraint cycles existing in the prohibition constraint graph G are detected. No processing is performed at steps S3053 and S3054 because no constraint cycle exists in the prohibition constraint graph. Further, no search is performed at step S3055 because no directed branch exists in the prohibition constraint graph. Sets AT* of subnets sn1 and sn2 are such that AT*(sn1)={T2} and AT*(sn2)={T2}.

At steps S5D1–S5D8, a set RT_all(c) of tracks and a set Net(c) of subnets for each column c are calculated and a judgment result Flag(c) relating to a routing-impossible subnet is determined in the following manner. In the case of column C1, RT_all(C1)={T2} and Net(C1)={sn2}. Since |RT_all(C1)|≥|Net(C1)|, Flag(C1) is "OK". In the next column C2, RT_all(C2)={T2} and Net(C2)={sn1, sn2}. Since |RT_all(C2)|<|Net(C2)|, Flag(C2) is "NG". At step S5D6, a jog needs to be inserted into one subnet (|Net(C2)|–|RT_all(C2)|=1). In this example, the coefficients of the evaluation function F4 is set such that $\alpha'''=0$, $\beta'''=1$, and $\gamma'''=0$. The value of the function F4 becomes maximum with sn2, because the interval of sn1 is shorter than that of sn2. Thus, sn2 is selected as a subnet for jog insertion. Similarly, a set RT_all(c) of tracks and a set Net(c) of subnets are calculated for each of columns C3–C7 and a judgment result Flag(c) relating to a routing-impossible subnet is determined. Table 4 shows calculation results.

TABLE 4

| Column | C1 | C2 | C3 | C4 | C5 | C6 | C7 |
|---|---|---|---|---|---|---|---|
| PT | T1, T2, T3 | T1, T2, T3 | T2, T3 | T1, T2, T3 | T1, T2 | T1, T2, T3 | T1, T2, T3 |
| RT_all | T2 | T2 | T2 | T2 | T2 | T2 | T2 |
| Net | sn2 | sn1, sn2 | sn1, sn2 | sn1, sn2 | sn1, sn2 | sn1, sn2 | sn2 |
| \|RT_all\| | 1 | 1 | 1 | 1 | 1 | 1 | 1 |
| \|Net\| | 1 | 2 | 2 | 2 | 2 | 2 | 1 |
| Flag | OK | NG | NG | NG | NG | NG | OK |
| TH | T2, T3 | T1, T2 | T2, T3 | T1, T2, T3 | T1, T2 | T1, T2 | T2, T3 |

At step S5D9, a jog inserting position is determined for the subnet included in the set Jog. A consideration will be made of a jog inserting position of subnet sn2. As seen from Table 4, Flag is "NG" in columns C2–C6. By checking the set PT of passable tracks of each column rightward from column C2, it is found that track T1 is added at column C4. At column C5, track T3 that was an element of PT before the addition of track T1 at column C4 is deleted. In the range of columns C4–C5, a jog inserting position of subnet sn2 is determined based on the evaluation function F3. Columns C4 and C5 are equivalent to each other for the terms other than the third term of the function F3. Referring to the values of the third term, i.e., the number of elements of TH(c), it is found that column C4 maximizes the value of the function F3. Thus, column C4 is determined as the jog inserting position of subnet sn2. The prohibition constraint graph is updated as shown in FIG. 62C.

Figure 62C:
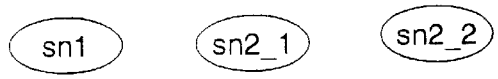

At step S306, a prohibition constraint subgraph G* is obtained which is the same as the graph of FIG. 62C.

At step S307, a set N* of subnets as a subject of the assignment process becomes such that N*={sn1, sn2_1, sn2_2}.

Figure 62D:
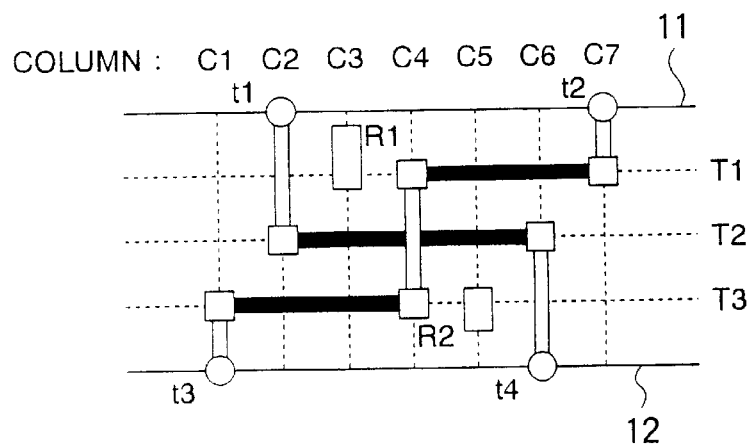

At step S308, trunks of the subnets of N* are assigned to tracks. FIG. 62D shows a result of the track assignment.

N becomes an empty set at step S309, and the routing process is finished at step S310.

(9) Embodiment 9 of the Invention
(9-1) Configuration

The configuration of a ninth embodiment of the invention will be described below in detail with reference to the drawings.

Figure 26:
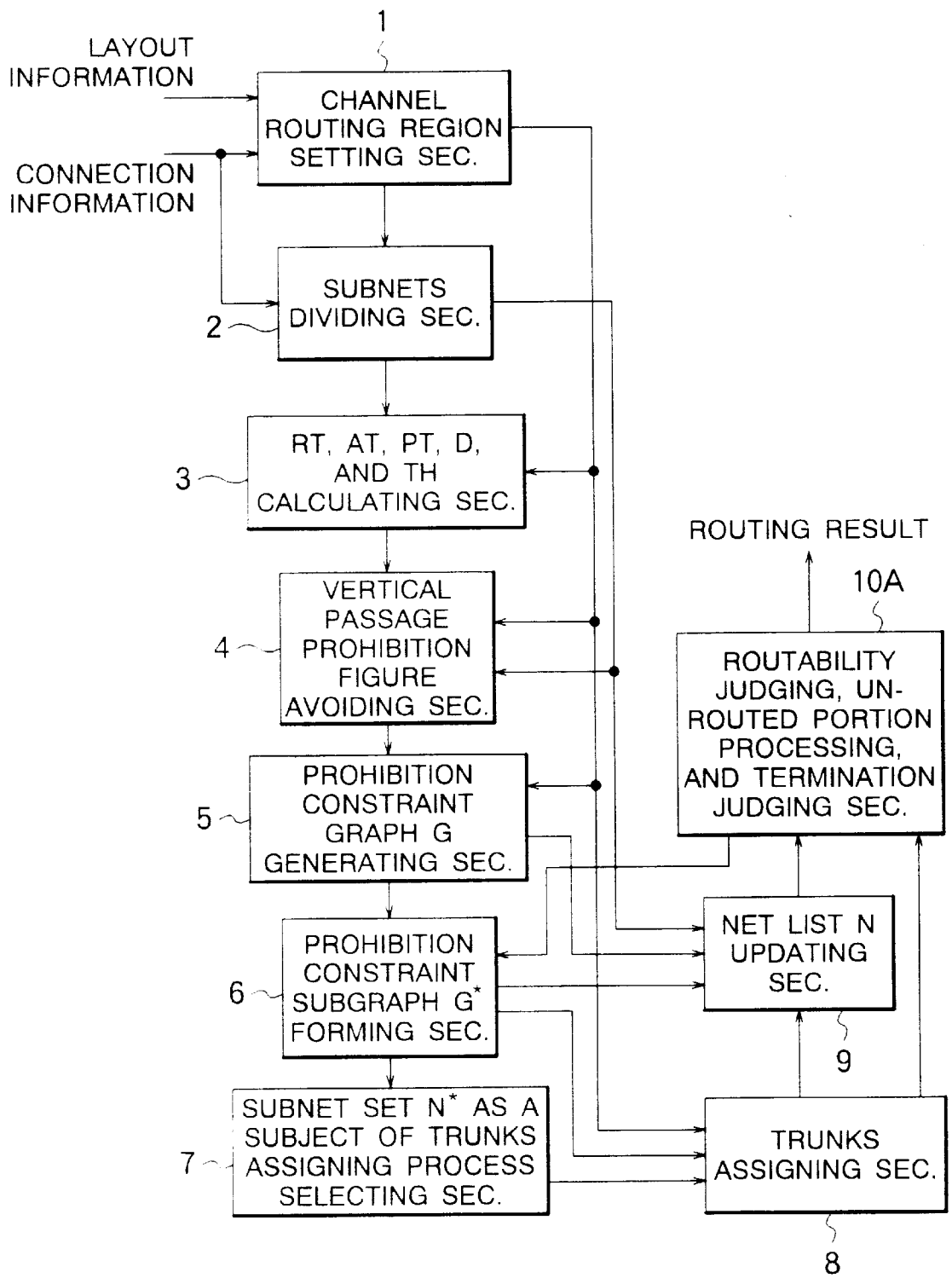
FIG. 26 is a block diagram showing the configuration of a ninth embodiment of the invention.

Referring to FIG. 26, the ninth embodiment is different from the first to eighth embodiments in that the routability and termination judging section 10 is replaced by a routability judging, unrouted portion processing, and termination judging section 10A.

The routability judging, unrouted portion processing, and termination judging section 10A performs an unrouted portion processing on subnets included in a set Rnot whose trunks could not be assigned to tracks by the trunks assigning section 8.

(9-2) Operation

The operation of the ninth embodiment of the invention will be described below in detail with reference to the drawings.

Figure 27:
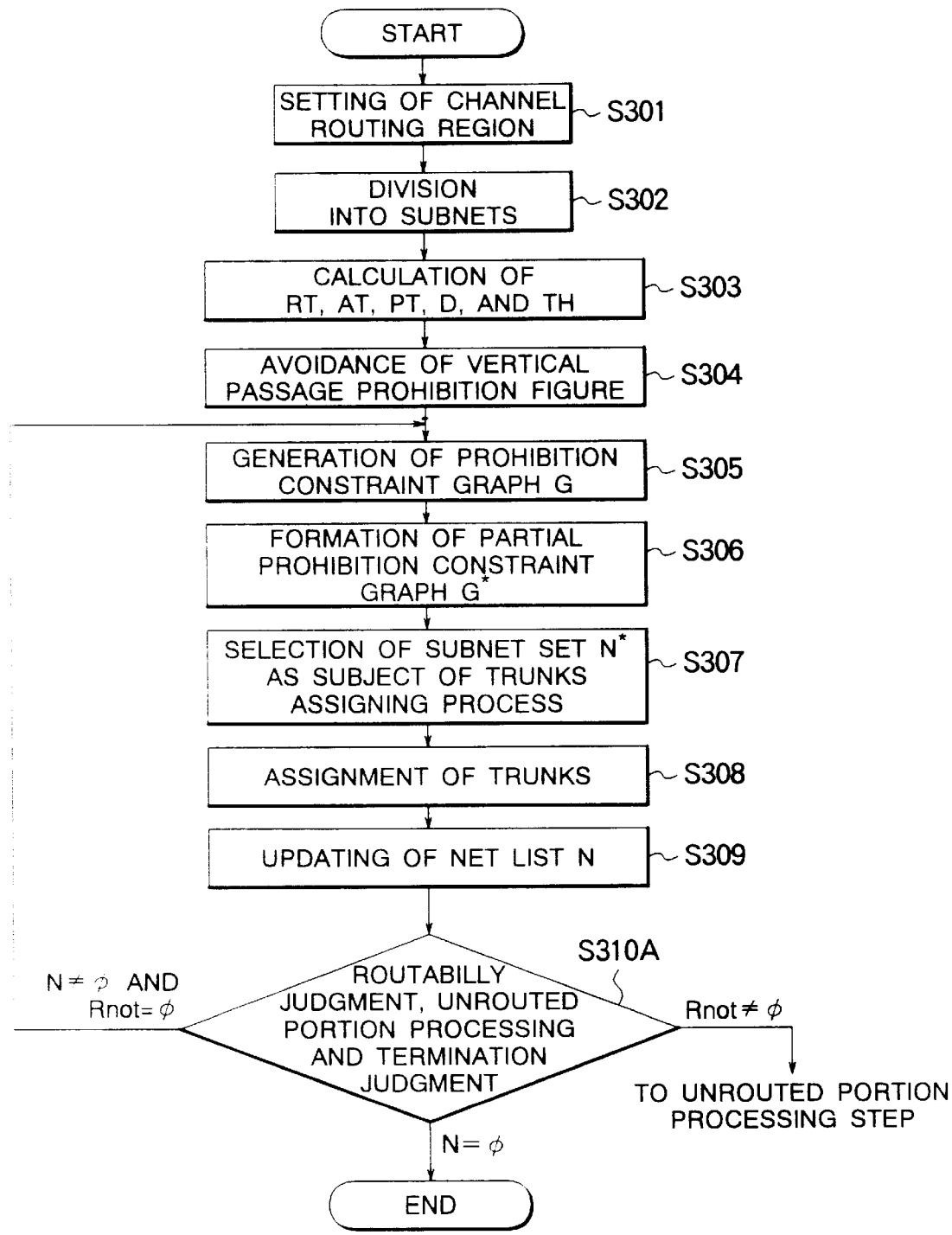
FIG. 27 is a flowchart showing the operation of the ninth embodiment of the invention.

Steps S301–S309 of the ninth embodiment shown in FIG. 27 are the same as in the first to eighth embodiments, and hence descriptions therefor will be omitted.

S310A (routability judgment, unrouted portion processing, and termination judgment): If Rnot is not an empty set, the net list N is made a set (N–N*) ∪ Rnot. Unrouted portion processing (for instance, a ripping-up and rerouting method based on a maze router or a line search router) is performed on each net of the net list N.

If Rnot is an empty set, it is judged whether the net list N is an empty set. If it is not an empty set, the process goes to step S305. If it is an empty set, the routing process is finished.

(9-3) Advantages

Advantages of the ninth embodiment of the invention will be described below.

In the ninth embodiment of the invention, unrouted portion processing is performed on a net for which track assignment could not be performed successfully. Therefore, a large routing factor can be assured for a fixed channel routing region.

(Example 1 of Embodiment 9)

The operation of a first example of the ninth embodiment of the invention will be described below in detail.

Figure 63A:
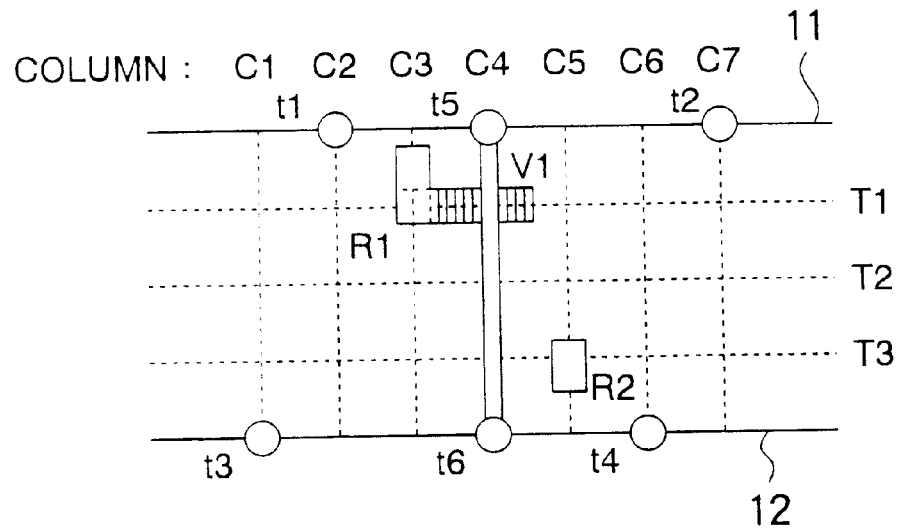

A consideration will be given to a channel routing region shown in FIG. 63A. A net list N={n1, n2}, where n1={t1, t4, t5, t6} and n2={t2, t3}. R1 and R2 are passage prohibition figures in both vertical and horizontal directions and V1 is a horizontal passage prohibition figure. Tracks are denoted by T1–T3 downward. Columns are denoted by C1–C7 rightward from the left end of the channel routing region. It is assumed that terminals t5 and t6 that are located at the top and bottom ends, respectively, of column C4 are routed in advance. When net n1 is divided into subnets, an imaginary terminal t5_6 will be introduced in place of terminals t5 and t6.

First, at step S301, the above channel routing region is set. At step S302, the nets are divided into subnets in the following manner. Net n1 is divided into sn1_1={t1, t5_6} and sn1_2={t5_6, t4}. Since net n2 is a net to connect only two terminals, net n2 itself becomes a subnet sn2. Thus, a new net list N={sn1_1, sn1_2, sn2}.

At step S303, a set RT(t) of reachable tracks of each terminal t, a set AT(sn) of assignable tracks of each subnet sn, a set PT(c) of passable tracks of each column c, a route density D(c), and a set TH(c) of through-hole settable tracks are calculated. The sets AT(sn) of assignable tracks of the respective subnets sn are such that AT(sn1_1)={T2, T3}, AT(sn1_2)={T2}, and AT(sn2)={T2}.

No processing is performed at step S304 because there is no subnet whose AT is an empty set.

Figure 63B:
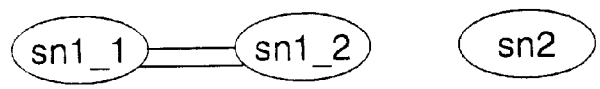

At step S3051 of step S305D, a prohibition constraint graph G is generated as shown in FIG. 63B. At step S3052, constraint cycles existing in the prohibition constraint graph G are detected. No processing is performed at steps S3053 and S3054 because no constraint cycle exists in the prohibition constraint graph. Further, no search is performed at step S3055 because no directed branch exists in the prohibition constraint graph. Sets AT* of the subnets are such that AT*(sn1_1)={T2, T3}, AT*(sn1_2)={T2}, and AT*(sn2)={T2}.

At steps S5D1–S5D8, a set RT_all(c) of tracks and a set Net(c) of subnets for each column c are calculated and a judgment result Flag(c) relating to a routing-impossible subnet is determined in the following manner. In the case of column C1, RT_all(C1)={T2} and Net(C1)={sn2}. Since |RT_all(C1)|‖|Net(C1)|, Flag(C1) is "OK". In the next column C2, RT_all(C2)={T2, T3} and Net(C2)={sn1_1, sn2}. Since |RT_all(C2)|‖|Net(C2)|, Flag(C2) is "OK". Similarly, Flag(C3) is also "OK". In the next column C4, RT_all(C4)= {T2} and Net(C4)={sn1_1, sn1_2 sn2}. Since |RT_all(C4)|<|Net(C4)|, Flag(C4) is "NG". At step S5D6, a jog needs to be inserted into one subnet (|Net(C4)|−|RT_all(C4)|=1). In this example, the coefficients of the evaluation function F4 is set such that α'''=0, β'''=1, and γ'''=0. The value of the function F4 becomes maximum with sn2, because the interval of sn1_2 is shorter than that of sn2. Thus, sn2 is selected as a subnet for jog insertion. Similarly, a set RT_all(c) of tracks and a set Net(c) of subnets are calculated for each of columns C5–C7 calculated and a judgment result Flag(c) relating to a routing-impossible subnet is determined. Table 5 shows calculation results.

TABLE 5

| Column | C1 | C2 | C3 | C4 | C5 | C6 | C7 |
|---|---|---|---|---|---|---|---|
| PT | T1, T2, T3 | T1, T2, T3 | T2, T3 | T1, T2, T3 | T1, T2 | T1, T2, T3 | T1, T2, T3 |
| RT_all | T2 | T2, T3 | T2, T3 | T2 | T2 | T2 | T2 |
| Net | sn2 | sn1_1 sn2 | sn1_1 sn2 | sn1_2 sn1_2 sn2 | sn1_2 sn2 | sn1_2 sn2 | sn2 |
| \|RT_all\| | 1 | 2 | 2 | 1 | 1 | 1 | 1 |
| \|Net\| | 1 | 2 | 2 | 2 | 2 | 2 | 1 |
| Flag | OK | OK | OK | NG | NG | NG | OK |
| TH | T2, T3 | T1, T2 | T2, T3 | T2 | T1, T2 | T1, T2 | T2, T3 |

At step S5D9, a jog inserting position is determined for the subnet included in the set Jog. A consideration will be made of a jog inserting position of subnet sn2. As seen from Table 5, Flag is "NG" in columns C4–C6. By checking the set PT of passable tracks of each column rightward from column C4, it is found that track T1 is added at column C4. At column C5, track T3 that was an element of PT before the addition of track T1 at column C4 is deleted. In the range of columns C4–C5, a jog inserting position of subnet sn2 is determined based on the evaluation function F3. Referring to the values of the third term, i.e., the number of elements of TH(c), it is found that column C4 maximizes the value of the function F3. Thus, column C4 is determined as the jog inserting position of subnet sn2. The prohibition constraint graph is updated as shown in FIG. 63C.

Figure 63C:

At step S306, a prohibition constraint subgraph G* is obtained which is the same as the graph of FIG. 63C.

At step S307, a set N* of subnets as a subject of the assignment process becomes such that N*={sn1_1, sn1_2, sn2_1, sn2_2}.

Figure 64A:
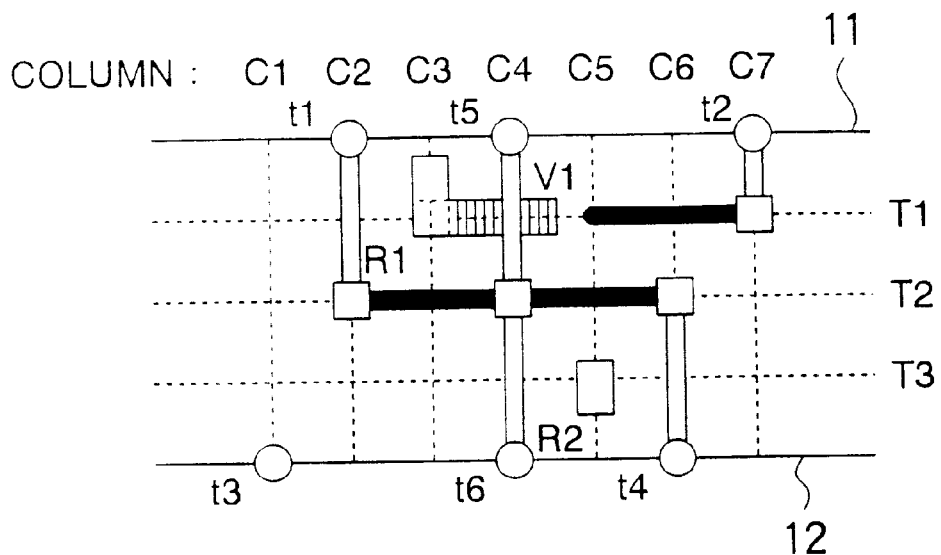

At step S308, it is attempted to assign trunks of the subnets of N* are assigned to tracks. However, due to the existence of the routing prohibition figures, it is impossible to assign a trunk of subnet sn2_1 to track T3. Thus, setting is made such that Rnot={sn2_1}. FIG. 64A shows a routing state at this time.

Figure 64B:
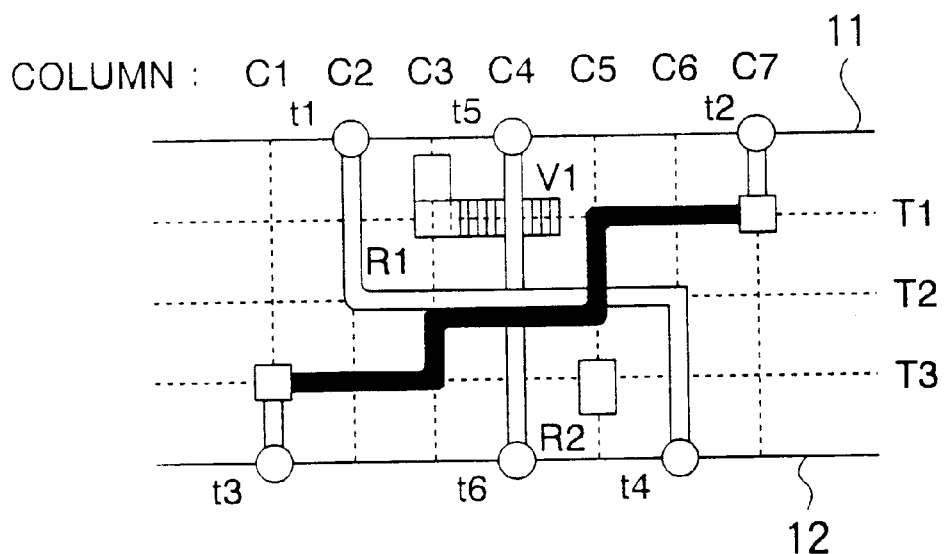

N becomes {sn2_1} at step S310A. Unrouted portion processing is performed on subnet sn2_1, whereby a routing result shown in FIG. 64B is obtained. The routing process is finished at step S310. In this example, ripping-up and rerouting is performed on net n1.

(10) Embodiment 10 of the Invention (10-1) Configuration

The configuration of a tenth embodiment of the invention will be described below in detail with reference to the drawings.

Figure 28:
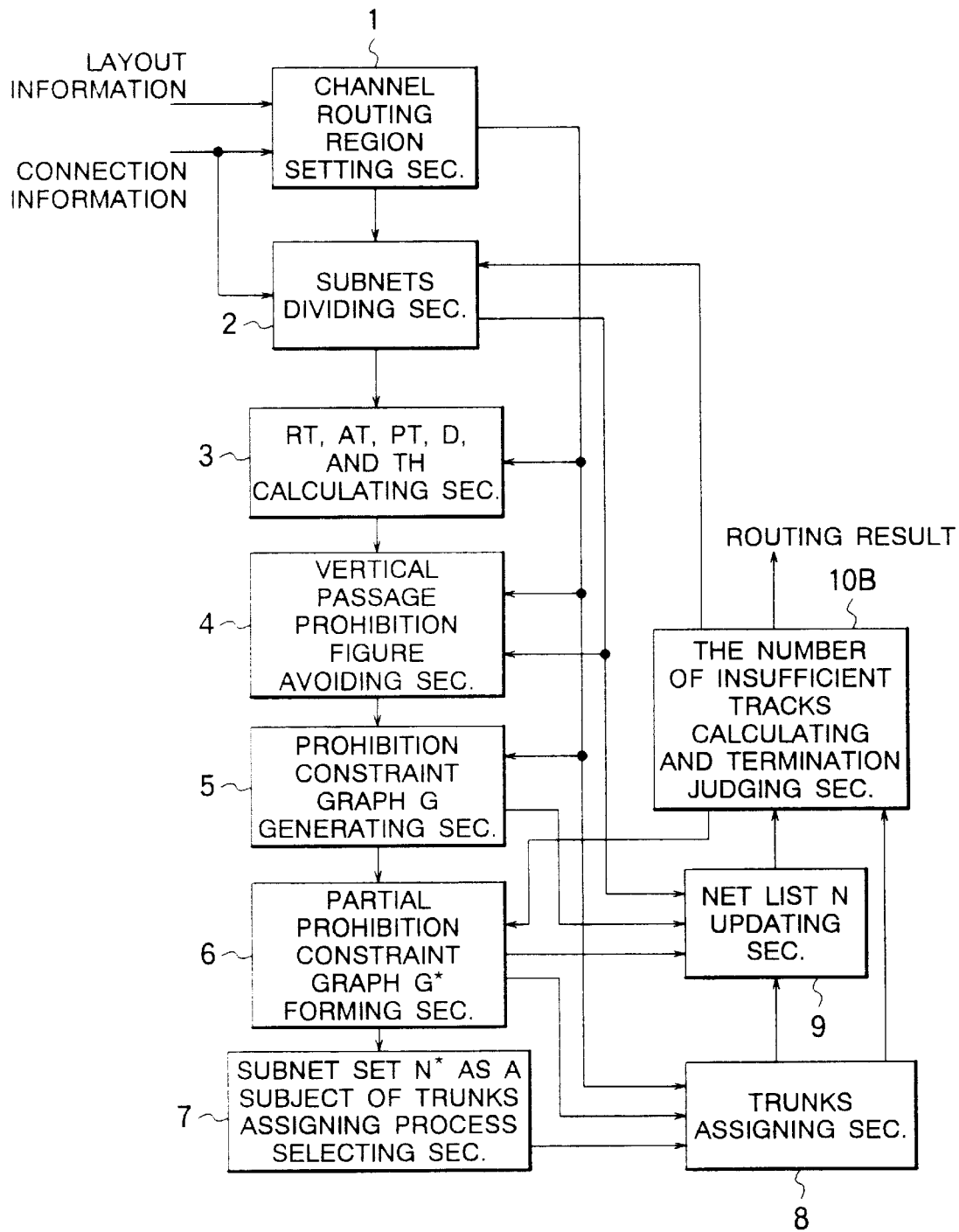
FIG. 28 is a block diagram showing the configuration of a tenth embodiment of the invention.

Referring to FIG. 28, the tenth embodiment is different from the first to eighth embodiments in that the routability and termination judging section 10 is replaced by a number-of-insufficient-tracks calculating and termination judging section 10B.

The number-of-insufficient-tracks calculating and termination judging section 10B sets, in a channel routing region, tracks that are necessary for assignment of trunks on subnets included in a set Rnot whose trunks could not be assigned to tracks by the trunks assigning section 8.

(10-2) Operation

The operation of the tenth embodiment of the invention will be described below in detail with reference to the drawings.

Figure 29:
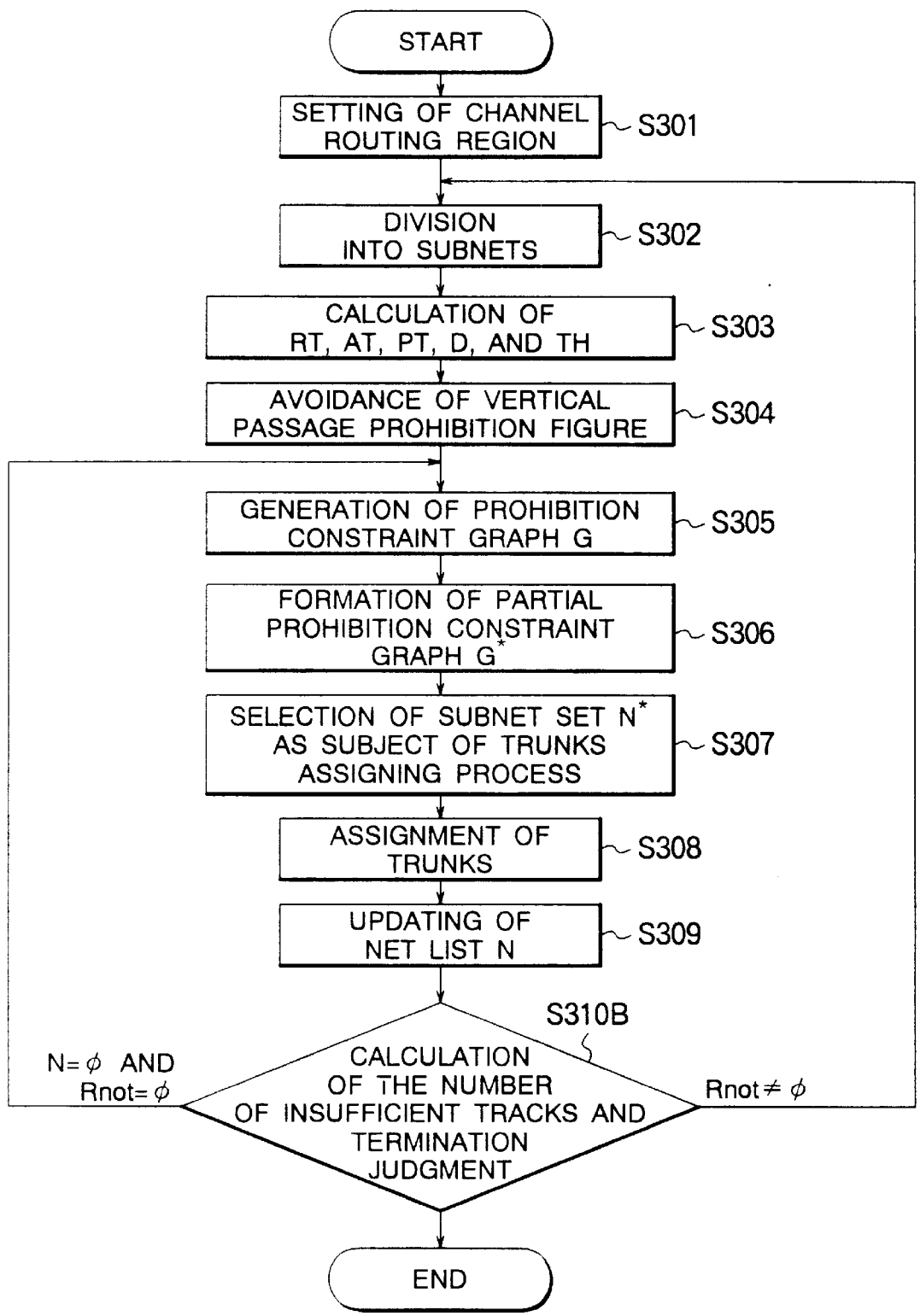
FIG. 29 is a flowchart showing the operation of the tenth embodiment of the invention.

Steps S301–S309 of the tenth embodiment shown in FIG. 29 are the same as in the first to eighth embodiments, and hence descriptions therefor will be omitted.

S310 B (calculation of the number of insufficient tracks and termination judgment): If Rnot is not an empty set, the bottom line of the channel routing region is moved downward by a distance of a positive integral number j (for instance, 1) of tracks and new tracks are set. Routes so far obtained are registered as routing prohibition figures based on wiring layers. Then the process goes to step S302.

If Rnot is an empty set, it is judged whether the net list N is an empty set. If it is not an empty set, the process goes to step S305. If it is an empty set, the routing process is finished.

(10-3) Advantages

Advantages of the tenth embodiment of the invention will be described below.

The tenth embodiment of the invention enables track assignment of nets for which track assignment could not be performed successfully by inserting a necessary number of tracks into a channel routing region. Therefore, a large routing factor can be assured in a case where the positions of routing prohibition figure in a channel routing region are fixed and the position of the top or bottom line of the channel routing region is variable. Further, after alteration of a channel routing region, information of routes of track-assignment-completed nets is used as it is and only the nets for which track assignment could not be performed successfully are further processed. Thus, the processing can be performed at high speed.

(Example 1 of Embodiment 10)

The operation of a first example of the tenth embodiment will be described below in detail.

A consideration will be given to the channel routing region shown in FIG. 63A which was used for the description of the first example of the ninth embodiment. Steps S301–S308 are the same as those of the first example of the ninth embodiment.

Figure 65A:
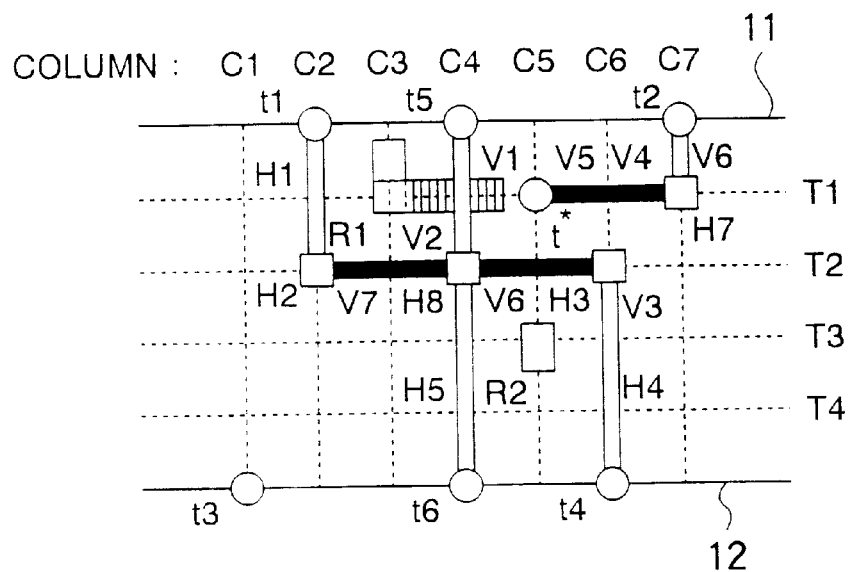

At step S310B, the bottom line of the channel routing region is moved downward by a distance of one track, to set a new track T4. As shown in FIG. 64B, the routes so far determined of subnets sn1_1, sn1_2, and sn2_2 are registered as routing prohibition figures. FIG. 65A shows a channel thus set.

Then, the routing process proceeds from step S302. Terminal t* that was introduced in inserting the jog into subnet sni is set at the left end of the route of subnet sn2_2. A net list N is such that N={sn2_1}, where sn2_1={t*, t3}. H1–H8 are vertical passage prohibition figures and V1–V7 are horizontal passage prohibition figures.

At step S303, a set AT(sn2_1) of assignable tracks of subnet sn2_1 becomes an empty set. Therefore, at step S303, to avoid the vertical passage prohibition figures, the position of terminal t* is moved from column C4 to column C7. Existing routes that are made unnecessary by the above movement of terminal t*, in this example, the routing prohibition figures H7, V4, and V5, are deleted.

Figure 65B:
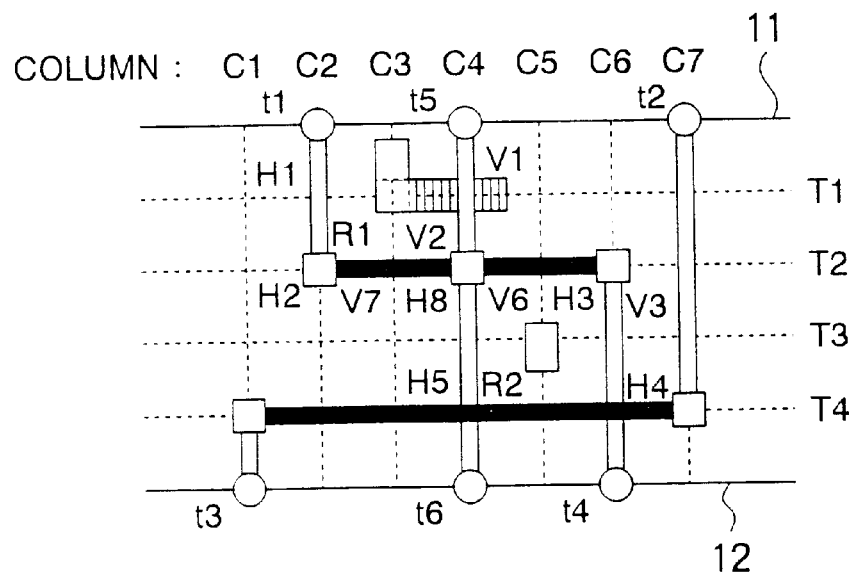

At step S308, routes shown in FIG. 65B are obtained.

(11) Embodiment 11 of the invention (11-1) configuration

The configuration of an eleventh embodiment of the invention will be described below in detail with reference to the drawings.

Figure 30:
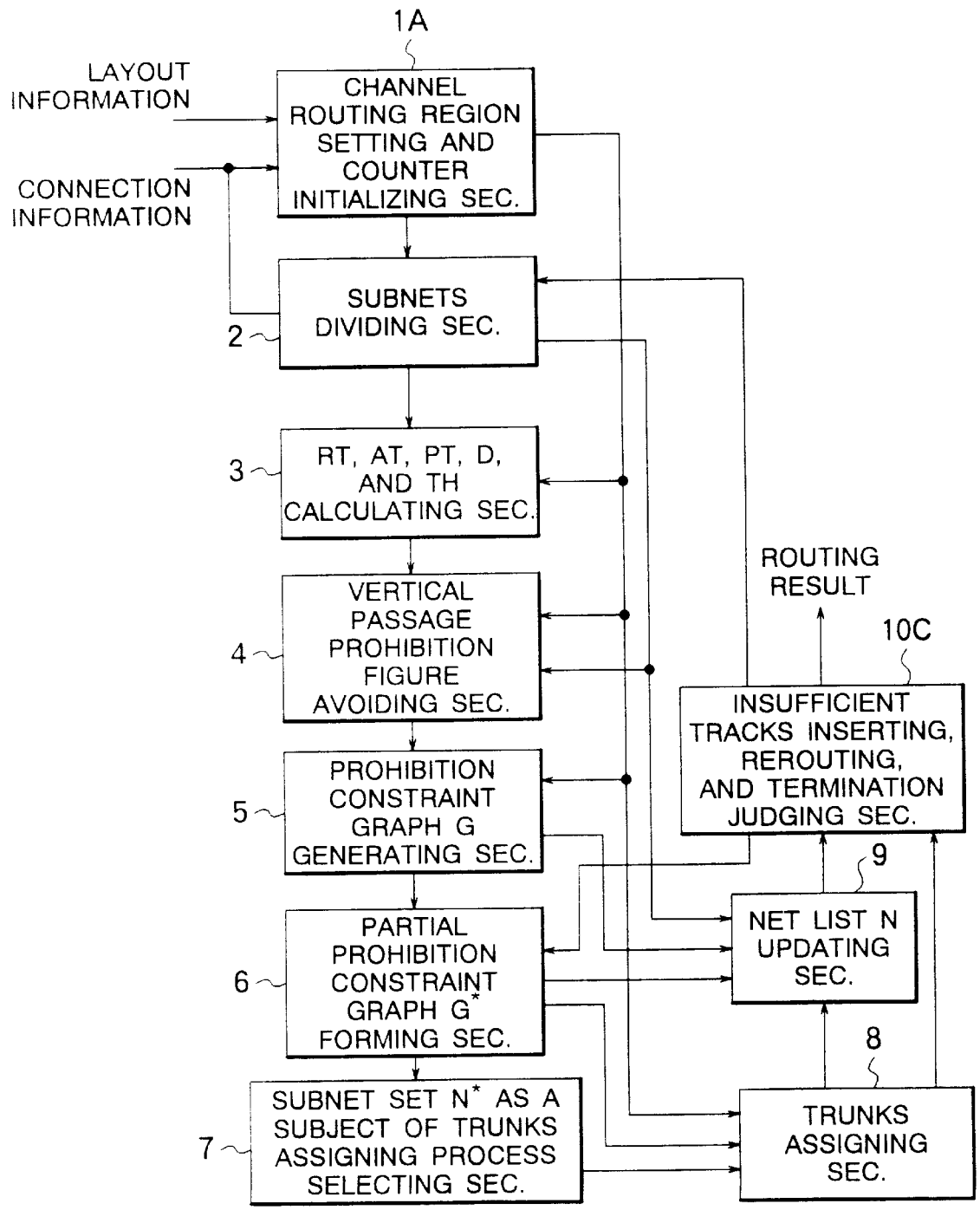
FIG. 30 is a block diagram showing the configuration of a eleventh embodiment of the invention.

Referring to FIG. 30, the eleventh embodiment is different from the first to eighth embodiments in that the channel routing region setting section 1 is replaced by a channel routing region setting and counter intializing section 1A and that the routability and termination judging section 10 is replaced by an insufficient tracks inserting, rerouting, and termination judging section 10C.

The channel routing region setting and counter intializing section 1A determines boundaries of a channel routing region based on positions of terminals to be connected to nets that belong to a net list and routing prohibition figures existing inside cells that are located at the top and bottom of the channel, and initializes a count New Track of a counter to 0.

First, the insufficient tracks inserting, rerouting, and termination judging section 10C sets tracks necessary to assign trunks of subnets that are included in Rnot in the channel routing region without changing the positions of the routing prohibition figures and determines the number of necessary tracks by continuing the routing. Then, after setting the determined number of new tracks, the section 10C moves movable routing prohibition figures and routes unrouted subnets by rerouting all nets.

(11-2) Operation

The operation of the eleventh embodiment of the invention will be described below in detail with reference to the drawings.

Figure 31:
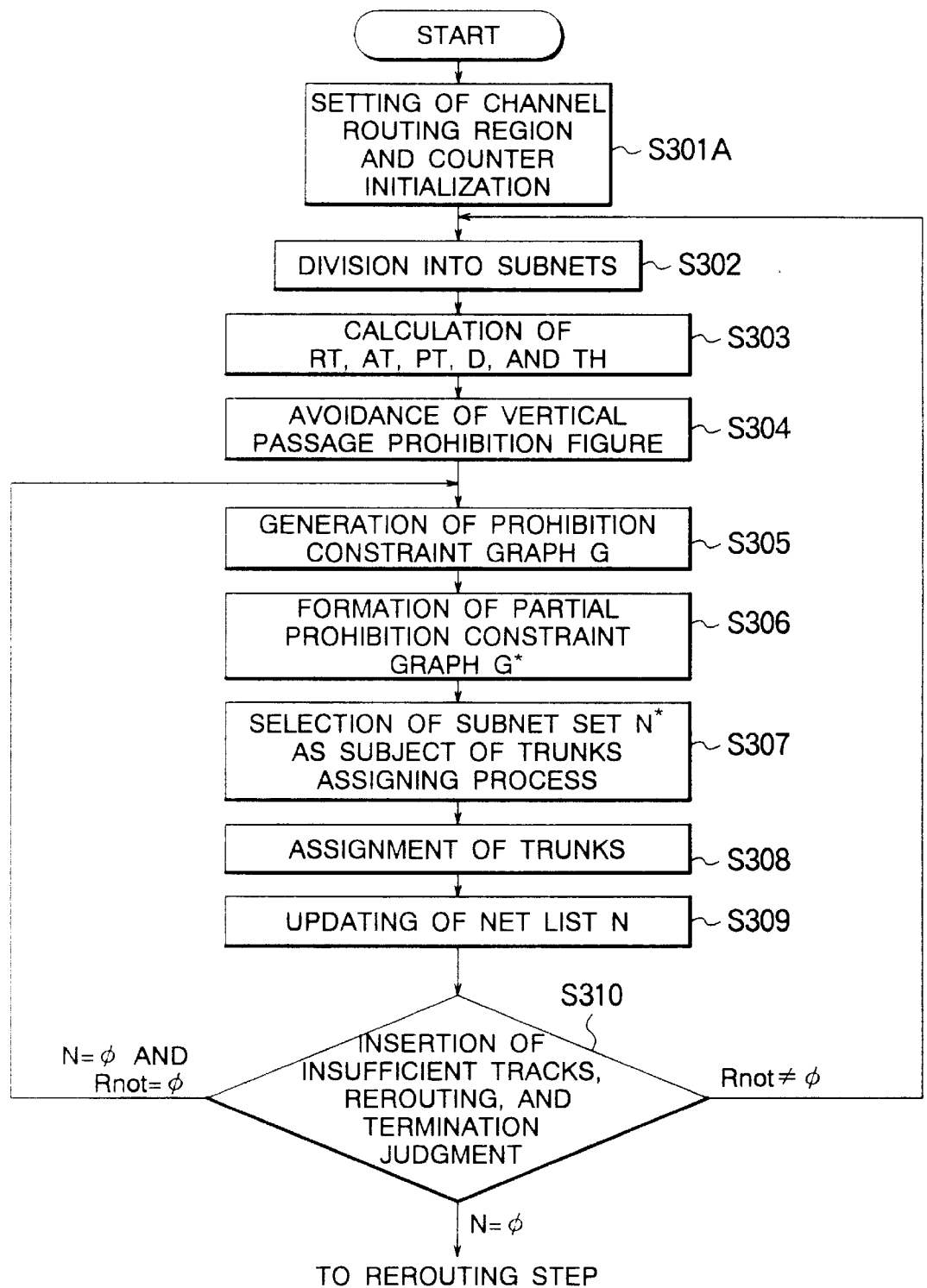
FIG. 31 is a flowchart showing the operation of the eleventh embodiment of the invention.

Steps S302–S309 of the eleventh embodiment shown in FIG. 31 are the same as in the first to eighth embodiments, and hence descriptions therefor will be omitted.

The following operation is performed at Step S301A of the eleventh embodiment.

S301A (setting of channel routing region and counter initialization): Boundaries of a channel routing region is determined based on positions of terminals to be connected to nets that belong to a net list N and routing prohibition figures existing inside cells that are located at the top and bottom of the channel. A counter New Track is initialized to 0.

The following operation is performed at Step S310C of the eleventh embodiment.

S310C (insertion of insufficient tracks, rerouting, and termination judgment): If R not is not an empty set, the bottom line of the channel routing region is moved downward by a distance of a positive integral number j (for instance, 1) of tracks and new tracks are set. The count New Track of the counter is changed to New Track+j. Routes so far obtained are registered as routing prohibition figures based on wiring layers. Then the process goes to step S302.

If Rnot is an empty set, it is judged whether the net list N is an empty set. If it is not an empty set, the process goes to step S305. If it is an empty set, the following process "rerouting" is executed. Process "rerouting":

S1: the routes so far obtained are deleted and the first given net list is set as N.

S2: Where rerouting is performed on the channel routing region that was initialized at step S1 (i.e., where the routing prohibition figures are not moved), the process goes to step S301A.

S3: The bottom line of the channel routing region that was input first is moved downward by a distance of tracks of the count New Track.

S4: A process "movement of routing prohibition figures and alteration of their shapes" is executed.

S5: The channel routing region that was set at step S2 is made a new channel routing region, and the process goes to step S301A. Process "movement of routing prohibition figures and alteration of their shapes":

If the given routing prohibition figures include figures that are movable downward, they are moved within an allowable range. If possible, a prohibition figure corresponding to a vertical segment of a power line or a clock line is changed in vertical length.

(11-3) Advantages

Advantages of the eleventh embodiment of the invention will be described below.

In the eleventh embodiment of the invention, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, since a necessary number of tracks are secured in a channel routing region in which new tracks have been set, rerouting from the beginning enables reduction in the number of inserted jogs. Further, in this embodiment, the number of necessary tracks is determined for nets for which track assignment could not be performed successfully while the positions of routing prohibition figures in a channel routing region is fixed and information of a routing result so far obtained is used as it is. Thus, the number of insufficient tracks can be calculated at high speed.

(Example 1 of Embodiment 11)

The operation of a first example of the eleventh embodiment will be described below in detail.

A consideration will be given to the channel routing region shown in FIG. 63A which was used for the description of the first example of the tenth embodiment. The same steps as in the first example of the tenth embodiment are executed until determination of the number of tracks necessary for routing of subnet sn2_1. That is, after the determination of the routes shown in FIG. 65B, the process "rerouting" is executed at step S310C.

Figure 66A:
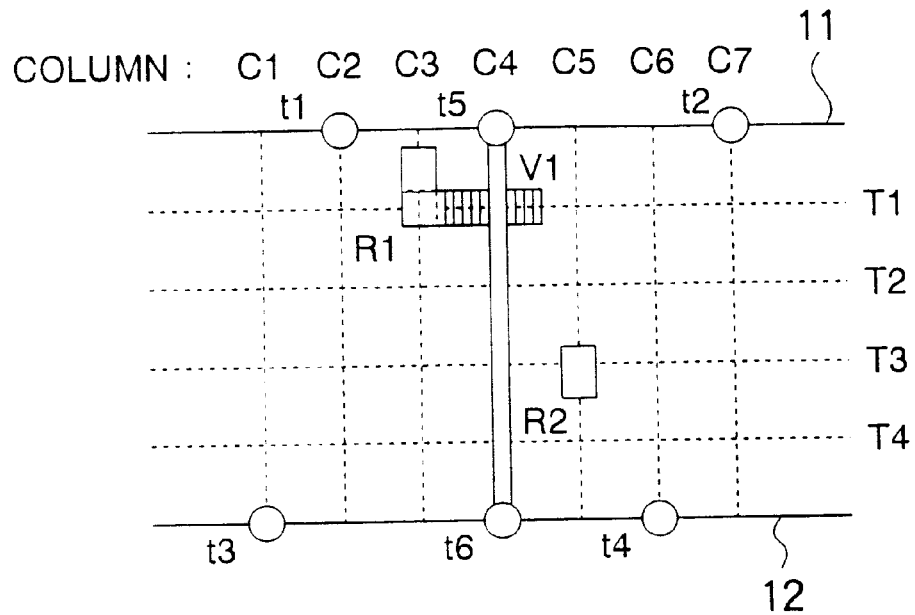

First, at step S1, the routes of FIG. 65B are deleted and a net list N becomes such that N={n1, n2}, where n1={t1, t4, t5, t6} and n2={t2, t3}. FIG. 66A shows a channel routing region at this time.

Figure 66B:
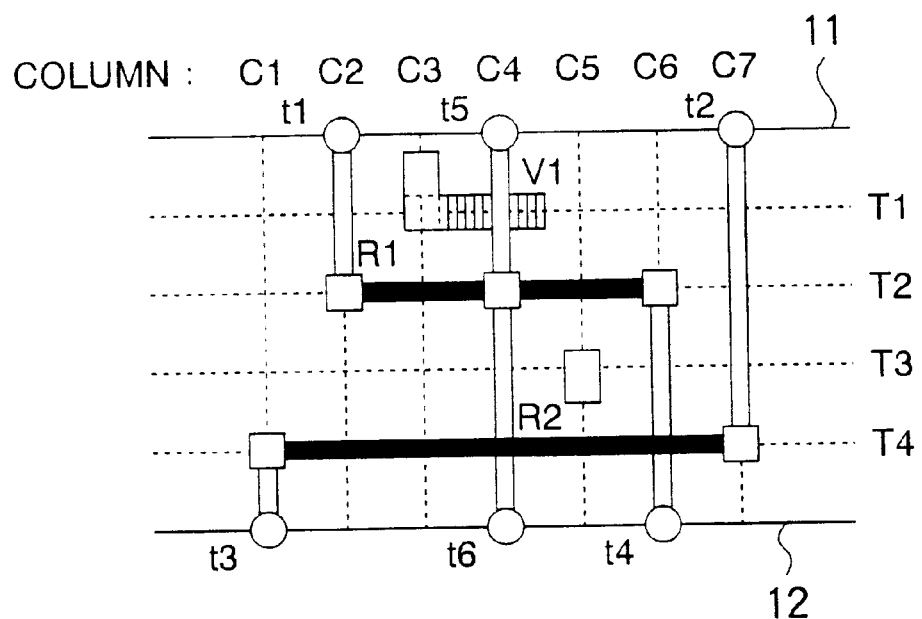

Next, a consideration will be given to a case of routing the channel routing region of FIG. 66A from the beginning without moving the routing prohibition figures at step S2. In the same manner as in the first example of the ninth embodiment, net n1 is divided into sn1_1={t1, t5_6} and sn1_2={t5_6, t4}. Net n2 itself becomes subnet sn2. The same processing as in the first example of the first embodiment is thereafter performed, to obtain a routing result shown in FIG. 66B. The routing process is finished.

Figure 67A:
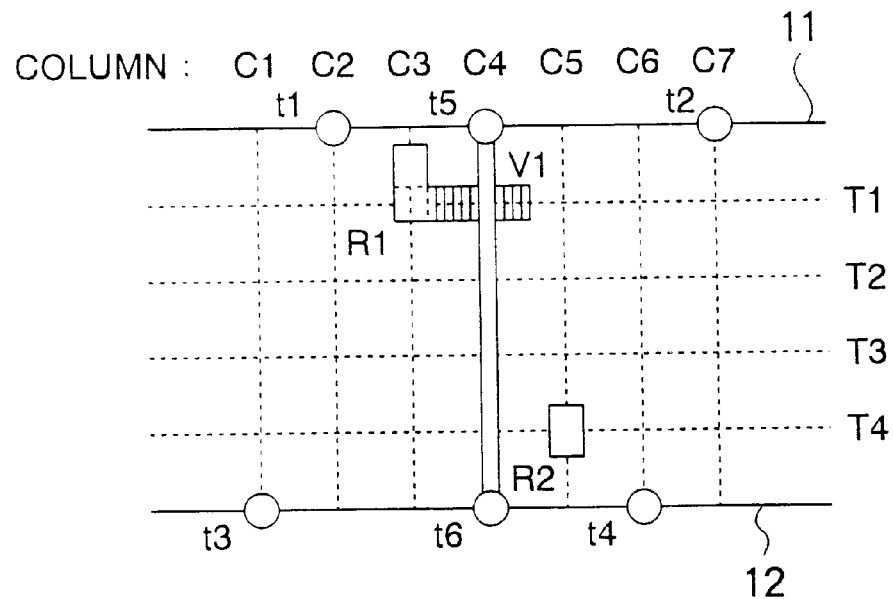
Figure 67B:
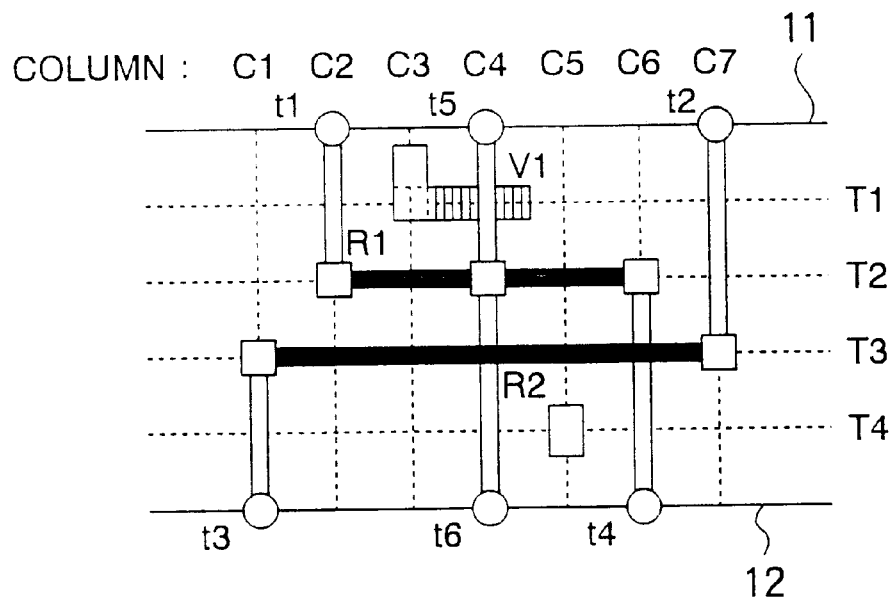

A consideration will be given to a case where the process "movement of routing prohibition figures and alteration of their shapes" is executed at step S3. It is now assumed that the prohibition figure R2 can be moved so as to follow a downward movement of the bottom line of the channel routing region. The channel routing region becomes as shown in FIG. 67A. The ensuing process is the same as described above. A routing result shown in FIG. 67B is obtained, and the routing process is finished.

(12) Embodiment 12 of the Invention
(12-1) Configuration

The configuration of a twelfth embodiment of the invention will be described below in detail with reference to the drawings.

Figure 32:
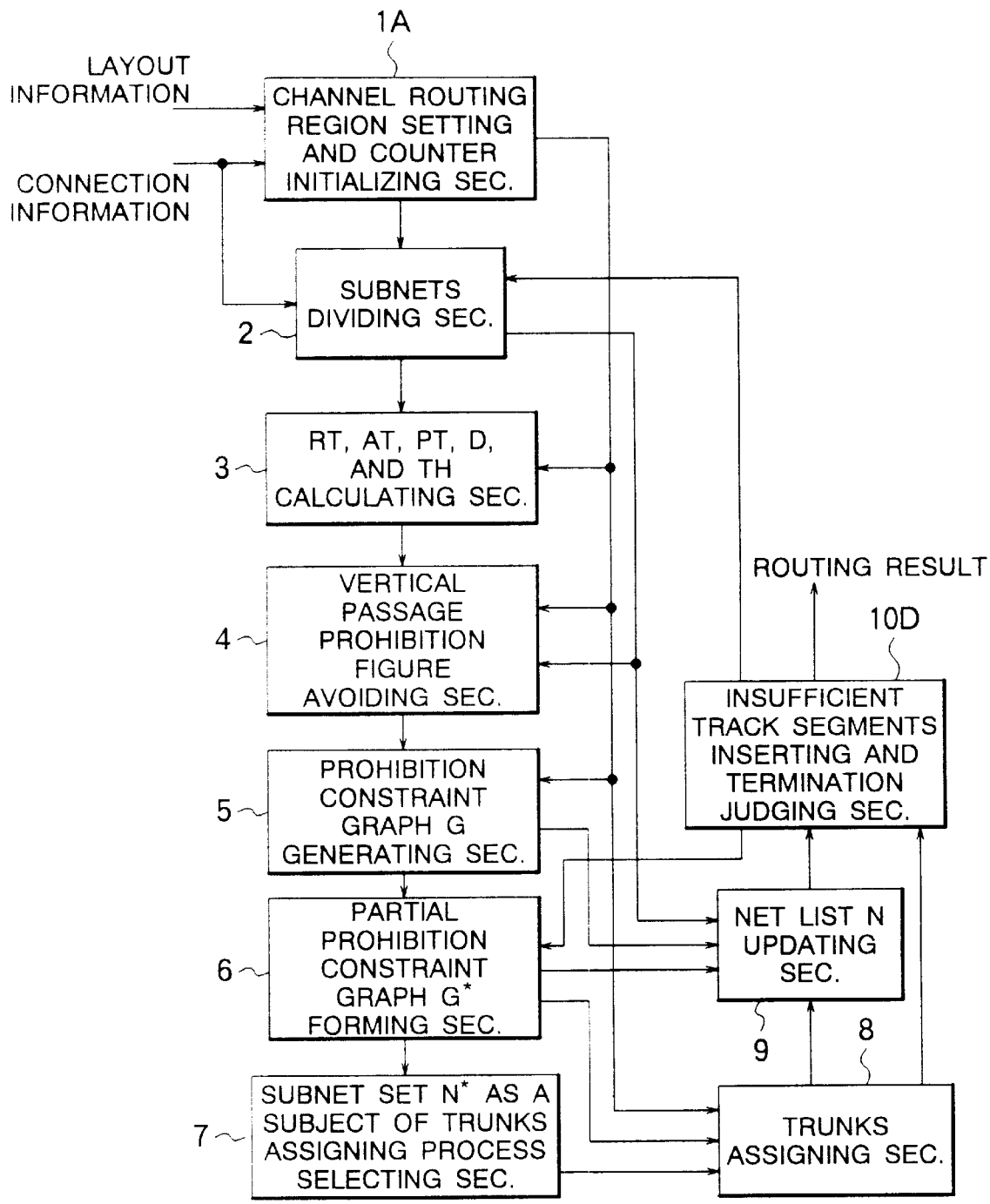
FIG. 32 is a block diagram showing the configuration of a twelfth embodiment of the invention.

Referring to FIG. 32, the twelfth embodiment is different from the eleventh embodiment in that the insufficient tracks inserting, rerouting, and termination judging section 10C is replaced by an insufficient track segments inserting and termination judging section 10D.

The insufficient track segments inserting and termination judging section 10D assigns trunks of subnets of Rnot to tracks by continuing routing after setting new tracks in a channel routing region and changing positions of movable routing prohibition figures.

(12-2) Operation

The operation of the twelfth embodiment of the invention will be described below in detail with reference to the drawings.

Figure 33:
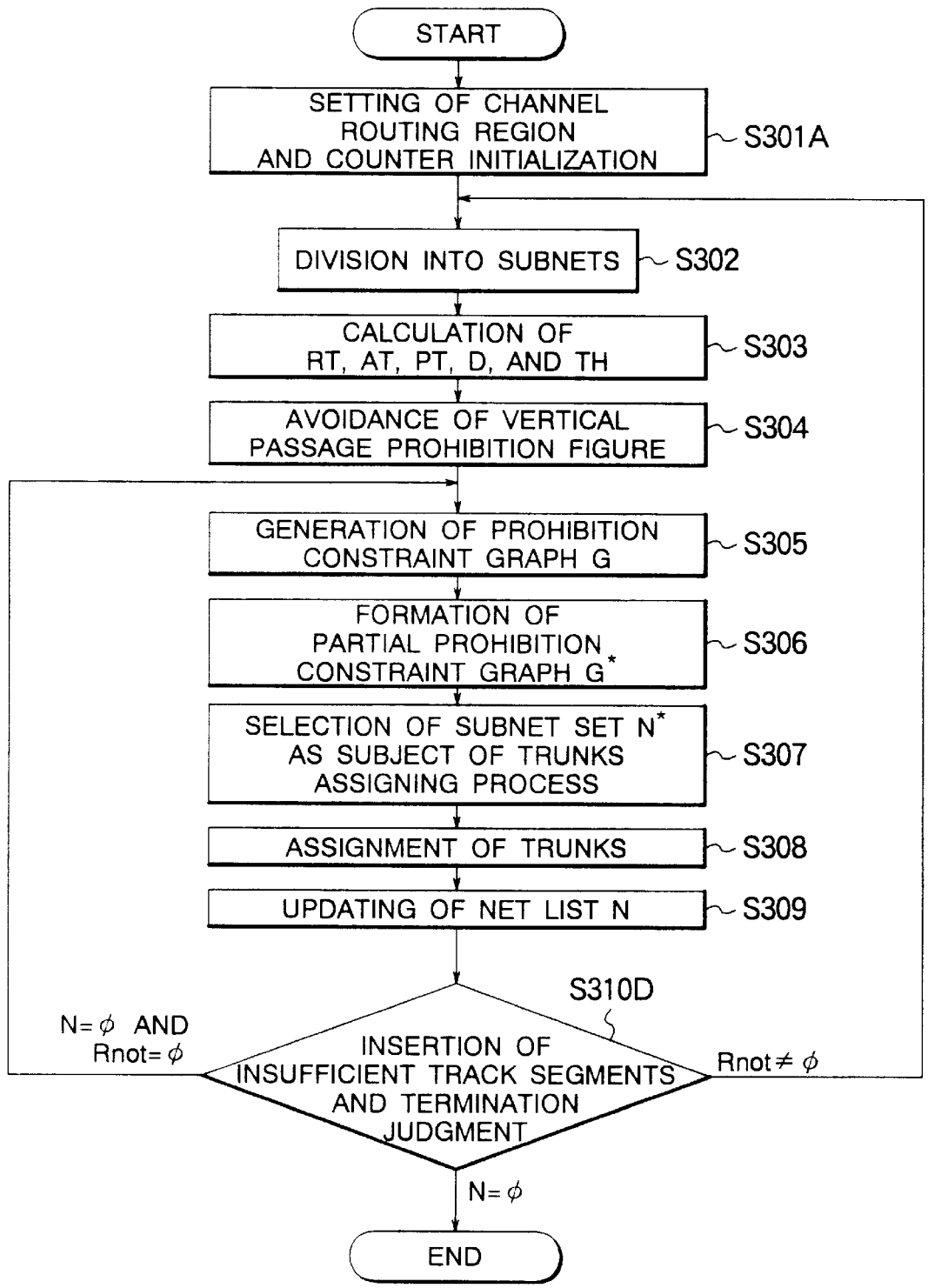
FIG. 33 is a flowchart showing the operation of the twelfth embodiment of the invention.

Steps S302–S309 of the twelfth embodiment shown in FIG. 33 are the same as in the first to eighth embodiments and step S301A of the twelfth embodiment is the same as in the eleventh embodiment, and hence descriptions therefor will be omitted.

S310D (insertion of insufficient track segments and termination judgment): If Rnot is not an empty set, the bottom line of the channel routing region is moved downward by a distance of a positive integral number j (for instance, 1) of tracks and new tracks are set. A count New Track of a counter is changed to New Track +j. Routes so far obtained are registered as routing prohibition figures based on wiring layers. The process "movement of routing prohibition figures and alteration of their shapes" which was explained above in describing the operation of the eleventh embodiment is executed, and the process goes to step S302.

If Rnot is an empty set, it is judged whether the net list N is an empty set. If it is not an empty set, the process goes to step S305. If it is an empty set, the routing process is finished.

In step S310 B of the tenth embodiment, the bottom line of a channel routing region (i.e., a cell row or a macro-cell that constitutes the bottom line boundary of the region) is moved downward by a distance of j tracks and j new tracks are set in an empty region thus produced. In this case, straight tracks extending from the left end to the right end of the channel routing region are set. In contrast, in step S310D of the twelfth embodiment, after the bottom line of a channel routing region (i.e., a cell row or a macro-cell that constitutes the bottom line boundary of the region) is moved downward by a distance of j tracks, routing prohibition figures in the channel routing region are moved and their shapes are altered. This corresponds to inserting track segments rather than setting straight tracks extending from the left end to the right end of the channel routing region. Since in the twelfth embodiment new tracks are set so as to be more similar to a final routing result, it is expected that the number of necessary tracks (i.e., the count New Track of the counter) that is calculated at step S310D of the twelfth embodiment is more appropriate than that calculated in step S310B of the tenth embodiment.

(12-3) Advantages

Advantages of the twelfth embodiment of the invention will be described below.

In the twelfth embodiment of the invention, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, at the occurrence of a net for which track assignment cannot be performed successfully, a necessary number of tracks is determined while the positions of routing prohibition figures in a channel routing region are moved after insertion of new tracks. This enables correct calculation of the number of insufficient tracks. Further, after alteration of a channel routing region, only nets for which track assignment could not be performed successfully are made a subject of processing while information of a routing result of track-assignment-completed nets is used as it is. Thus, this enables high-speed processing.

(Example 1 of Embodiment 12)

The operation of a first example of the twelfth embodiment will be described below in detail.

A consideration will be given to the channel routing region shown in FIG. 63A which was used for the description of the first example of the tenth embodiment. Steps S301–S308 of this example are the same as in the first example of the ninth embodiment.

At step S310D, the bottom line of the channel routing region is moved downward by a distance of one track, whereby track T4 is newly set. As shown in FIG. 63B, the routes of subnets sn1_1 and sn1_2 so far obtained are registered as routing prohibition figures.

Figure 68A:
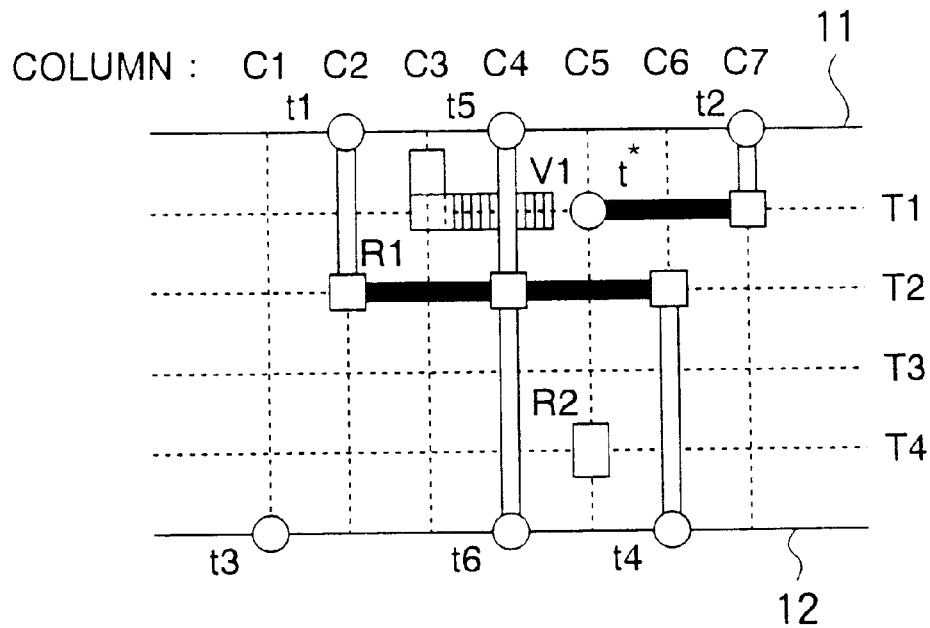
Figure 68B:
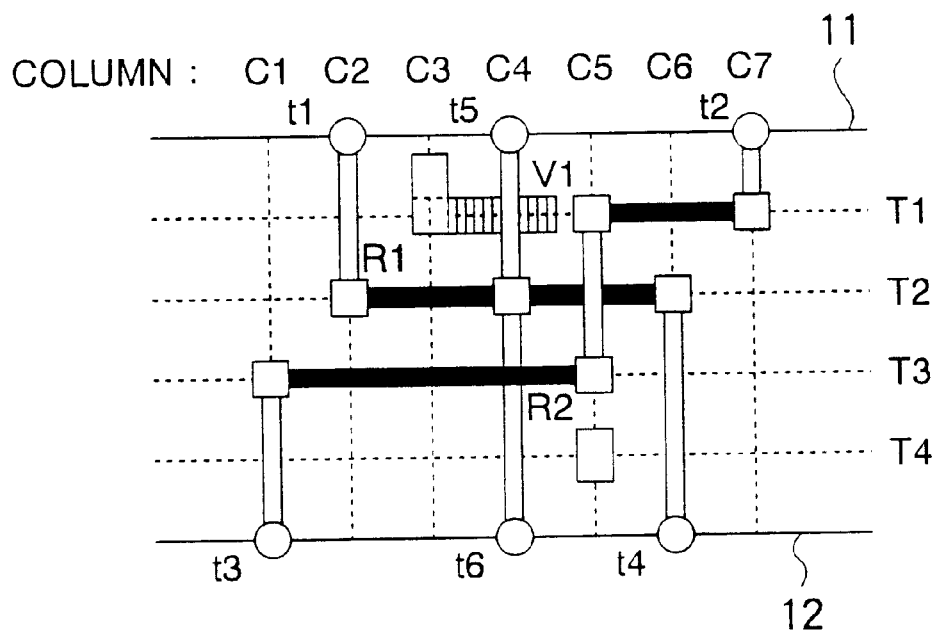

Next, the process "movement of routing prohibition figures and alteration of their shapes" is executed. It is now assumed that the prohibition figure R2 can be moved so as to follow a downward movement of the bottom line of the channel routing region. A channel routing region becomes as shown in FIG. 68A. A net list N={sn2_1}, where sn2_1= {t*, t3}. At step S308, a trunk of subnet sn2_1 is assigned to track T3. A routing result of FIG. 68B is obtained and the routing process is finished.

(13) Embodiment 13 of the Invention
(13-1) Configuration

The configuration of a thirteenth embodiment of the invention will be described below in detail with reference to the drawings.

Figure 34:
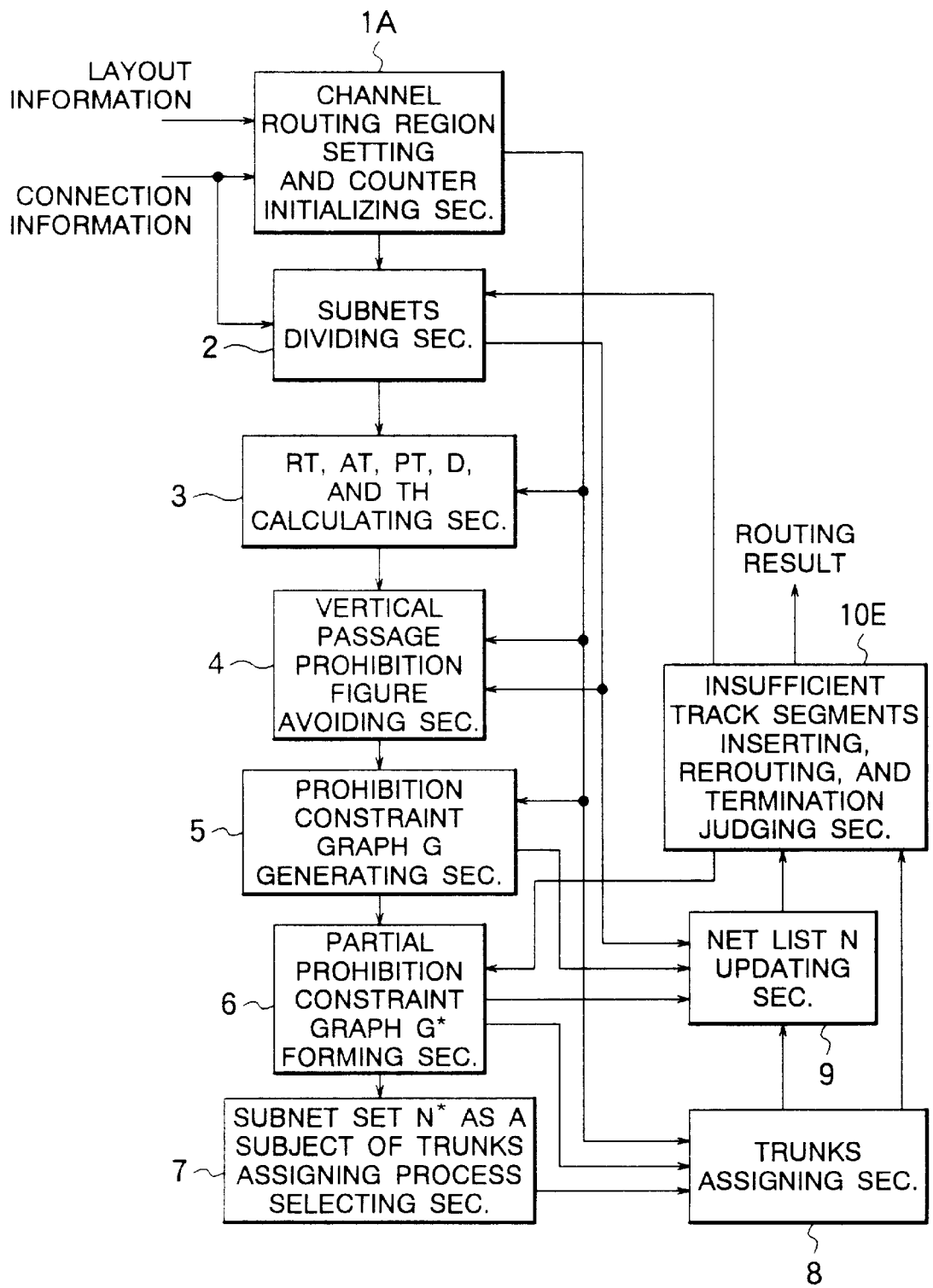
FIG. 34 is a block diagram showing the configuration of a thirteenth embodiment of the invention.

Referring to FIG. 34, the thirteenth embodiment is different from the twelfth embodiment in that the insufficient track segments inserting and termination judging section 10D is replaced by an insufficient track segments inserting, rerouting, and termination judging section 10E.

First, the insufficient track segments inserting, rerouting, and termination judging section 10E sets tracks necessary to assign trunks of subnets that are included in Rnot in the channel routing region and changes positions of movable routing prohibition figures, and then determines the number of necessary tracks by continuing the routing. Then, after setting the determined number of new tracks, the section 10E moves the movable routing prohibition figures and routes unrouted subnets by rerouting all nets.

(13-2) Operation

The operation of the thirteenth embodiment of the invention will be described below in detail with reference to the drawings.

Figure 35:
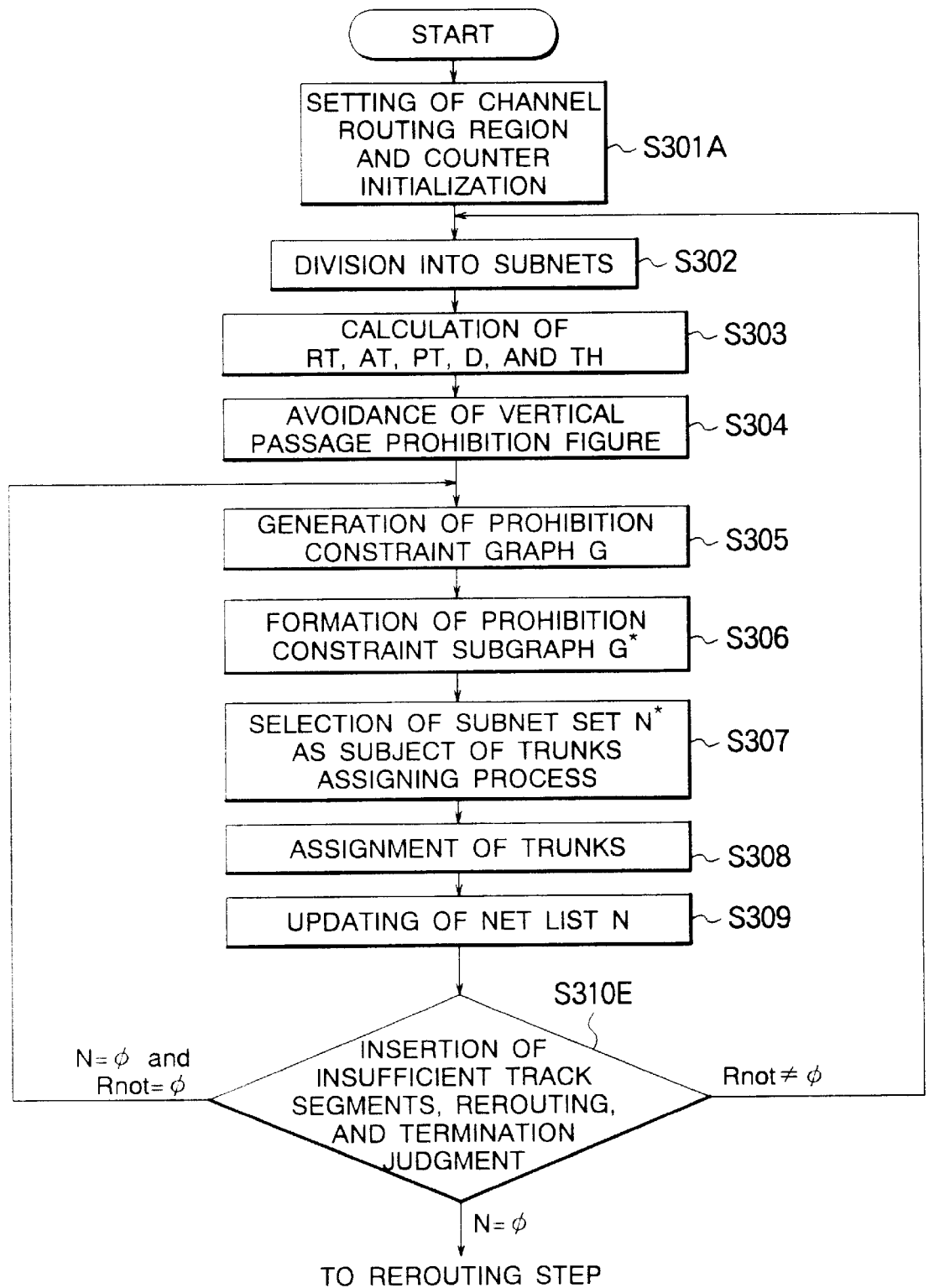
FIG. 35 is a flowchart showing the operation of the thirteenth embodiment of the invention.

Steps S301A–S309 of the thirteenth embodiment shown in FIG. 35 are the same as in the twelfth embodiments, and hence descriptions therefor will be omitted.

S310E (insertion of insufficient track segments, rerouting, and termination judgment): If Rnot is not an empty set, the bottom line of the channel routing region is moved downward by a distance of a positive integral number j (for instance, 1) of tracks and new tracks are set. The count New Track of the counter is changed to New Track +j. Routes so far obtained are registered as routing prohibition figures based on wiring layers. Then, the process "movement of routing prohibition figures and alteration of their shapes" which was explained above in describing the operation of the eleventh embodiment is executed, and the process goes to step S302.

If Rnot is an empty set, it is judged whether the net list N is an empty set. If it is not an empty set, the process goes to step S305. If it is an empty set, the following process "rerouting" which was explained above in describing the operation of the eleventh embodiment is executed.

(13-3) Advantages

Advantages of the thirteenth embodiment of the invention will be described below.

In the thirteenth embodiment of the invention, for nets for which track assignment could not be performed successfully, routing is performed from the beginning after a necessary number of tracks are newly inserted into a channel routing region and the positions of routing prohibition figures in the channel routing region are moved. Therefore, a large routing factor can be assured in a case where the positions of routing prohibition figures in a channel routing region are variable and the position of the top or bottom line of the channel routing region is also variable. Further, since a necessary number of tracks are secured in a channel routing region in which new tracks have been set, rerouting from the beginning enables reduction in the number of inserted jogs. Further, at the occurrence of a net for which track assignment cannot be performed successfully, a necessary number of tracks is determined while the positions of routing prohibition figures in a channel routing region are moved after insertion of new tracks. This enables correct calculation of the number of insufficient tracks.

(Example 1 of Embodiment 13)

The operation of a first example of the thirteenth embodiment will be described below in detail.

A consideration will be given to the channel routing region shown in FIG. 63A which was used for the description of the first example of the tenth embodiment. The same steps as in the first example of the twelfth embodiment are executed until determination of the number of tracks necessary for routing of subnet sn2_1. That is, after the determination of the routes shown in FIG. 68B, the process "rerouting" is executed at step S310 E.

First, at step S1, the routes of FIG. 68B are deleted and a net list N becomes such that N={n1, n2}, where n1={t1, t4, t5, t6} and n2={t2, t3}. FIG. 67A shows a channel routing region at this time.

Next, a consideration will be given to a case of routing the channel routing region of FIG. 67A from the beginning without moving the routing prohibition figures at step S2. This is done in the same manner as in the case where the process "movement of routing prohibition figures and alteration of their shapes" is executed in the first example of the eleventh embodiment. The routing result shown in FIG. 67B is obtained, and the routing process is finished.

Figure 69A:
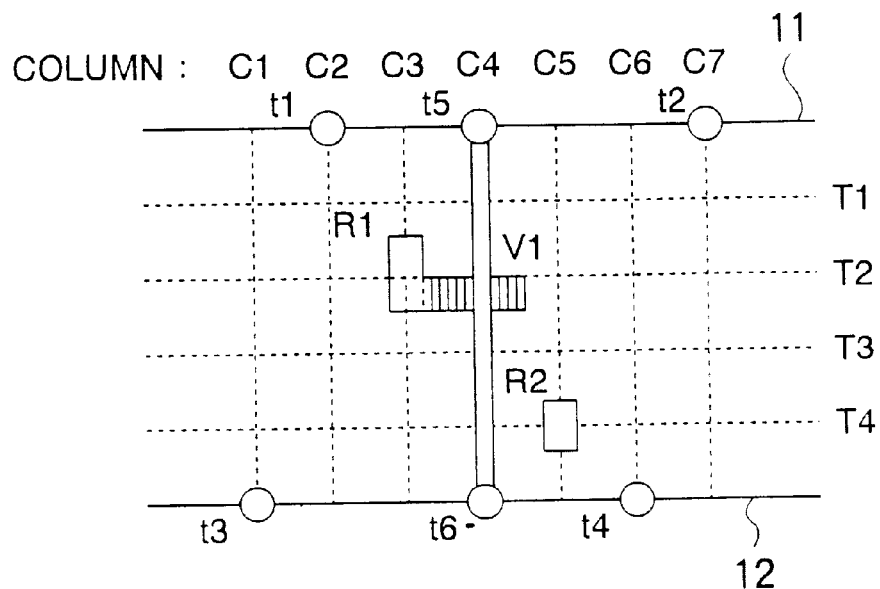
Figure 69B:
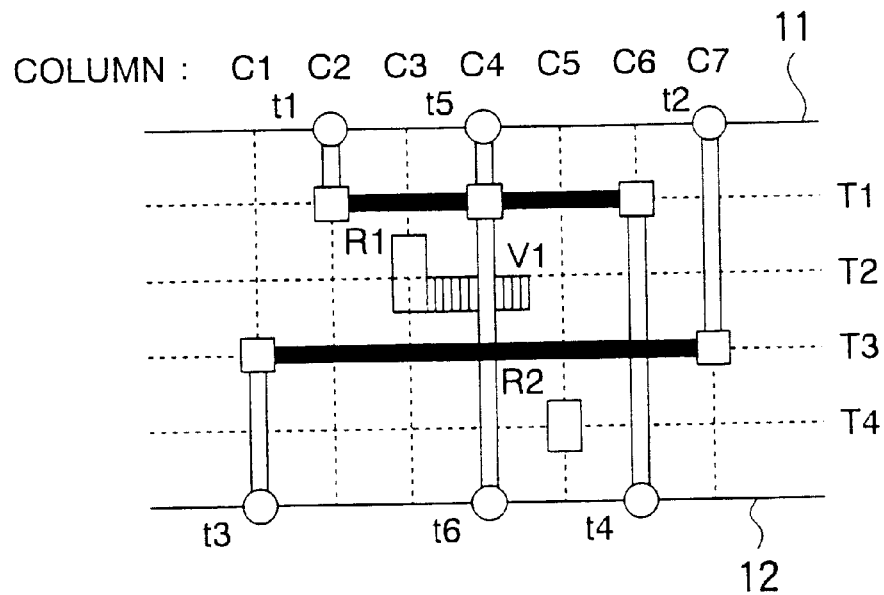

A consideration will be given to a case where the process "movement of routing prohibition figures and alteration of their shapes" is executed at step S3. It is now assumed that the prohibition figure R1 can be moved so as to follow a downward movement of the bottom line of the channel routing region. The channel routing region becomes as shown in FIG. 69A. The ensuing process is the same as described above. A routing result shown in FIG. 69B is obtained, and the routing process is finished.

Merits of the Invention

As described above, the invention provides the following merits (1) to (5):

(1) Routing can be performed so as to satisfy a given net list on channel routing regions incorporating routing prohibition figures for which conventional routing methods cannot complete routing.

(2) Where a boundary of a channel routing region is movable in the vertical direction, routing can be performed on the channel routing region to provide a minimum area.

(3) A route of each net included in a net list can be determined efficiently so as to satisfy constraints that result from relationships among the shapes and positions of routing prohibition figures and the positions of terminals existing in a channel routing region.

(4) Even where a constraint relating to the routing length such as a timing-related constraint is imposed on a net that is difficult to route due to obstruction from a routing prohibition figure existing in a channel routing region, a route can be determined so as to satisfy such constraint.

(5) There may occur a case that the entire trunk of a net cannot be assigned to a track because the track is divided by a routing prohibition figure existing in a channel routing region. In such a case, the number of through-holes that are added due to insertion of necessary jogs can be minimized.

Reasons 1-a) to 1-e) for merit (1) of the invention will be described below:

1-a) Routing that bypasses a routing prohibition figure is performed by the vertical passage prohibition figure avoiding process (first embodiment).

1-b) Even where a constraint cycle remains that could not be canceled by a method of assigning trunks of subnets to different tracks on a subnet-by-subnet basis, it is canceled by dividing a trunk of a subnet and assign resulting trunk portions to different tracks (sixth embodiment).

1-c) In assigning, to tracks, trunks of subnets corresponding to nodes that are included in a path existing in prohibition constraint graph, tracks are needed in a number of the nodes corresponding to the subnets. In the seventh embodiment of the invention, when there does not exist a sufficient number of tracks for assignment of all trunks of subnets due to the existence of routing prohibition figures in assigning trunks of subnets corresponding to nodes on a path that exits in a prohibition constraint graph, a trunk of a subnet is divided and assigned to different tracks (seventh embodiment).

1-d) A track assignment constraint relating to a routing prohibition figure which constraint cannot be expressed by a prohibition constraint graph is found, and a jog is inserted into a subnet (eighth embodiment).

1-e) Where a channel routing region is fixed, the unrouted portion process is executed on a net that could not be assigned any track (ninth embodiment).

Reasons 2-a) to 2-d) of merit (2) of the invention will be described below:

2-a) Where a boundary line of a channel routing region and the shape and position of a routing prohibition figure are variable in the vertical direction and there exists a track that is not assigned any trunk (free track), the free track is deleted and the height of the channel routing region is thereby reduced (first embodiment).

2-b) Where the position of a routing prohibition figure located in a channel routing region is fixed and the position of the top or bottom line of the channel routing region is variable, a necessary number of tracks are newly inserted into the channel routing region for a net for which track assignment failed (tenth embodiment).

2-c) Where the position of a routing prohibition figure located in a channel routing region is variable and the position of the top or bottom line of the channel routing region is also variable, for a net for which track assignment failed, routing is performed from the beginning after a necessary number of tracks are newly inserted into the channel routing region and the position of the routing prohibition figure in the channel routing region is moved (eleventh to thirteenth embodiments).

2-d) At the occurrence of a net for which track assignment cannot be performed, the number of necessary tracks is determined while the position of a routing prohibition figure existing in a channel routing region is moved after insertion of a new track. Thus, the number of insufficient tracks is calculated correctly (twelfth and thirteenth embodiments).

Reasons 3-a) to 3-h) for merit (3) of the invention will be described below:

3-a) A net is divided into subnets each of which is a set of two terminals in the process of division into subnets and constraints on those subnets are considered. Therefore, for one subnet, the number of constraints relating to other subnets can be reduced to two or less. As a result, in a prohibition constraint graph, the number of branches connected to a node corresponding to another subnet among branches connected to the node of the subnet concerned is two or less. Since the number of branches connected to the node concerned is restricted, such processes as a search and a deletion to be executed on the prohibition constraint graph can be made efficient (first embodiment).

3-b) A lead-out interconnection is drawn in advance from a terminal that is located within the range of a vertical passage prohibition figure to avoid the prohibition figure. Therefore, it is possible to easily accommodate, without complicating an ensuing routing process, even a case where it is difficult to determine a route due to a circumstance relating to layout positions of routing prohibition figures (second embodiment).

3-c) A subnet to be connected to a terminal that is located within the range of a vertical passage prohibition figure is routed in advance to avoid the prohibition figure. Therefore, such a subnet can be eliminated from the subject of an ensuing routing process. Thus, it is possible to easily accommodate, without complicating the routing process, even a case where there exists a subnet whose route is difficult to determine due to a circumstance relating to layout positions of routing prohibition figures (third embodiment).

3-d) To avoid a vertical passage prohibition figure, the entire original net of a subnet to be connected to a terminal that is located within the range of the prohibition figure is routed in advance. Therefore, subnets of such a net can be eliminated from the subject of an ensuing routing process. Thus, it is possible to easily accommodate, without complicating the routing process, even a case where there exists a net whose route is difficult to determine due to a circumstance relating to layout positions of routing prohibition figures (fourth embodiment).

3-e) A subnet that requires jog insertion is determined efficiently by calculating a set of assignable effective tracks (seventh embodiment).

3-f) Even where no path exists in a prohibition constraint graph, there may occur, in a channel routing region where a track is divided by a routing prohibition figure, a case that a trunk of a subnet cannot be assigned to any track. A subnet into which a jog should be inserted is determined efficiently by determining, for each column c, a set RT_all(c) of assignable tracks and a set Net(c) of nets whose trunks should be assigned and comparing the numbers of elements of those sets (eighth embodiment).

3-g) After alteration of a channel routing region, information of routes of track-assignment-completed nets is used as it is and only the nets for which track assignment could not be performed successfully are further processed (tenth and twelfth embodiments).

3-h) The number of necessary tracks is determined for nets for which track assignment could not be performed successfully while the positions of routing prohibition figures in a channel routing region are fixed and information of a routing result so far obtained is used as it is. Thus, the number of insufficient tracks can be calculated at high speed (eleventh embodiment).

Reasons 4-a) and 4-b) for merit (4) of the invention will be described below:

4-a) Since a subnet to be connected to a terminal that is located within the range of a prohibition figure is routed before other nets, a route between terminals of the subset which route satisfies a timing-related constraint is set with preference over routes of other nets (third embodiment).

4-b) Since a net to be connected to a terminal that is located within the range of a prohibition figure is routed before other nets, a route between terminals of the net which route satisfies a timing-related constraint is set with preference over routes of other nets (fourth embodiment).

Reasons 5-a) to 5-c) for merit (5) of the invention will be described below:

5-a) A constraint cycle existing in a prohibition constraint graph is detected and canceled by dividing a net. Therefore, it is possible to assign a trunk of one net to different tracks on a subnet-by-subnet basis rather than assign the trunk of the net to a single track. Further, a jog is inserted into only a column where a terminal included in a net exists (fifth embodiment).

5-b) Constraint cycles existing in a prohibition constraint graph are detected and canceled first by dividing nets. Then, only the constraint cycles that could not be canceled by the net division are canceled by inserting a jog into a subnet. A jog is inserted, with reference, to a column on which a terminal that is included in a net, and then a jog is inserted into a column on which no terminal is located for constraint cycles that still remain uncanceled (sixth embodiment).

5-c) Since a necessary number of tracks are secured in a channel routing region in which new tracks have been set, rerouting from the beginning enables reduction in the number of inserted jogs (eleventh and thirteenth embodiments).

What is claimed is:

1. A routes designing method for an integrated circuit in which detailed interconnection routes such as wiring layers, interconnection passage positions, and interconnection shapes or circuit parts layout positions are present for a routing region, comprising:

a first step of setting a channel routing region based on information about terminals that belong to cells adjacent to said routing region, prohibition information about interconnections belonging to cells, and information about connections between terminals;

a second step of dividing a net into subnets based on positional information of terminals existing in said channel routing region and connection information of said terminals, and setting a net list N as a set of subnets;

a third step of calculating a set RT(t) of reachable tracks of each terminal t, a set AT(n) of assignable tracks of each subnet n included in said net list N, a set PT(c) of passable tracks of each column c, a route density D(c), and a set TH(c) of through-hole settable tracks for information about routing prohibition figures in said channel routing region and said net list N;

a fourth step of executing a process of avoiding, among said routing prohibition figures existing in said channel routing region, a vertical passage prohibition figure that obstructs routing of subnet n whose set AT(n) in said net list N is an empty set;

a fifth step of generating a prohibition constraint graph G representing constraints that relate to vertical passage prohibition figures and terminals based on positions of said routing prohibition figures and said terminals existing in said channel routing region, said net list N, and a result of said process of avoiding a vertical passage prohibition figure;

a sixth step of forming a prohibition constraint subgraph $G^*=(V^*, E^*)$ that is a graph of said prohibition constraint subgraph G by executing a node/branch deleting process on said prohibition constraint graph G;

a seventh step of setting, as a subnet set $N^*$ as a subject of a trunks assigning process, a set of subnets corresponding to nodes that are included in a node set $V^*$ of said prohibition constraint subgraph $G^*$;

an eighth step of assigning trunks of said subnets belonging to said set $N^*$ based on information about said routing prohibition figures and said terminals existing in said channel routing region while regarding said prohibition constraint subgraph $G^*$ as a directed graph representing vertical constraint relationships relating to said set $N^*$;

a ninth step of updating said net list N to $N-N^*$, and setting a graph that is obtained by deleting said prohibition constraint subgraph $G^*$ from said prohibition constraint graph G as a new prohibition constraint graph G; and a tenth step of judging whether said trunks of all said subnets of said set $N^*$ have been assigned to tracks by said trunks assigning section, outputting an error signal if there remains an unassigned subnet, judging whether said net list N as updated by said net list N updating section is an empty set if all said subnets have been assigned, if it is an empty set, in a case where boundary lines of said channel routing region and shapes and positions of said routing prohibition figures are variable in a vertical direction and a free track remains that is a track not assigned any trunk, deleting said free track, changing said positions of said boundary lines of said channel routing region and said shapes of said routing prohibition figures and moving said routing prohibition figures, and reducing a height of said channel routing region, and terminating a routing process.

2. A routes designing method according to claim 1, comprising, in place of said fourth step, a terminal lead-out step of setting, to avoid a vertical passage prohibition figure, a new terminal by drawing an interconnection from a terminal existing in a range of said prohibition figure to a position that enables avoidance of said prohibition figure.

3. A routes designing method according to claim 1, comprising, in place of said fourth step, a subnet prerouting step of setting, to avoid a vertical passage prohibition figure, a new terminal for a connection to another terminal belonging to an original set by routing a subnet that has a terminal existing in a range of said prohibition figure.

4. A routes designing method according to claim 1, comprising, in place of said fourth step, a net prerouting step of routing, to avoid a vertical passage prohibition figure, an original net of a subnet that has a terminal existing in a range of said prohibition figure.

5. A routes designing method according to any one of claims 1–4, comprising, in place of said fifth step, a prohibition constraint graph G generating and net dividing step comprising:

a prohibition constraint graph constructing step of constructing a prohibition constraint graph G representing constraints that relate to vertical passage prohibition figures and terminals based on positions of said routing prohibition figures and said terminals existing in said channel routing region, said net list N, and a result of said process of avoiding a vertical passage prohibition figure;

a constraint cycles detecting step of detecting a constraint cycle or cycles existing in said prohibition constraint graph G; and a net dividing step of dividing a net included in said detected constraint cycle to cancel said detected constraint cycle.

6. A routes designing method according to any one of claims 1–4, comprising, in place of said fifth step, a prohibition constraint graph G generating and subnet jog inserting step comprising:

a prohibition constraint graph constructing step of constructing a prohibition constraint graph G representing constraints that relate to vertical passage prohibition figures and terminals based on positions of said routing prohibition figures and said terminals existing in said channel routing region, said net list N, and a result of said process of avoiding a vertical passage prohibition figure;

a constraint cycles detecting step of detecting a constraint cycle or cycles existing in said prohibition constraint graph G;

a net dividing step of dividing a net included in said detected constraint cycle to cancel said detected constraint cycle; and a subnet jog inserting step of canceling a constraint cycle that could not be canceled by said net dividing step among said constraint cycle or cycles detected by said constraint cycles detecting step by inserting a jog into a subnet corresponding to a node that is included in said constraint cycle.

7. A routes designing method according to claim 5, comprising a prohibition constraint graph G generating and path cutting step comprising, in addition to said prohibition constraint graph G generating step or said prohibition constraint graph G generating and subnet jog inserting step:

a path cutting step of cutting a path in said prohibition constraint graph G by detecting a subnet that cannot be routed by a single trunk due to obstruction from a routing prohibition figure, and inserting a jog into said detected subnet.

8. A routes designing method according to claim 7, comprising a prohibition constraint graph G generating and subnet jog additionally inserting step comprising, in addition to said prohibition constraint graph G generating and path cutting step:

a subnet jog additionally inserting step of selecting candidate subnets into which a jog should be inserted based on a relationship between said number of trunk-assignable tracks and said number of subnets whose trunks should be assigned to tracks, and determining a jog inserting position.

9. A routes designing method according to any one of claims 1–4, comprising, in place of said tenth step, a routability judging, unrouted portion processing, and termination judging step of executing a unrouted portion process on subnets included in a set Rnot of subnets whose trunks could not be assigned to tracks by said eighth step.

10. A routes designing method according to any one of claims 1–4, comprising, in place of said tenth step, a number-of-insufficient-tracks calculating and termination judging step of newly setting, in said channel routing region, tracks necessary for assignment of trunks of subnets included in a set Rnot of subnets whose trunks could not be assigned to tracks by said eighth step.

11. A routes designing method according to any one of claims 1–4, comprising, in place of said first step:
a channel routing region setting and counter initializing step of determining boundaries of a channel routing region based on positions of terminals to be connected to nets that belong to a net list N and routing prohibition figures existing inside cells that are located at a top and a bottom of a channel, and initializing a counter to 0, and further comprising, in place of said tenth step:
an insufficient tracks inserting, rerouting, and termination judging step of setting, in said channel routing region, tracks necessary to assign trunks of subnets included in a set Rnot of subnets whose trunks could not be assigned to tracks by said eighth step without changing positions of said routing prohibition figures, determining said number of necessary tracks by continuing said routing, newly setting said determined number of tracks, moving movable routing prohibition figures, and rerouting all nets, to thereby route unrouted subnets.

12. A routes designing method according to claim 11, comprising, in place of said insufficient tracks inserting, rerouting, and termination judging step, an insufficient track segments inserting and termination judging step of newly setting tracks in said channel routing region, changing positions of movable routing prohibition figures, and executing a rerouting process, to thereby assign trunks of subnets included in a set Rnot of subnets whose trunks could not be assigned to tracks by said eighth step.

13. A routes designing method according to claim 11, comprising, in place of said insufficient tracks inserting, rerouting, and termination judging step, an insufficient track segments inserting, rerouting, and termination judging step of setting, in said channel routing region, tracks necessary to assign trunks of subnets included in a set Rnot of subnets whose trunks could not be assigned to tracks by said eighth step, changing positions of movable routing prohibition figures, determining said number of necessary tracks by continuing said routing, newly setting said determined number of tracks, moving movable routing prohibition figures, and rerouting all nets, to thereby route unrouted subnets.

14. A routes designing apparatus for an integrated circuit in which detailed interconnection routes such as wiring layers, interconnection passage positions, and interconnection shapes or circuit parts layout positions are preset for a routing region, comprising:
a channel routing region setting section for setting a channel routing region based on information about terminals that belong to cells adjacent to said routing region, prohibition information about interconnections belonging to cells, and information about connections between terminals;
a subnets dividing section for dividing a net into subnets based on positional information of terminals existing in said channel routing region and connection information of said terminals, and for setting a net list N as a set of subnets;
a RT, AT, PT, D, and TH calculating section for calculating a set RT(t) of reachable tracks of each terminal t, a set AT(n) of assignable tracks of each subnet n included in said net list N, a set PT(c) of passable tracks of each column c, a route density D(c), and a set TH(c) of through-hole settable tracks for information about routing prohibition figures in said channel routing region and said net list N;
a vertical passage prohibition figure avoiding section for executing a process of avoiding, among said routing prohibition figures existing in said channel routing region, a vertical passage prohibition figure that obstructs routing of subnet n whose set AT(n) in said net list N is an empty set;
a prohibition constraint graph G generating section for generating a prohibition constraint graph G representing constraints that relate to vertical passage prohibition figures and terminals based on positions of said routing prohibition figures and said terminals existing in said channel routing region, said net list N, and a result of said process of avoiding a vertical passage prohibition figure;
a prohibition constraint subgraph G* forming section for forming a prohibition constraint subgraph G*=(V*, E*) that is a subgraph of said prohibition constraint graph G by executing a node/branch deleting process on said prohibition constraint graph G;
a subnet set N* selecting section for setting, as a subnet set N* as a subject of a trunks assigning process, a set of subnets corresponding to nodes that are included in a node set V* of said prohibition constraint subgraph G*;
a trunks assigning section for assigning trunks of said subnets belonging to said set N* based on information about said routing prohibition figures and said terminals existing in said channel routing region while regarding said prohibition constraint subgraph G* as a directed graph representing vertical constraint relationships relating to said set N*;
a net list N updating section for updating said net list N to N–N*, and for setting a graph that is obtained by deleting said prohibition constraint subgraph G* from said prohibition constraint graph G as a new prohibition constraint graph G; and
a routability and termination judging section for judging whether said trunks of all said subnets of said set N* have been assigned to tracks by said trunks assigning section, outputting an error signal if there remains an unassigned subnet, judging whether said net list N as updated by said net list N updating section is an empty set if all said subnets have been assigned, if it is an empty set, in a case where boundary lines of said channel routing region and shapes and positions of said routing prohibition figures are variable in a vertical direction and a free track remains that is a track not assigned any trunk, deleting said free track, changing said positions of said boundary lines of said channel routing region and said shapes of said routing prohibition figures and moving said routing prohibition figures, and reducing a height of said channel routing region, and terminating a routing process.

15. A routes designing apparatus according to claim 14, comprising, in place of said vertical passage prohibition figure avoiding section, a terminal lead-out routing section for setting, to avoid a vertical passage prohibition figure, a new terminal by drawing an interconnection from a terminal existing in a range of said prohibition figure to a position that enables avoidance of said prohibition figure.

16. A routes designing apparatus according to claim 14, comprising, in place of said vertical passage prohibition figure avoiding section, a subnet prerouting section for setting, to avoid a vertical passage prohibition figure, a new terminal for a connection to another terminal belonging to an original set by routing a subnet that has a terminal existing in a range of said prohibition figure.

17. A routes designing apparatus according to claim 14, comprising, in place of said vertical passage prohibition figure avoiding section, a net prerouting section for routing, to avoid a vertical passage prohibition figure, an original net of a subnet that has a terminal existing in a range of said prohibition figure.

18. A routes designing apparatus according to any one of claims 14–17, comprising, in place of said prohibition constraint graph G generating section, a prohibition constraint graph G generating and net dividing section comprising:

a prohibition constraint graph constructing section for constructing a prohibition constraint graph G representing constraints that relate to vertical passage prohibition figures and terminals based on positions of said routing prohibition figures and said terminals existing in said channel routing region, said net list N, and a result of said process of avoiding a vertical passage prohibition figure;

a constraint cycles detecting section for detecting a constraint cycle or cycles existing in said prohibition constraint graph G; and a net dividing section for dividing a net included in said detected constraint cycle to cancel said detected constraint cycle.

19. A routes designing apparatus according to any one of claims 14–17, comprising, in place of said prohibition constraint graph G generating section, a prohibition constraint graph G generating and subnet jog inserting section comprising:

a prohibition constraint graph constructing section for constructing a prohibition constraint graph G representing constraints that relate to vertical passage prohibition figures and terminals based on positions of said routing prohibition figures and said terminals existing in said channel routing region, said net list N, and a result of said process of avoiding a vertical passage prohibition figure;

a constraint cycles detecting section for detecting a constraint cycle or cycles existing in said prohibition constraint graph G;

a net dividing section for dividing a net included in said detected constraint cycle to cancel said detected constraint cycle; and a subnet jog inserting section for canceling a constraint cycle that could not be canceled by said net dividing section among said constraint cycle or cycles detected by said constraint cycles detecting section by inserting a jog into a subnet corresponding to a node that is included in said constraint cycle.

20. A routes designing apparatus according to claim 18, comprising a prohibition constraint graph G generating and path cutting section comprising, in addition to said prohibition constraint graph G generating section or said prohibition constraint graph G generating and subnet jog inserting section:

a path cutting section for cutting a path in said prohibition constraint graph G by detecting a subnet that cannot be routed by a single trunk due to obstruction from a routing prohibition figure, and inserting a jog into said detected subnet.

21. A routes designing apparatus according to claim 20, comprising a prohibition constraint graph G generating and subnet jog additionally inserting section comprising, in addition to said prohibition constraint graph G generating and path cutting section:

a subnet jog additionally inserting section for selecting candidate subnets into which a jog should be inserted based on a relationship between said number of trunk-assignable tracks and said number of subnets whose trunks should be assigned to tracks, and determining a jog inserting position.

22. A routes designing apparatus according to any one of claims 14–21, comprising, in place of said routability and termination judging section, a routability judging, unrouted portion processing, and termination judging section for executing a unrouted portion process on subnets included in a set Rnot of subnets whose trunks could not be assigned to tracks by said trunks assigning section.

23. A routes designing apparatus according to any one of claims 14–17, comprising, in place of said routability and termination judging section, a number-of-insufficient-tracks calculating and termination judging section for newly setting, in said channel routing region, tracks necessary for assignment of trunks of subnets included in a set Rnot of subnets whose trunks could not be assigned to tracks by said trunks assigning section.

24. A routes designing apparatus according to any one of claims 14–21, comprising, in place of said channel routing region setting section:

a channel routing region setting and counter initializing section for determining boundaries of a channel routing region based on positions of terminals to be connected to nets that belong to a net list N and routing prohibition figures existing inside cells that are located at a top and a bottom of a channel, and for initializing a counter to 0, and further comprising, in place of said routability and termination judging section:

an insufficient tracks inserting, rerouting, and termination judging section for setting, in said channel routing region, tracks necessary to assign trunks of subnets included in a set Rnot of subnets whose trunks could not be assigned to tracks by said trunks assigning section without changing positions of said routing prohibition figures, determining said number of necessary tracks by continuing said routing, newly setting said determined number of tracks, moving movable routing prohibition figures, and rerouting all nets, to thereby route unrouted subnets.

25. A routes designing apparatus according to claim 24, comprising, in place of said insufficient tracks inserting, rerouting, and termination judging section, an insufficient track segments inserting and termination judging section for newly setting tracks in said channel routing region, changing positions of movable routing prohibition figures, and executing a rerouting process, to thereby assign trunks of subnets included in a set Rnot of subnets whose trunks could not be assigned to tracks by said trunks assigning section.

26. A routes designing apparatus according to claim 24, comprising, in place of said insufficient tracks inserting, rerouting, and termination judging section, an insufficient track segments inserting, rerouting, and termination judging section for setting, in said channel routing region, tracks necessary to assign trunks of subnets included in a set Rnot of subnets whose trunks could not be assigned to tracks by said trunks assigning section, changing positions of movable routing prohibition figures, determining said number of necessary tracks by continuing said routing, newly setting said determined number of tracks, moving movable routing prohibition figures, and rerouting all nets, to thereby route unrouted subnets.

27. A routes designing method according to claim 6, comprising a prohibition constraint graph G generating and path cutting step comprising, in addition to said prohibition constraint graph G generating step or said prohibition constraint graph G generating and subnet jog inserting step:

a path cutting step of cutting a path in said prohibition constraint graph G by detecting a subnet that cannot be routed by a single trunk due to obstruction from a routing prohibition figure, and inserting a jog into said detected subnet.

28. A routes designing method according to claim 5, comprising, in place of said tenth step, a routability judging, unrouted portion processing, and termination judging step of executing a unrouted portion process on subnets included in a set Rnot of subnets whose trunks could not be assigned to tracks by said eighth step.

29. A routes designing method according to claim 6, comprising, in place of said tenth step, a routability judging, unrouted portion processing, and termination judging step of executing a unrouted portion process on subnets included in a set Rnot of subnets whose trunks could not be assigned to tracks by said eighth step.

30. A routes designing method according to claim 7, comprising, in place of said tenth step, a routability judging, unrouted portion processing, and termination judging step of executing a unrouted portion process on subnets included in a set Rnot of subnets whose trunks could not be assigned to tracks by said eighth step.

31. A routes designing method according to claim 8, comprising, in place of said tenth step, a routability judging, unrouted portion processing, and termination judging step of executing a unrouted portion process on subnets included in a set Rnot of subnets whose trunks could not be assigned to tracks by said eighth step.

32. A routes designing method according to claim 27, comprising, in place of said tenth step, a routability judging, unrouted portion processing, and termination judging step of executing a unrouted portion process on subnets included in a set Rnot of subnets whose trunks could not be assigned to tracks by said eighth step.

33. A routes designing method according to claim 5, comprising, in place of said tenth step, a number-of-insufficient-tracks calculating and termination judging step of newly setting, in said channel routing region, tracks necessary for assignment of trunks of subnets included in a set Rnot of subnets whose trunks could not be assigned to tracks by said eighth step.

34. A routes designing method according to claim 6, comprising, in place of said tenth step, a number-of-insufficient-tracks calculating and termination judging step of newly setting, in said channel routing region, tracks necessary for assignment of trunks of subnets included in a set Rnot of subnets whose trunks could not be assigned to tracks by said eighth step.

35. A routes designing method according to claim 7, comprising, in place of said tenth step, a number-of-insufficient-tracks calculating and termination judging step of newly setting, in said channel routing region, tracks necessary for assignment of trunks of subnets included in a set Rnot of subnets whose trunks could not be assigned to tracks by said eighth step.

36. A routes designing method according to claim 8, comprising, in place of said tenth step, a number-of-insufficient-tracks calculating and termination judging step of newly setting, in said channel routing region, tracks necessary for assignment of trunks of subnets included in a set Rnot of subnets whose trunks could not be assigned to tracks by said eighth step.

37. A routes designing method according to claim 27, comprising, in place of said tenth step, a number-of-insufficient-tracks calculating and termination judging step of newly setting, in said channel routing region, tracks necessary for assignment of trunks of subnets included in a set Rnot of subnets whose trunks could not be assigned to tracks by said eighth step.

38. A routes designing method according to claim 5, comprising, in place of said first step:

a channel routing region setting and counter initializing step of determining boundaries of a channel routing region based on positions of terminals to be connected to nets that belong to a net list N and routing prohibition figures existing inside cells that are located at a top and a bottom of a channel, and initializing a counter to 0, and further comprising, in place of said tenth step:

an insufficient tracks inserting, rerouting, and termination judging step of setting, in said channel routing region, tracks necessary to assign trunks of subnets included in a set Rnot of subnets whose trunks could not be assigned to tracks by said eighth step without changing positions of said routing prohibition figures, determining said number of necessary tracks by continuing said routing, newly setting said determined number of tracks, moving movable routing prohibition figures, and rerouting all nets, to thereby route unrouted subnets.

39. A routes designing method according to claim 6, comprising, in place of said first step:

a channel routing region setting and counter initializing step of determining boundaries of a channel routing region based on positions of terminals to be connected to nets that belong to a net list N and routing prohibition figures existing inside cells that are located at a top and a bottom of a channel, and initializing a counter to 0, and further comprising, in place of said tenth step:

an insufficient tracks inserting, rerouting, and termination judging step of setting, in said channel routing region, tracks necessary to assign trunks of subnets included in a set Rnot of subnets whose trunks could not be assigned to tracks by said eighth step without changing positions of said routing prohibition figures, determining said number of necessary tracks by continuing said routing, newly setting said determined number of tracks, moving movable routing prohibition figures, and rerouting all nets, to thereby route unrouted subnets.

40. A routes designing method according to claim 7, comprising, in place of said first step:

a channel routing region setting and counter initializing step of determining boundaries of a channel routing region based on positions of terminals to be connected to nets that belong to a net list N and routing prohibition figures existing inside cells that are located at a top and a bottom of a channel, and initializing a counter to 0, and further comprising, in place of said tenth step:

an insufficient tracks inserting, rerouting, and termination judging step of setting, in said channel routing region, tracks necessary to assign trunks of subnets included in a set Rnot of subnets whose trunks could not be assigned to tracks by said eighth step without changing positions of said routing prohibition figures, determining said number of necessary tracks by continuing said routing, newly setting said determined number of tracks, moving movable routing prohibition figures, and rerouting all nets, to thereby route unrouted subnets.

41. A routes designing method according to claim 8, comprising, in place of said first step:
a channel routing region setting and counter initializing step of determining boundaries of a channel routing region based on positions of terminals to be connected to nets that belong to a net list N and routing prohibition figures existing inside cells that are located at a top and a bottom of a channel, and initializing a counter to 0, and further comprising, in place of said tenth step:
an insufficient tracks inserting, rerouting, and termination judging step of setting, in said channel routing region, tracks necessary to assign trunks of subnets included in a set Rnot of subnets whose trunks could not be assigned to tracks by said eighth step without changing positions of said routing prohibition figures, determining said number of necessary tracks by continuing said routing, newly setting said determined number of tracks, moving movable routing prohibition figures, and rerouting all nets, to thereby route unrouted subnets.

42. A routes designing method according to claim 27, comprising, in place of said first step:
a channel routing region setting and counter initializing step of determining boundaries of a channel routing region based on positions of terminals to be connected to nets that belong to a net list N and routing prohibition figures existing inside cells that are located at a top and a bottom of a channel, and initializing a counter to 0, and further comprising, in place of said tenth step:
an insufficient tracks inserting, rerouting, and termination judging step of setting, in said channel routing region, tracks necessary to assign trunks of subnets included in a set Rnot of subnets whose trunks could not be assigned to tracks by said eighth step without changing positions of said routing prohibition figures, determining said number of necessary tracks by continuing said routing, newly setting said determined number of tracks, moving movable routing prohibition figures, and rerouting all nets, to thereby route unrouted subnets.

43. A routes designing apparatus according to claim 19, comprising a prohibition constraint graph G generating and path cutting section comprising, in addition to said prohibition constraint graph G generating section or said prohibition constraint graph G generating and subnet jog inserting section:
a path cutting section for cutting a path in said prohibition constraint graph G by detecting a subnet that cannot be routed by a single trunk due to obstruction from a routing prohibition figure, and inserting a jog into said detected subnet.

44. A routes designing apparatus according to claim 18, comprising, in place of said routability and termination judging section, a routability judging, unrouted portion processing, and termination judging section for executing a unrouted portion process on subnets included in a set Rnot of subnets whose trunks could not be assigned to tracks by said trunks assigning section.

45. A routes designing apparatus according to claim 19, comprising, in place of said routability and termination judging section, a routability judging, unrouted portion processing, and termination judging section for executing a unrouted portion process on subnets included in a set Rnot of subnets whose trunks could not be assigned to tracks by said trunks assigning section.

46. A routes designing apparatus according to claim 20, comprising, in place of said routability and termination judging section, a routability judging, unrouted portion processing, and termination judging section for executing a unrouted portion process on subnets included in a set Rnot of subnets whose trunks could not be assigned to tracks by said trunks assigning section.

47. A routes designing apparatus according to claim 21, comprising, in place of said routability and termination judging section, a routability judging, unrouted portion processing, and termination judging section for executing a unrouted portion process on subnets included in a set Rnot of subnets whose trunks could not be assigned to tracks by said trunks assigning section.

48. A routes designing apparatus according to claim 43, comprising, in place of said routability and termination judging section, a routability judging, unrouted portion processing, and termination judging section for executing a unrouted portion process on subnets included in a set Rnot of subnets whose trunks could not be assigned to tracks by said trunks assigning section.

49. A routes designing apparatus according to claim 18, comprising, in place of said routability and termination judging section, a number-of-insufficient-tracks calculating and termination judging section for newly setting, in said channel routing region, tracks necessary for assignment of trunks of subnets included in a set Rnot of subnets whose trunks could not be assigned to tracks by said trunks assigning section.

50. A routes designing apparatus according to claim 19, comprising, in place of said routability and termination judging section, a number-of-insufficient-tracks calculating and termination judging section for newly setting, in said channel routing region, tracks necessary for assignment of trunks of subnets included in a set Rnot of subnets whose trunks could not be assigned to tracks by said trunks assigning section.

51. A routes designing apparatus according to claim 20, comprising, in place of said routability and termination judging section, a number-of-insufficient-tracks calculating and termination judging section for newly setting, in said channel routing region, tracks necessary for assignment of trunks of subnets included in a set Rnot of subnets whose trunks could not be assigned to tracks by said trunks assigning section.

52. A routes designing apparatus according to claim 21, comprising, in place of said routability and termination judging section, a number-of-insufficient-tracks calculating and termination judging section for newly setting, in said channel routing region, tracks necessary for assignment of trunks of subnets included in a set Rnot of subnets whose trunks could not be assigned to tracks by said trunks assigning section.

53. A routes designing apparatus according to claim 43, comprising, in place of said routability and termination judging section, a number-of-insufficient-tracks calculating and termination judging section for newly setting, in said channel routing region, tracks necessary for assignment of trunks of subnets included in a set Rnot of subnets whose trunks could not be assigned to tracks by said trunks assigning section.

54. A routes designing apparatus according to claim 18, comprising, in place of said channel routing region setting section:
 a channel routing region setting and counter initializing section for determining boundaries of a channel routing region based on positions of terminals to be connected to nets that belong to a net list N and routing prohibition figures existing inside cells that are located at a top and a bottom of a channel, and for initializing a counter to 0, and further comprising, in place of said routability and termination judging section:
 an insufficient tracks inserting, rerouting, and termination judging section for setting, in said channel movable routing prohibition figures, determining said number of necessary tracks by continuing said routing, newly setting said determined number of tracks, moving movable routing prohibition figures, and rerouting all nets, to thereby route unrouted subnets.

55. A routes designing apparatus according to claim 19, comprising, in place of said channel routing region setting section:
 a channel routing region setting and counter initializing section for determining boundaries of a channel routing region based on positions of terminals to be connected to nets that belong to a net list N and routing prohibition figures existing inside cells that are located at a top and a bottom of a channel, and for initializing a counter to 0, and further comprising, in place of said routability and termination judging section:
  an insufficient tracks inserting, rerouting, and termination judging section for setting, in said channel movable routing prohibition figures, determining said number of necessary tracks by continuing said routing, newly setting said determined number of tracks, moving movable routing prohibition figures, and rerouting all nets, to thereby route unrouted subnets.

56. A routes designing apparatus according to claim 20, comprising, in place of said channel routing region setting section:
 a channel routing region setting and counter initializing section for determining boundaries of a channel routing region based on positions of terminals to be connected to nets that belong to a net list N and routing prohibition figures existing inside cells that are located at a top and a bottom of a channel, and for initializing a counter to 0, and further comprising, in place of said routability and termination judging section:
  an insufficient tracks inserting, rerouting, and termination judging section for setting, in said channel movable routing prohibition figures, determining said number of necessary tracks by continuing said routing, newly setting said determined number of tracks, moving movable routing prohibition figures, and rerouting all nets, to thereby route unrouted subnets.

57. A routes designing apparatus according to claim 21, comprising, in place of said channel routing region setting section:
 a channel routing region setting and counter initializing section for determining boundaries of a channel routing region based on positions of terminals to be connected to nets that belong to a net list N and routing prohibition figures existing inside cells that are located at a top and a bottom of a channel, and for initializing a counter to 0, and further comprising, in place of said routability and termination judging section:
  an insufficient tracks inserting, rerouting, and termination judging section for setting, in said channel movable routing prohibition figures, determining said number of necessary tracks by continuing said routing, newly setting said determined number of tracks, moving movable routing prohibition figures, and rerouting all nets, to thereby route unrouted subnets.

58. A routes designing apparatus according to claim 43, comprising, in place of said channel routing region setting section:
 a channel routing region setting and counter initializing section for determining boundaries of a channel routing region based on positions of terminals to be connected to nets that belong to a net list N and routing prohibition figures existing inside cells that are located at a top and a bottom of a channel, and for initializing a counter to 0, and further comprising, in place of said routability and termination judging section:
  an insufficient tracks inserting, rerouting, and termination judging section for setting, in said channel movable routing prohibition figures, determining said number of necessary tracks by continuing said routing, newly setting said determined number of tracks, moving movable routing prohibition figures, and rerouting all nets, to thereby route unrouted subnets.

* * * * *